US009835958B2

(12) United States Patent
Shibazaki

(10) Patent No.: US 9,835,958 B2
(45) Date of Patent: Dec. 5, 2017

(54) CARRIER METHOD, EXPOSURE METHOD, CARRIER SYSTEM AND EXPOSURE APPARATUS, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/146,105

(22) Filed: May 4, 2016

(65) Prior Publication Data

US 2016/0259254 A1    Sep. 8, 2016

Related U.S. Application Data

(62) Division of application No. 13/727,281, filed on Dec. 26, 2012, now Pat. No. 9,360,772.

(60) Provisional application No. 61/581,347, filed on Dec. 29, 2011, provisional application No. 61/581,314, filed on Dec. 29, 2011.

(51) Int. Cl.
*G03F 7/20* (2006.01)

(52) U.S. Cl.
CPC ......... *G03F 7/70725* (2013.01); *G03F 7/707* (2013.01); *G03F 7/7075* (2013.01); *G03F 7/70133* (2013.01)

(58) Field of Classification Search
None
See application file for complete search history.

(56) References Cited

U.S. PATENT DOCUMENTS

| 4,465,368 A | 8/1984 | Matsuura et al. |
| 4,780,617 A | 10/1988 | Umatate et al. |
| 5,196,745 A | 3/1993 | Trumper |

(Continued)

FOREIGN PATENT DOCUMENTS

| EP | 1 063 186 A1 | 12/2000 |
| EP | 1 079 223 A1 | 2/2001 |

(Continued)

OTHER PUBLICATIONS

Dec. 4, 2014 Restriciton Requirement issued in U.S. Appl. No. 13/727,281.

(Continued)

*Primary Examiner* — Steven H Whitesell Gordon
(74) *Attorney, Agent, or Firm* — Oliff PLC

(57) ABSTRACT

An exposure apparatus exposes a substrate with illumination light via an optical system. A stage disposed below the optical system has a holder to hold the substrate. A carrier system disposed above the stage has a first support member that supports the substrate in a noncontact manner from a surface side of the substrate, which is irradiated with the illumination light. A second support member different from the first support member supports the substrate in a contact manner from a rear surface side. A drive system coupled to the first and the second support members moves at least the second support member so that relative movement between the first and the second support members and relative movement between the second support member and the holder are performed at least in a vertical direction. The second support member carries the substrate from the first support member to the holder.

21 Claims, 39 Drawing Sheets

(56) References Cited

U.S. PATENT DOCUMENTS

| | | |
|---|---|---|
| 5,448,332 A | 9/1995 | Sakakibara et al. |
| 5,610,715 A | 3/1997 | Yoshii et al. |
| 6,242,718 B1 | 6/2001 | Ferro et al. |
| 6,262,796 B1 | 7/2001 | Loopstra et al. |
| 6,341,007 B1 | 1/2002 | Nishi et al. |
| 6,379,103 B1 | 4/2002 | Okugi |
| 6,611,316 B2 | 8/2003 | Sewell |
| 6,624,433 B2 | 9/2003 | Okumura et al. |
| 6,778,257 B2 | 8/2004 | Bleeker et al. |
| 7,023,610 B2 | 4/2006 | Ohtsuki et al. |
| 7,144,056 B2 | 12/2006 | Casarotti et al. |
| 7,561,280 B2 | 7/2009 | Schluchter et al. |
| 7,839,485 B2 | 11/2010 | Shibazaki |
| 2002/0041377 A1 | 4/2002 | Hagiwara et al. |
| 2002/0061469 A1 | 5/2002 | Tanaka |
| 2002/0089655 A1* | 7/2002 | Kida ................... G03F 7/70691 355/72 |
| 2003/0025890 A1 | 2/2003 | Nishinaga |
| 2004/0187280 A1 | 9/2004 | Baba |
| 2006/0227309 A1 | 10/2006 | Loopstra et al. |
| 2007/0288121 A1 | 12/2007 | Shibazaki |
| 2008/0088843 A1 | 4/2008 | Shibazaki |
| 2008/0094594 A1 | 4/2008 | Shibazaki |
| 2009/0175705 A1 | 7/2009 | Nakao et al. |
| 2009/0233234 A1 | 9/2009 | Shibazaki |
| 2010/0073652 A1 | 3/2010 | Shibazaki |
| 2010/0073653 A1 | 3/2010 | Shibazaki |
| 2010/0110408 A1 | 5/2010 | Compen et al. |
| 2010/0159403 A1 | 6/2010 | Shibazaki |
| 2010/0297562 A1* | 11/2010 | Shibazaki ........... G03F 7/70691 430/325 |
| 2011/0007296 A1* | 1/2011 | Hirano ................ G03F 7/70725 355/72 |
| 2011/0123913 A1 | 5/2011 | Yoshimoto |

FOREIGN PATENT DOCUMENTS

| | | |
|---|---|---|
| EP | 2 053 648 A1 | 4/2009 |
| JP | H05-102287 A | 4/1993 |
| JP | 2008-227386 A | 9/2008 |
| WO | 99/60361 A1 | 11/1999 |
| WO | 01/35168 A1 | 5/2001 |
| WO | 03/065428 A1 | 8/2003 |
| WO | 2006/038952 A2 | 4/2006 |

OTHER PUBLICATIONS

Jan. 21, 2015 Office Action issued in U.S. Appl. No. 13/727,281.
Sep. 24, 2015 Office Action issued in U.S. Appl. No. 13/727,281.
Feb. 16, 2016 Notice of Allowance issued in U.S. Appl. No. 13/727,281.
International Search Report issued in International Application No. PCT/JP2012/084311 dated Feb. 10, 2014.
Written Opinion of the International Searching Authority issued in International Application No. PCT/JP2012/084311 dated Feb. 10, 2014.

* cited by examiner

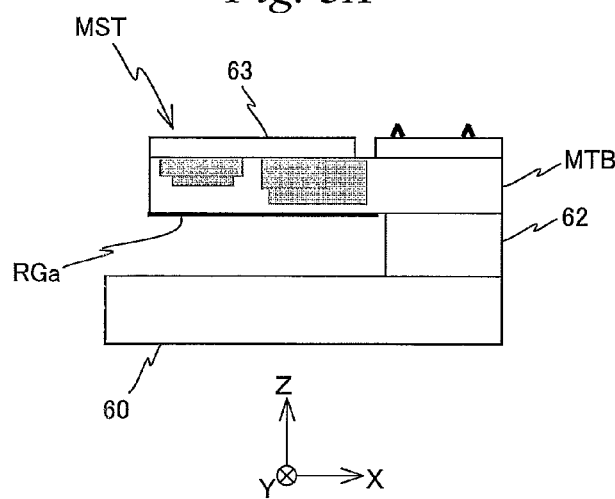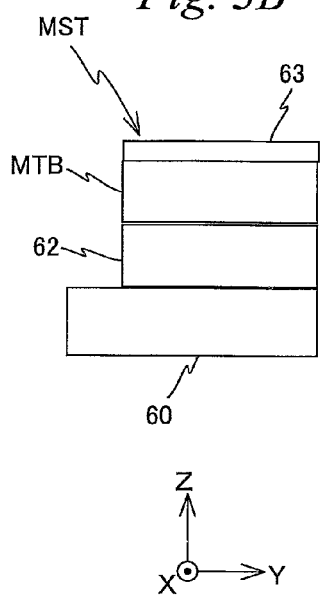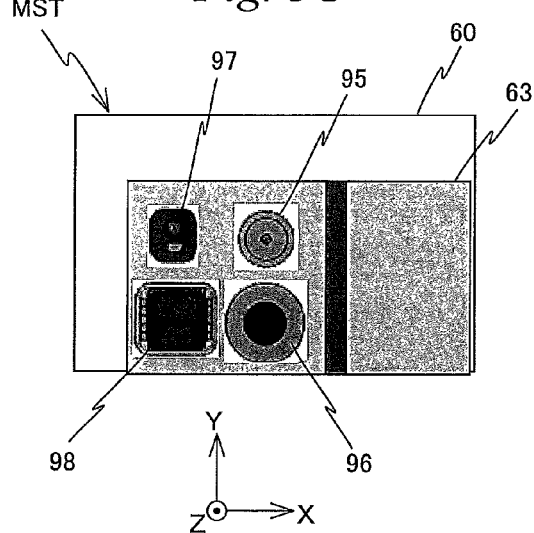

|  | X1 | X2 | X3 | Y1 | Y2 | Y3 | Z1 | Z2 | Z3 | Z4 |
|---|---|---|---|---|---|---|---|---|---|---|
| ΔX/δx | ● | ● |  |  |  |  |  |  |  |  |
| ΔX/δy | ● |  | ● |  |  |  |  |  |  |  |
| ΔY/δx |  |  |  | ● | ● |  |  |  |  |  |
| ΔY/δy |  |  |  |  | ● | ● |  |  |  |  |
| ΔZ/δx |  |  |  |  |  |  |  |  | ● | ● |
| ΔZ/δy |  |  |  |  |  |  |  | ● |  | ● |

CARRIER METHOD, EXPOSURE METHOD, CARRIER SYSTEM AND EXPOSURE APPARATUS, AND DEVICE MANUFACTURING METHOD

CROSS-REFERENCE TO RELATED APPLICATIONS

This is a Divisional of U.S. patent application Ser. No. 13/727,281 filed Dec. 26, 2012 (now U.S. Pat. No. 9,360,772), which claims the benefit of Provisional Application No. 61/581,314 filed Dec. 29, 2011, and Provisional Application No. 61/581,347 filed Dec. 29, 2011. The disclosures of the above-identified applications are hereby incorporated herein by reference in their entireties.

BACKGROUND OF THE INVENTION

Field of the Invention

The present invention relates to carrier methods, exposure methods, carrier systems and exposure apparatuses, and device manufacturing methods, and more particularly to a carrier method in which a thin plate-shaped object is carried to a holding device, an exposure method which uses the carrier method, a carrier system which carries a thin plate-shaped object, and an exposure apparatus which is equipped with the carrier system, and a device manufacturing method using the exposure method and the exposure apparatus.

Description of the Background Art

Conventionally, in a lithography process for manufacturing electron devices (microdevices) such as semiconductor device (such as integrated circuits) and liquid crystal display devices, projection exposure apparatuses based on a step-and-repeat method (a so-called stepper), or projection exposure apparatuses based on a step-and-scan method (a so-called scanning stepper (also referred to as a scanner)) are mainly used.

Substrates such as a wafer, a glass plate or the like subject to exposure which are used in these types of exposure apparatuses are gradually (for example, in the case of a wafer, in every ten years) becoming larger. Although a 300-mm wafer which has a diameter of 300 mm is currently the mainstream, the coming of age of a 450 mm wafer which has a diameter of 450 mm looms near. When the transition to 450 mm wafers occurs, the number of dies (chips) output from a single wafer becomes double or more the number of chips from the current 300 mm wafer, which contributes to reducing the cost. In addition, it is expected that through efficient use of energy, water, and other resources, cost of all resource use will be reduced.

However, because the thickness of the wafer is not necessarily in proportion to the size of the wafer, the strength of a 450 mm wafer is much weaker than a 300 mm wafer. Accordingly, for example, as in the case of wafer carriage, employing a means similar to the current 300 mm wafer without any changes was considered to be insufficient. Therefore, the inventor previously made a proposal of a carrier method and the like which could be employed even in the case of a 450 mm wafer, in which the object was held in a non-contact manner from above by a carrier member, and was carried to a holding device (for example, refer to U.S. Patent Application Publication No. 2010/0297562).

However, according to further studies, in the case of using a Bernoulli chuck also disclosed in PTL 1 for holding the wafer in a non-contact manner, it became clear that even in the case of the current 300 mm wafer, positional deviation sometimes exceeded a permissible range at the time of carry-in of the wafer. Accordingly, in the 450 mm wafer, it can be expected that the positional deviation will become much larger, which makes alignment measurement (position measurement of marks on a wafer) performed later on more difficult.

Further, semiconductor devices are gradually becoming finer, therefore, high resolution is required in exposure apparatuses. As means for improving the resolution, shortening a wavelength of an exposure light, as well as increasing (a higher NA) a numerical aperture of a projection optical system can be considered. To increase the substantial numerical aperture of the projection optical system as much as possible, various proposals are made of a liquid immersion exposure apparatus that exposes a wafer via a projection optical system and liquid (for example, refer to U.S. Patent Application Publication No. 2008/0088843). In U.S. Patent Application Publication No. 2008/0088843, an exposure apparatus and an exposure method are disclosed whose main purpose is to perform a wafer alignment (mark detection) operation and a detection operation of surface position information (focus information) in a short period of time.

However, when the size of the wafer becomes 450 mm, a situation may be anticipated where throughput is not enough in the case when the exposure apparatus and the exposure method related to a conventional example disclosed in, for example, U.S. Patent Application Publication No. 2008/0088843, are employed without any changes, and an appearance of an exposure apparatus whose throughput can be further improved was expected.

SUMMARY OF THE INVENTION

According to a first aspect of the present invention, there is provided a first carrier method in which an object of a thin plate shape is carried in to an area on a holding device, the method comprising: supporting the object from below by a support member which can move vertically, while the object is held in a non-contact manner from above by a suction member in an area above the holding device; and driving the suction member and the support member downward until a lower surface of the object comes into contact with the holding device while maintaining a holding state of the object by the suction member and a support state by the support member, and releasing support by the support member and hold by the suction member to the object at a point where the lower surface of the object comes into contact with the holding device.

According to this method, the object can be carried in to an area on the holding device without any object positional deviation (with good reproducibility), in a state where high flatness is maintained.

According to a second aspect of the present invention, there is provided a first exposure method, comprising: carrying in an object of a thin plate shape to an area on a holding device by the first carrier method described above; and exposing the object held by the holding device with an energy beam after the carrying, and forming a pattern on the object.

According to a third aspect of the present invention, there is provided a device manufacturing method, comprising: exposing an object according to the first exposure method described above; and developing the object which has been exposed.

According to a fourth aspect of the present invention, there is provided a second carrier method in which an object of a thin plate shape is carried in to an area on a holding device, the method comprising: supporting the object from above in a non-contact manner in an area above the holding device with a first support member, while a second support member different from the first support member supports the object in contact; relatively moving the first and the second support members and the holding device until a lower surface of the object supported by the first and the second support members comes into contact with the holding device; and holding the object whose lower surface is in contact with the holding device, with the holding device.

According to this method, the object can be carried in to an area on the holding device without any object positional deviation (with good reproducibility), in a state where high flatness is maintained.

According to a fifth aspect of the present invention, there is provided a second exposure method, comprising: carry-in of an object of a thin plate shape to an area on a holding device by the second carrier method described above; and exposing the object held by the holding device with an energy beam after the carry-in, and forming a pattern on the object.

According to a sixth aspect of the present invention, there is provided a device manufacturing method, comprising: exposing an object according to the second exposure method described above; and developing the object which has been exposed.

According to a seventh aspect of the present invention, there is provided a third carrier method in which an object of a thin plate shape is carried in to an area on a holding device, the method comprising: displacing in a vertical direction at least a part of the object supported from above in a non-contact manner by a first support member so that deformation of the object supported in the non-contact manner by the first support member is suppressed; and relatively moving the first support member and the holding device in the vertical direction so that the object whose deformation is suppressed is held by the holding device.

According to this method, the object can be carried in to an area on the holding device, in a state where high flatness is maintained.

According to an eighth aspect of the present invention, there is provided a third exposure method, comprising: carry-in of an object of a thin plate shape to an area on a holding device by the third carrier method described above; and exposing the object held by the holding device with an energy beam after the carry-in, and forming a pattern on the object.

According to a ninth aspect of the present invention, there is provided a device manufacturing method, comprising: exposing an object according to the third exposure method described above; and developing the object which has been exposed.

According to a tenth aspect of the present invention, there is provided a fourth carrier method in which an object of a thin plate shape is carried in to an area on a holding device, the method comprising: relatively moving a first support member and a holding device so that a lower surface of an object supported from above in a non-contact manner by the first support member above the holding device comes into contact with the holding device; applying a downward force from above by the first support member to at least a part of the object whose lower surface is in contact with the holding device; and holding the object to which the downward force is applied by the holding device.

According to this method, the object can be carried in to an area on the holding device, in a state where high flatness is maintained.

According to an eleventh aspect of the present invention, there is provided a fourth exposure method, comprising: carry-in of an object of a thin plate shape to an area on a holding device by the fourth carrier method described above; and exposing the object held by the holding device with an energy beam after the carry-in, and forming a pattern on the object.

According to a twelfth aspect of the present invention, there is provided a device manufacturing method, comprising: exposing an object according to the fourth exposure method described above; and developing the object which has been exposed.

According to a thirteenth aspect of the present invention, there is provided a carrier system in which an object of a thin plate shape is carried, the system comprising: a holding device which holds the object that is mounted and is movable along a predetermined plane; a suction member which holds the object from above in a non-contact manner above a first position on a movement plane of the holding device and is vertically movable; and a support member which is provided in the holding device that can support the object held by the suction member from below when the holding device is located at the first position and is vertically movable, wherein the suction member and the support member are driven downward until a lower surface of the object comes into contact with the holding device while a holding state of the object by the suction member and a support state of the object by the support member are maintained, and at a point where the lower surface of the object comes into contact with the holding device, the support by the support member and the holding by the holding member is to be released.

According to this method, the object can be carried in to an area on the holding device without any object positional deviation (with good reproducibility), in a state where high flatness is maintained.

According to a fourteenth aspect of the present invention, there is provided a first exposure apparatus which exposes an object of a thin plate shape with an energy beam and forms a pattern on the object, the apparatus comprising: the carrier system described above having the holding device which has a measurement plane provided on a surface substantially parallel to the predetermined plane; a movable body movable along the predetermined plane, supporting the holding device relatively movable along the predetermined plane; a measurement system which measures position information at least within the predetermined plane of the holding device by irradiating at least one measurement beam on the measurement plane, and receiving return light of the measurement beam from the measurement plane; and a driving system which drives the holding device alone or integrally with the movable body, based on the position information measured by the measurement system.

According to this apparatus, the driving system drives the holding device alone or integrally with the movable body, based on the position information measured by the measurement system, and exposure is performed on the object carried in to an area on the holding device in a state where high flatness is maintained. Accordingly, exposure of the object with high precision becomes possible.

According to a fifteenth aspect of the present invention, there is provided a device manufacturing method, comprising: exposing an object using the first exposure apparatus described above; and developing the object which has been exposed.

According to a sixteenth aspect of the present invention, there is provided a fifth exposure method in which an object is exposed by an energy beam via an optical system and liquid, the method comprising: exposing the object held by a movable body which is movable along a predetermined plane including a first axis and a second axis that are orthogonal to each other, via the optical system and the liquid at an exposure station; and moving the movable body holding the object from a loading position located away on one side in a first direction parallel to the first axis in the exposure station toward the exposure station, without the movable body being in contact with the liquid, and detecting a plurality of marks on the object by a plurality of mark detection systems whose position of detection areas are different in a second direction parallel to the second axis during the moving, prior to exposure.

According to this method, the movable body can perform movement at a higher speed with higher acceleration than the exposure method related to the conventional example described above, in the movement path from the loading position to the exposure station which includes the movement path for mark detection.

According to a seventeenth aspect of the present invention, there is provided a sixth manufacturing method, comprising: exposing an object using the fifth exposure method described above; and developing the object which has been exposed.

According to an eighteenth aspect of the present invention, there is provided a second exposure apparatus which exposes an object by an energy beam via an optical system and a liquid, the apparatus comprising: a first movable body which holds the object and is movable along a predetermined plane including a first axis and a second axis that are orthogonal to each other; an exposure section which has a liquid immersion member that supplies the liquid right below the optical system to form a liquid immersion area, and performs exposure on the object held by the first movable body via the liquid of the liquid immersion area; and a measurement section in which a plurality of mark detection systems are placed within the measurement section positioned on one side in a first direction parallel to the first axis with respect to the exposure section and whose positions of detection areas in a second direction parallel to the second axis are different, and detection of a plurality of marks on the object is performed by the plurality of mark detection systems, wherein a positional relation in the first direction is set between the optical system and the plurality of mark detection systems so that no part of the first movable body comes into contact with the liquid immersion area until detection of the plurality of marks is completed, when the first movable body is moved from a loading position set on one side in the first axis direction of the measurement section toward the exposure section, and detection of the marks on the object is performed partway on the movement path by the plurality of mark detection systems.

According to this apparatus, the first movable body can perform movement at a higher speed with higher acceleration than the exposure method related to the conventional example described above, in the movement path from the loading position to the exposure station which includes the movement path for mark detection.

According to a nineteenth aspect of the present invention, there is provided a device manufacturing method, comprising: exposing an object using the second exposure apparatus described above; and developing the object which has been exposed.

According to a twentieth aspect of the present invention, there is provided a sixth exposure method in which an object is exposed by an energy beam via an optical system, the method comprising: exposing the object held by a movable body which can move along a predetermined plane including a first axis and a second axis orthogonal to each other via the optical system at an exposure station; moving the movable body holding the object from a loading position located away on one side in a first direction parallel to the first axis in the exposure station toward the exposure station, and detecting a plurality of marks on the object by a mark detection system whose detection area is placed on one side in the first direction of the optical system during the moving, prior to exposure; and carrying out the object which has been exposed from an area on the movable body at an unloading position set between the detection area of the mark detection system and the exposure station.

According to this method, the movable body holding the object is moved along the first direction from the loading position to the exposure station, and partway of the movement, the plurality of marks on the object is detected by the mark detection system. And, after the object held by the movable body is exposed at the exposure station, before the movable body returns to the loading position from the exposure station along the first direction, the object which has been exposed is carried out from the area on the movable body at the unloading position set along the way of the movement path. Accordingly, a series of processing of carrying in the object to an area on the movable body (loading), detection of marks on the object, exposure of the object, carrying out the object which has been exposed from the area on the movable body (unloading) can be performed effectively within a short time while the movable body moves back and forth from the loading position located away in the first direction to the exposure station.

According to a twenty-first aspect of the present invention, there is provided a device manufacturing method, comprising: exposing an object using the sixth exposure method described above; and developing the object which has been exposed.

According to a twenty-second aspect of the present invention, there is provided a third exposure apparatus which exposes an object by an energy beam via an optical system, the apparatus comprising: a movable body holding the object and is moveable along a predetermined plane including a first axis and a second axis that are orthogonal to each other; an exposure section which has the optical system and performs exposure to the object held by the movable body; a measurement section having a plurality of mark detection systems positioned on one side in a first direction parallel to the first axis with respect to the exposure section and whose detection areas are placed on one side in the first direction of the optical system, the plurality of detection systems performing detection of the plurality of marks on the object; a loading position set to one side of the first direction in the measurement section, where carry-in of the object to an area on the movable body is performed; and an unloading position set in between the measurement section and the exposure section, where carry-out of the object from an area on the movable body is performed.

According to this apparatus, the movable body holding the object is moved along the first direction from the loading position to the exposure section, and partway of the movement, the plurality of marks on the object is detected by the mark detection system at the measurement section located on the movement path. And, after the object held by the movable body is exposed at the exposure section, before the movable body returns to the loading position from the exposure section along the first direction, the object which has been exposed is carried out from the area on the movable body at the unloading position set along the way of the movement path of the movable body from the exposure section to the measurement section. Accordingly, a series of processing of carrying in the object to an area on the movable body (loading), detection of marks on the object, exposure of the object, carrying out the object which has been exposed from the area on the movable body (unloading) can be performed effectively within a short time while the movable body moves back and forth from the loading position located away in the first direction to the exposure station.

According to a twenty-third aspect of the present invention, there is provided a device manufacturing method, comprising: exposing an object using the third exposure apparatus described above; and developing the object which has been exposed.

According to a twenty-fourth aspect of the present invention, there is provided a seventh exposure method in which an object is exposed by an energy beam via an optical system, the method comprising: exposing the object held by a movable body which can move along a predetermined plane including a first axis and a second axis orthogonal to each other via the optical system at an exposure station; moving the movable body holding the object from a loading position located away on one side in a first direction parallel to the first axis in the exposure station toward the exposure station, prior to exposure; and carrying out the object which has been exposed from an area on the movable body at an unloading position set between the exposure station and the loading position, wherein in the exposing, exposure of the object held by the movable body begins from a predetermined first area far from the unloading position while being moved along a predetermined path with the movable body, and an area near the first area is exposed last.

According to this method, at the exposure station, while the object held by the movable body is moved along the predetermined path with the movable body, exposure begins on the predetermined first area which is far away from the unloading position, and the area in the vicinity of the first area is exposed last. That is, on exposure of the object, the object (movable body) is positioned closest to the unloading position in the movement path of the object on exposure at the exposure starting point and the exposure finishing point. Accordingly, after finishing exposure, the movable body can return to the loading position in substantially the shortest time, after the object which has been exposed is moved to the unloading position and unloaded from the movable body. Unloading of the object which has been exposed can be performed quickly, on the movement path of the movable body while the movable body returns from the exposure station to the loading position.

According to a twenty-fifth aspect of the present invention, there is provided a device manufacturing method, comprising: exposing an object using the seventh exposure method described above; and developing the object which has been exposed.

According to a twenty-sixth aspect of the present invention, there is provided a fourth exposure apparatus which exposes an object by an energy beam via an optical system, the apparatus comprising: a movable body which holds the object and is moveable along a predetermined plane including a first axis and a second axis that are orthogonal to each other; an exposure section which has the optical system and performs exposure to the object held by the movable body; a loading position set to one side of a first direction parallel to the first axis in the exposure station, where carry-in of the object to an area on the movable body is performed; and an unloading position set in between the exposure station and the loading position, where carry-out of the object from an area on the movable body is performed, wherein in the exposure station, exposure of the object held by the movable body begins from a predetermined first area far from the unloading position while being moved along a predetermined path with the movable body, and an area near the first area is exposed last.

According to this apparatus, in the exposure section, while the object held by the movable body is moved along the predetermined path together with the movable body, exposure begins on the predetermined first area which is far away from the unloading position, and the area in the vicinity of the first area is exposed last. That is, on exposure of the object, the object (movable body) is positioned closest to the unloading position in the movement path of the object on exposure at the exposure starting point and the exposure finishing point. Accordingly, after finishing exposure, the movable body can return to the loading position in substantially the shortest time, after the object which has been exposed is moved to the unloading position and unloaded from the movable body. Unloading of the object which has been exposed can be performed quickly, on the movement path of the movable body while the movable body returns from the exposure station to the loading position.

According to a twenty-seventh aspect of the present invention, there is provided a device manufacturing method, comprising: exposing an object using the fourth exposure apparatus described above; and developing the object which has been exposed.

According to a twenty-eighth aspect of the present invention, there is provided a fifth exposure apparatus which exposes a substrate via an optical system, the apparatus comprising: a substrate stage having a holding member on which the substrate is mounted; a carrier device having a first support member which support the substrate in a non-contact manner from above, and a second support member different from the first support member that supports the substrate in contact; and a driver which relatively moves the first and the second support members and the holding member at least in a vertical direction so that the substrate supported by the first and the second support members is delivered to the holding member.

According to a twenty-ninth aspect of the present invention, there is provided a device manufacturing method, comprising: exposing a substrate using the fifth exposure apparatus described above; and developing the object which has been exposed.

According to a thirtieth aspect of the present invention, there is provided a sixth exposure apparatus which exposes a substrate via an optical system, the apparatus comprising: a substrate stage having a holding member on which the substrate is mounted; a carrier device having a first support member which support the substrate in a non-contact manner from above; a displacement device which displaces at least apart of the substrate supported by the first support member in a vertical direction; and a driver which relatively moves the first support member and the holding member at least in a vertical direction so that the substrate supported by the first support member is delivered to the holding member, wherein displacement of the substrate by the displacement device is performed, prior to holding of the substrate by the holding member.

According to a thirty-first aspect of the present invention, there is provided a device manufacturing method, comprising: exposing a substrate using the sixth exposure apparatus described above; and developing the object which has been exposed.

According to a thirty-second aspect of the present invention, there is provided a seventh exposure apparatus which exposes a substrate via an optical system, the apparatus comprising: a substrate stage having a holding member on which the substrate is mounted; a carrier device having a first support member which support the substrate in a non-contact manner from above; a driver which relatively moves the first support member and the holding member at least in a vertical direction so that the substrate supported by the first support member is delivered to the holding member; and a controller which controls the first support member so that a downward force is applied from above by the first support member to at least a part of the substrate delivered to the holding member, wherein a substrate to which the downward force is applied is held by the holding member.

According to a thirty-third aspect of the present invention, there is provided a device manufacturing method, comprising: exposing a substrate using the seventh exposure apparatus described above; and developing the object which has been exposed.

BRIEF DESCRIPTION OF DRAWINGS

In the accompanying drawings;

FIG. 3A is a view (front view) of a measurement stage MST in FIG. 1 when viewed from the −Y direction, FIG. 3B is a view (side view) of measurement stage MST when viewed from a +X direction, and FIG. 3C is a planar view showing measurement stage MST;

DESCRIPTION OF THE EMBODIMENTS

Hereinafter, an embodiment will be described, referring to FIGS. 1 to 38E.

Figure 1:
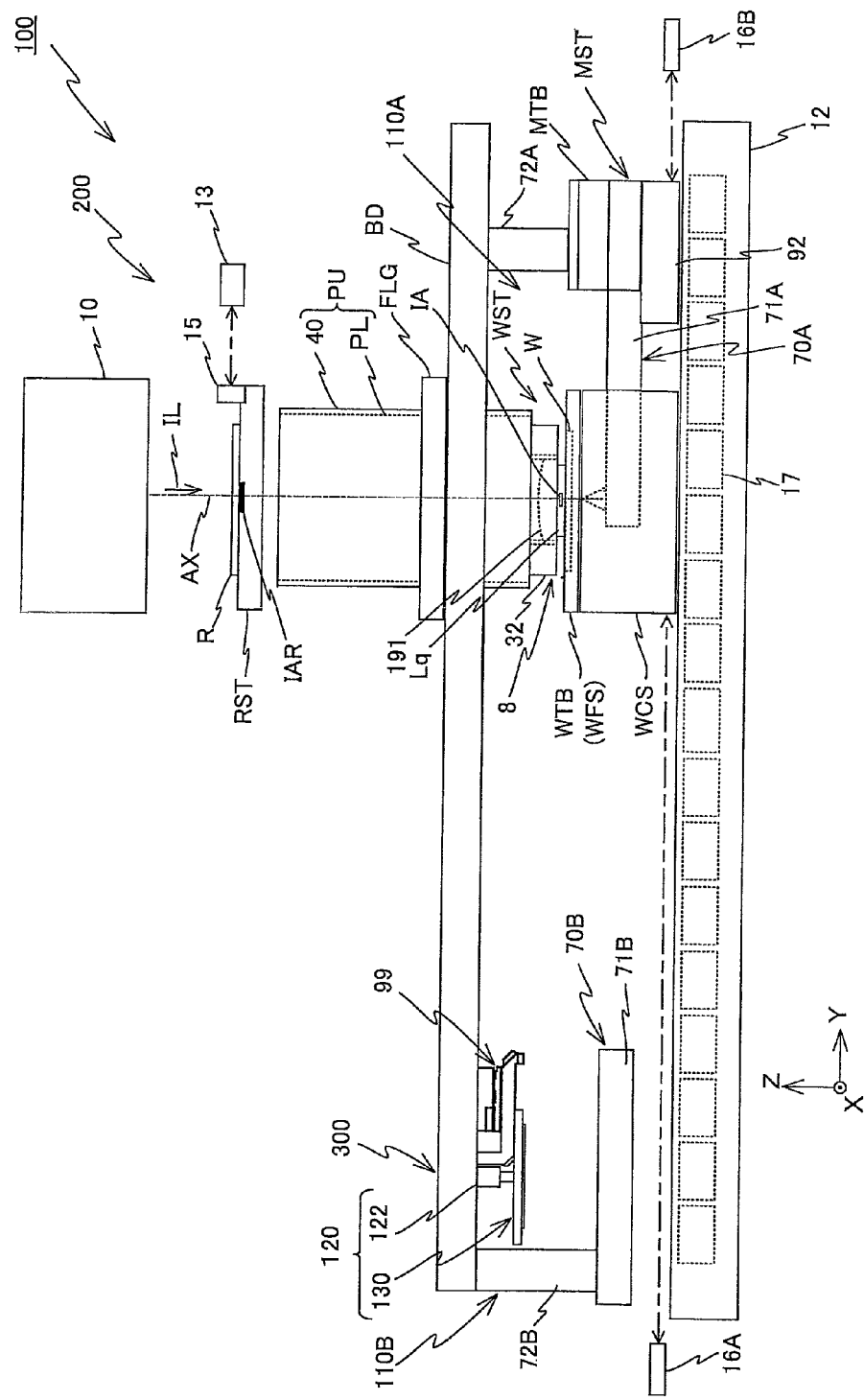
FIG. 1 is a view schematically showing a structure of an exposure apparatus related to an embodiment.

FIG. 1 schematically shows a structure of an exposure apparatus 100 related to an embodiment. This exposure apparatus 100 is a projection exposure apparatus using a step-and-scan method, or a so-called scanner. As it will be described later on, in the present embodiment, a projection optical system PL is provided, and hereinafter, the description will be made with a direction parallel to an optical axis AX of this projection optical system. PL referred to as a Z-axis direction (Z direction), a direction in which a reticle and a wafer are relatively scanned within a plane orthogonal to the Z-direction referred to as a Y-axis direction (Y direction), and a direction orthogonal to the Z-axis and the Y-axis referred to as an X-axis direction (X direction), and rotation (tilt) directions around the X-axis, the Y-axis, and the Z-axis referred to as θx, θy, and θz directions, respectively.

Exposure apparatus 100, as shown in FIG. 1, is equipped with an exposure station 200 placed near the edge on the +Y side on a base board 12, a measurement station 300 placed near the edge on the −Y side on base board 12, a wafer stage WST and a measurement stage MST which move two-dimensionally within an XY-plane independently on base board 12, a control system for these sections, and the like. In the description below, for the sake of convenience, as the terms for showing the places of exposure section 200 and measurement section 300, respectively, will be referred to as exposure station 200 and measurement station 300, using the same reference signs as the exposure section and the measurement section.

Base board 12 is supported in a substantially horizontal manner (parallel to the XY-plane) on a floor surface by a vibration-proof mechanism (omitted in drawings). Base board consists of a member having a flat outer shape. Incidentally, in FIG. 1, wafer stage WST is positioned at exposure station 200, and a wafer W is held on wafer stage WST (to be more specific, on a wafer table WTB to be described later on). Further, measurement stage MST is positioned within or near exposure station 200. During the exposure operation of wafer W using wafer stage WST, measurement stage MST is positioned at a predetermined position (withdrawal position or waiting position) away from the area below projection optical system PL so as not to come in contact with wafer stage WST moving below projection optical system PL. Further, prior to the exposure operation of wafer W being completed, measurement stage MST is relatively moved to approach wafer stage WST moving below projection optical system PL, and at the point when the exposure has been completed at the latest, wafer stage WST and measurement stage MST are positioned to be in proximity (or in contact). Furthermore, wafer stage WST and measurement stage MST in proximity to each other are moved with respect to projection optical system PL, and measurement stage MST is placed to face projection optical system PL instead of wafer stage WST. Incidentally, at least a part of the relative movement to position wafer stage WST and measurement stage MST in proximity can be performed, after the exposure operation of wafer W.

Exposure section 200 is equipped with an illumination system 10, a reticle stage RST, a projection unit PU, a local liquid immersion device 8 and the like.

Illumination system 10, as disclosed in, for example, U.S. Patent Application Publication No. 2003/0025890 and the like, includes a light source; and an illumination optical system which has an illuminance equalizing optical system including an optical integrator and the like, and a reticle blind and the like (none of which are shown). Illumination system 10 illuminates a slit-shaped illumination area IAR on a reticle R set (limited) by a reticle blind (also called a masking system) with illumination light (exposure light) IL at a substantially equal illuminance. Here, as illumination light IL, as an example, an ArF excimer laser beam (wavelength 193 nm) is used.

On reticle stage RST, reticle R that has a circuit pattern and the like formed on its pattern surface (the lower surface in FIG. 1) is fixed, for example, by vacuum chucking. Reticle stage RST is finely drivable within the XY-plane and is also drivable in a scanning direction (the Y-axis direction, which is the lateral direction of the page surface in FIG. 1) at a predetermined scanning velocity, by a reticle stage driving system 11 (not shown in FIG. 1, refer to FIG. 16) including, for example, a linear motor and the like.

Position information within the XY-plane (including rotational information in the θz direction) of reticle stage RST is constantly detected, using a reticle laser interferometer (hereinafter referred to as a "reticle interferometer") 13 via a movable mirror 15 (a Y movable mirror (or a retroreflector) having a reflection surface orthogonal to the Y-axis direction and an X movable mirror having a reflection surface orthogonal to the X-axis direction are actually provided) fixed to reticle stage RST, at a resolution of, for example, around 0.25 nm. The measurement values of reticle interferometer 13 are sent to a main controller 20 (not shown in FIG. 1, refer to FIG. 16). Incidentally, position information of reticle stage RST can be measured using an encoder system disclosed in, for example, U.S. Pat. No. 7,839,485 and the like, instead of reticle interferometer 13. In this case, one of a grating member (scale plate or a grid plate) on which a grating is formed and an encoder head can be provided on the lower surface side of reticle stage RST, and the other can be placed below reticle stage RST, or one of the grating section and the encoder head can be provided on the upper surface side of reticle stage RST, and the other can be placed above reticle stage RST. Further, reticle stage RST can have a coarse/fine movement structure as in wafer stage WST to be described later on.

Projection unit PU is placed below reticle stage RST in FIG. 1. Projection unit PU is supported by a main frame BD (metrology frame), which is supported horizontally by a support member not shown, via a flange section FLG provided on the outer circumference portion of the projection unit. Main frame BD structures a part of a main section frame of exposure apparatus 100 on which at least a part of an illumination optical system or reticle stage RST is installed, and in the present embodiment, is supported by a plurality of (for example, three or four) support members (not shown) placed on an installing surface (for example, a floor surface and the like) via each of the vibration isolation mechanisms. Incidentally, on the installing surface, base board 12 which will be described later on and the like are placed. Further, the vibration isolation mechanism can be placed in between each support member and main frame BD. Furthermore, as disclosed in, for example, PCT International Publication No. 2006/038952, projection unit PU can be supported in a suspended manner with respect to a part of the main section frame placed above projection unit PU.

Projection unit PU includes a barrel 40, and projection optical system PL held within barrel 40. As projection optical system PL, for example, a dioptric system is used consisting of a plurality of optical elements (lens elements) disposed along optical axis AX parallel to the Z-axis. Projection optical system PL, for example, is telecentric on both sides, and has a predetermined projection magnification (e.g., $\frac{1}{4}$, $\frac{1}{5}$, or $\frac{1}{8}$ and the like). Therefore, when illumination area IAR on reticle R is illuminated by illumination light IL from illumination system 10, by illumination light IL which passes through reticle R placed so that a first plane (object plane) of projection optical system PL and the pattern surface are substantially coincident, a reduced image of a circuit pattern (a reduced image of part of a circuit pattern) within illumination area IAR of reticle R is formed via projection optical system PL (projection unit PU), in an area (hereinafter also referred to as an exposure area) IA, conjugate to illumination area IAR, on wafer W which is placed on a second plane (image plane) side of projection optical system PL and whose surface is coated with a resist (sensitive agent). And, by simultaneously driving reticle stage RST and wafer stage WST (to be more accurate, fine movement stage WFS to be described later holding wafer W), reticle R is relatively moved in the scanning direction (Y-axis direction) with respect to illumination area IAR (illumination light IL), while wafer W is relatively moved in the scanning direction (Y-axis direction) with respect to exposure area IA (illumination light IL), and scanning exposure of a shot area (divided area) on wafer W is performed, transferring the pattern of reticle R on the shot area. That is, in the present embodiment, the pattern of reticle R is generated on wafer W using illumination system 10 and projection optical system PL, and the pattern is formed on wafer W by exposing a sensitive layer (resist layer) on wafer W with illumination light IL.

Local liquid immersion device 8 is provided, corresponding to exposure apparatus 100 which performs exposure based on a liquid immersion method. Local liquid immersion device 8 includes a liquid supply device 5, a liquid recovery device 6 (none of which are shown in FIG. 1, refer to FIG. 16), and a nozzle unit 32 or the like. Nozzle unit 32, as shown in FIG. 1, is supported by suspension by main frame BD supporting projection unit PU or the like via a support member not shown, and surrounds the periphery of the lower end section of barrel 40 holding an optical element which structures projection optical system PL closest to the image plane side (wafer W side), in this case, lens (hereinafter also referred to as a "tip lens" or a "final lens") 191. Nozzle unit 32 is equipped with a supply port and a recovery port of a liquid Lq, a lower surface where wafer W faces and in which a recovery port is provided, liquid supply pipe 31A and liquid recovery pipe 31B (none of which are shown in FIG. 1, refer to FIG. 4) and a supply passage and a recovery passage connected to the pipes, respectively. Liquid supply pipe 31A is connected to the other end of a supply pipe which is not shown whose one end is connected to liquid supply device 5 (not shown in FIG. 1, refer to FIG. 16), and liquid recovery pipe 31B is connected to the other end of a recovery pipe which is not shown whose one end is connected to liquid recovery device 6 (not shown in FIG. 1, refer to FIG. 16). Further, nozzle unit 32 has a supply passage and a recovery passage within, and liquid supply pipe 31A and liquid recovery pipe 31B are connected to a supply port and a recovery port, respectively, via the supply passage and the recovery passage. Furthermore, nozzle unit 32 has an opening section through which illumination light IL emitted from projection optical system PL passes on its lower surface, and the recovery port is placed in the periphery of the opening section. In the present embodiment, while the supply port is provided on the inner side surface of nozzle unit 32 surrounding the tip lens, another supply port different from the supply port can be provided on the lower surface side on the inner side of the recovery port with respect to the opening section of nozzle unit 32.

In the present embodiment, main controller 20 controls liquid supply device 5 (refer to FIG. 16) and supplies liquid to a space between tip lens 191 and wafer W via liquid supply pipe 31A and nozzle unit 32, and also controls liquid recovery device 6 (refer to FIG. 16) and recovers liquid from between tip lens 191 and wafer W via nozzle unit 32 and liquid recovery pipe 31B. On this operation, main controller 20 controls liquid supply device 5 and liquid recovery device 6 so that the amount of the liquid supplied and the amount of the liquid recovered is constantly equal. Accordingly, a fixed quantity of liquid Lq (refer to FIG. 1) is constantly replaced and held between tip lens 191 and wafer W. Local liquid immersion device 8 forms a liquid immersion area below projection optical system PL by liquid Lq supplied via nozzle unit 32, as well as recovers the liquid from the liquid immersion area via nozzle unit 32 and holds liquid Lq only at a part of wafer W, or in other words, can form a liquid immersion area by confining liquid Lq on the upper surface of wafer stage WST (fine movement stage WFS) placed facing the projection optical system PL, or consequently, by confining the liquid within a local area smaller than the surface of wafer W. Therefore, nozzle unit 32 can also be referred to as a liquid immersion member, a liquid immersion space forming member, a Liquid Confinement member, a Liquid Containment member and the like. In the present embodiment, as the liquid above, pure water which transmits the ArF excimer laser beam (light having a wavelength of 193 nm) is used. Incidentally, refractive index n of the pure water to the ArF excimer laser beam is about 1.44, and in the pure water, the wavelength of illumination light IL is shortened to 193 nm×1/n=around 134 nm.

In the present embodiment, while nozzle unit 32 is supported in a suspended manner by main frame BD, nozzle unit 32 can be provided in a frame member different from main frame BD such as, for example, a frame member placed on the installing surface previously described different from main frame BD. This can suppress or prevent the vibration travelling from nozzle unit 32 to projection optical system PL. Further, a part of nozzle unit 32, on the lower surface side of nozzle unit 32 in contact with liquid Lq (an interface of the liquid immersion area), can be movable, and a part of nozzle unit 32 can be moved so that relative velocity between wafer stage WST and nozzle unit 32 becomes small at the time of movement of wafer stage WST. This can suppress or prevent a part of liquid Lq separating from the liquid immersion area and the liquid remaining on the upper surface of wafer stage WST or on the surface of wafer W, especially during the exposure operation of wafer W. In this case, during the movement of wafer stage WST, a part of nozzle unit 32 can be constantly moved, or a part of nozzle unit 32 can be moved in a part of the exposure operation, such as, for example, only in the stepping operation of wafer stage WST. Further, a part of nozzle unit 32 can be, for example, a movable unit having the recovery port and at least a part of the lower surface, or a plate relatively movable with respect to nozzle unit 32, having a lower surface in contact with the liquid.

Besides such sections, exposure section 200 is equipped with a first fine movement stage position measurement system 110A including a first back side encoder system 70A having a measurement arm 71A which is supported substantially in a cantilevered state (supported near an edge) via a support member 72A from main frame BD, and a first top side encoder system 80A (not shown in FIG. 1, refer to FIG. 16 and the like) to be described later on. However, the first fine movement stage position measurement system 110A will be described after the description of the fine movement stage which will be described later on, for the sake of convenience.

Measurement section 300 is equipped with an alignment device 99 provided in main frame BD, a multi-point focal point detection system (hereinafter, shortly referred to as a multi-point AF system) (90a, 90b) (not shown in FIG. 1, refer to FIG. 16 and the like) provided in main frame BD, and a second fine movement stage position measurement system 110B that includes a second back side encoder system 70B having a measurement arm 71B which is supported substantially in a cantilevered state (supported near an edge) via a support member 72B from main frame BD, and a second top side encoder system (not shown in FIG. 1, refer to FIG. 16 and the like) to be described later on. Further, in the vicinity of alignment device 99, as shown in FIG. 1, a chuck unit 120 is provided. Incidentally, the second fine movement stage position measurement system 110B will be described after the description of the fine movement stage which will be described later on, for the sake of convenience. Further, alignment device 99 is also referred to as an alignment detection system or a mark detection system.

Figure 4:
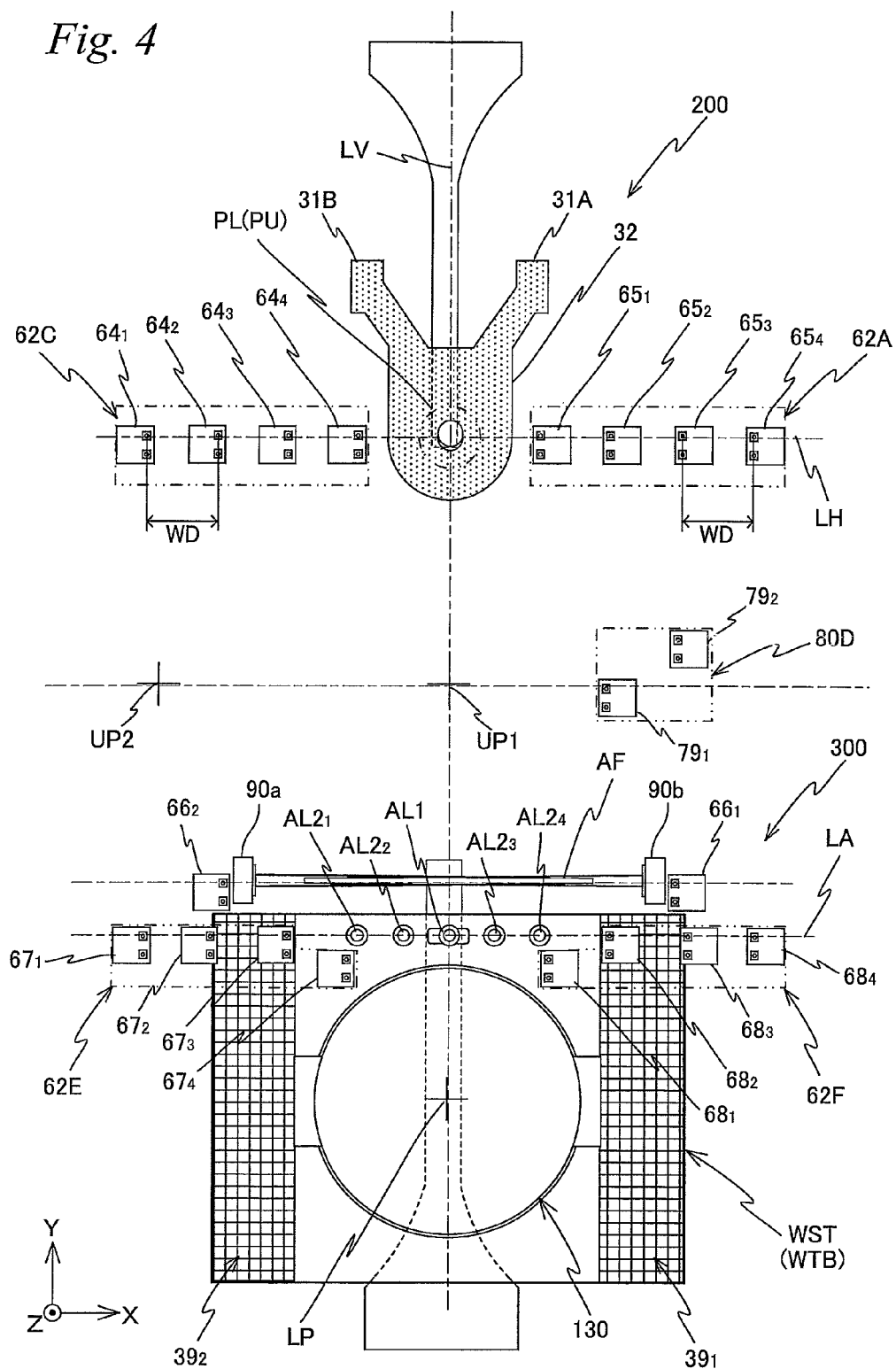
FIG. 4 is a view showing a placement of a first and a fourth top side encoder system, alignment systems, a multipoint AF system and the like that the exposure apparatus in FIG. 1 is equipped with, with a projection optical system serving as a reference.
Figure 5:
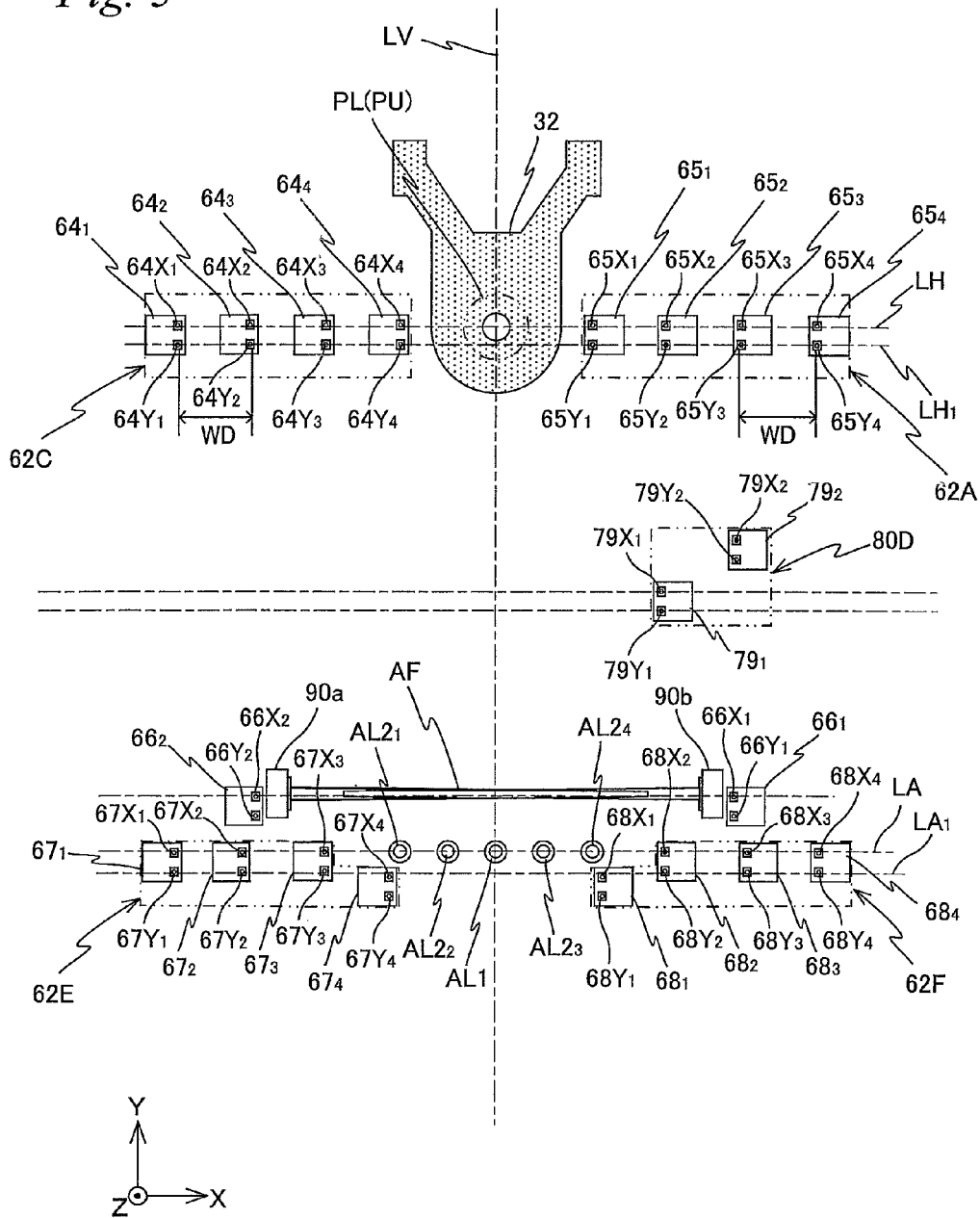
FIG. 5 is a view used to describe a concrete placement of heads in the first and the fourth top side encoder system in FIG. 4.

Alignment device 99 includes five alignment systems AL1, and $AL2_1$ to $AL2_4$ which are shown in FIG. 4. To describe this in detail, as shown in FIGS. 4 and 5, a primary alignment system AL1 is placed on a straight line (hereinafter referred to as a reference axis) LV which passes through the center of projection unit PU (optical axis AX of projection optical system PL, also coinciding with the center of exposure area IA previously described in the present embodiment) and is also parallel to the Y-axis, in a state where the detection center is located at a position a predetermined distance away to the −Y side from optical axis AX. On one side and the other side in the X-axis direction with primary alignment system AL1 in between, secondary alignment systems $AL2_1$ and $AL2_2$, and $AL2_3$ and $AL2_4$ are provided, respectively, with the detection centers placed substantially symmetric to reference axis LV. That is, the detection centers of the five alignment systems AL1, and $AL2_1$ to $AL2_4$ are placed along the X-axis direction. As each of the five alignment systems AL1, and $AL2_1$ to $AL2_4$, for example, an FIA (Field Image Alignment) system is used that employs an image processing method of irradiating a broadband detection beam which does not expose the resist on the wafer onto an object mark so that an image of the object mark formed on a light receiving surface by the reflection light from the object mark and an image of an index (an index pattern on an index plate provided within each alignment system) not shown are imaged using an imaging device (such as a CCD), and imaging signals are output. Imaging signals from the five alignment systems AL1, and $AL2_1$ to $AL2_4$ are supplied to main controller 20 (refer to FIG. 16). Incidentally, the detailed structure of alignment device 99 is disclosed in, for example, U.S. Patent Application Publication No. 2009/0233234. Further, alignment systems AL1 and $AL2_1$ to $AL2_4$ are each not limited to the imaging method, and for example, can employ a method of irradiating a coherent measurement light on an alignment mark (diffraction grating), and detecting a diffracted light generated from the mark.

As the multi-point AF system shown in FIGS. 4 and 5, a multi-point AF system which employs an oblique-incidence method is provided, consisting of a light transmitting system 90a and a light receiving system 90b. A structure similar to the multi-point AF system (90a, 90b) is disclosed in, for example, U.S. Pat. No. 5,448,332 and the like. In the present embodiment, as an example, light transmitting system 90a and light receiving system 90b are placed symmetric to reference axis LV at positions the same distance apart on the +Y side of a straight line (reference axis) LA, which passes through the detection center of primary alignment system AL1 and is parallel to the X-axis. The interval in the X-axis direction between light transmitting system 90a and light receiving system 90b is set wider than the interval between a pair of scales $39_1$ and $39_2$ (refer to FIG. 2A) provided on wafer table WTB to be described later on.

A plurality of detection points of the multi-point AF system (90a, 90b) is placed at a predetermined interval along the X-axis direction on the surface subject to detection. In the present embodiment, for example, the detection points are placed in a shape of a matrix of one row M columns (M is the total number of detection points) or two rows N columns (N is ½ of the total number of detection points). In FIGS. 4 and 5, the plurality of detection points on which the detection beams are irradiated is not shown individually, and is shown as a detection area AF extending elongated in the X-axis direction between light transmitting system 90a and light receiving system 90b. Because the length in the X-axis direction of this detection area AF is set to around the same as the diameter of wafer W, position information (surface position information) of the substantially entire surface of wafer W in the Z-axis direction can be measured by simply scanning wafer W once in the Y-axis direction. Further, regarding the Y-axis direction, because this detection area AF is placed between projection optical system PL (exposure area IA) and the detection area of the alignment systems (AL1, $AL2_1$, $AL2_2$, $AL2_3$, and $AL2_4$), it is possible for the multi-point AF system and the alignment systems to concurrently perform the detection operations.

Incidentally, while the plurality of detection points is arranged in a one row M columns or two rows N columns manner, the number of rows and/or columns are/is not limited to this. However, in the case the number of rows is two or more, it is preferable to arrange the position of the detection points in the X-axis direction differently in different rows. Furthermore, while the plurality of detection points is placed along in the X-axis direction, besides such an arrangement, all or a part of the plurality of detection points can be placed at different positions regarding the Y-axis direction. For example, the plurality of detection points can be placed along a direction intersecting both the X-axis and the Y-axis. That is, only the position in at least the X-axis direction has to be different for the plurality of detection points. Further, in the present embodiment, while the detection beam is irradiated on the plurality of detection points, for example, the detection beam can be irradiated entirely on detection area AF. Furthermore, the length in the X-axis direction of detection area AF does not have to be around the same as the diameter of wafer W.

Figure 2A:
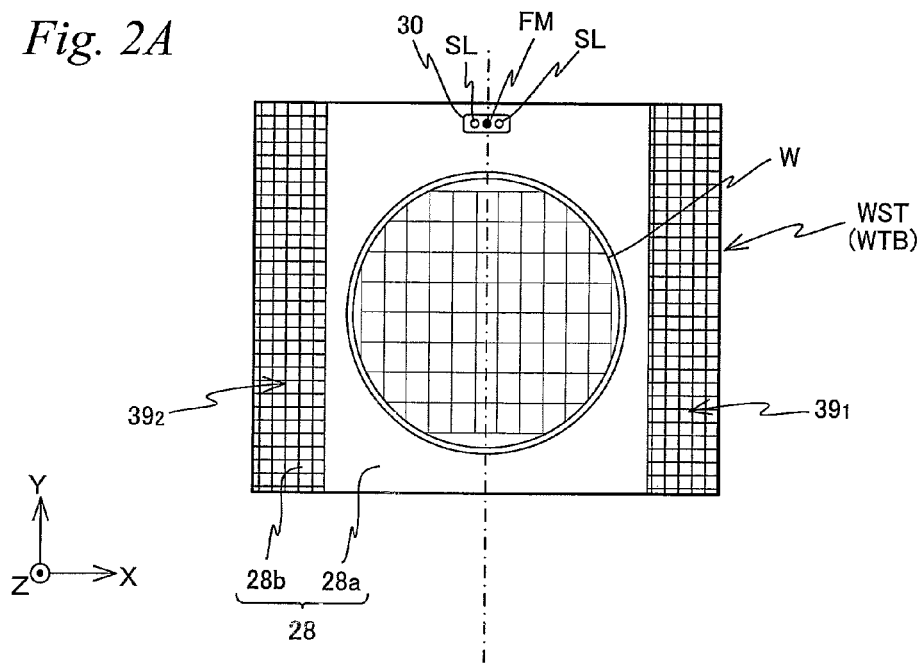
FIG. 2A is a planar view showing a wafer stage WST in FIG. 1.
Figure 2B:
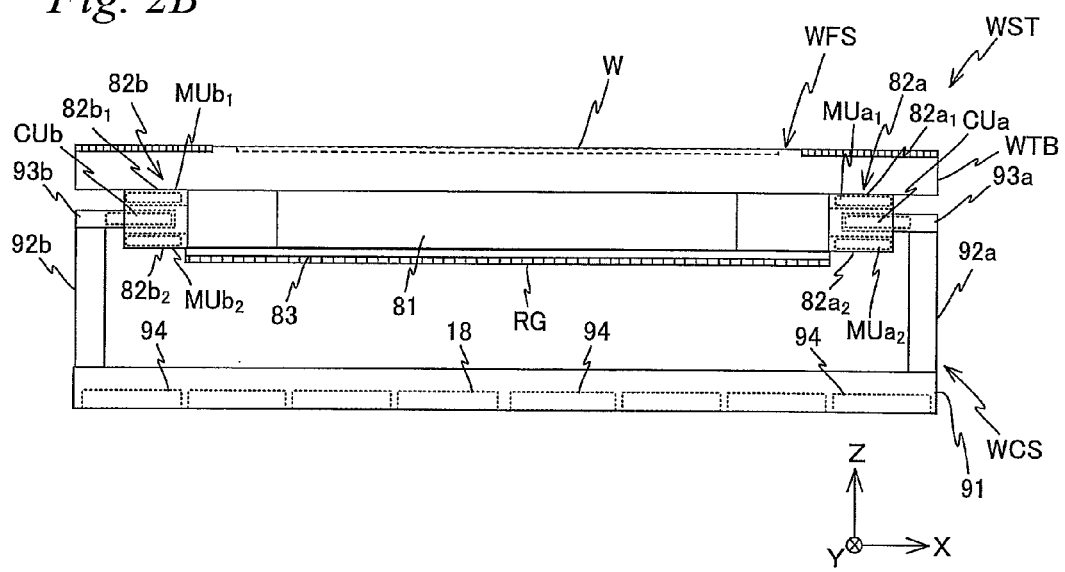
FIG. 2B is a view (front view) of wafer stage WST when viewed from a −Y direction.

As it can be seen from FIGS. 1, 2B and the like, wafer stage WST has a coarse movement stage WCS, and a fine movement stage WFS which is supported in a non-contact state by coarse movement stage WCS via an actuator (for example, including at least one of a voice coil motor and an EI core) and can relatively move with respect to coarse movement stage WCS. To coarse movement stage WCS, although it is not shown, a tube carrier placed on a guide surface provided separately on the +X side (or the −X side) of base board 12 is connected, via a tube to which piping and wiring is integrated. The tube carrier supplies power usage such as, for example, electric power (electric current), cooling medium, compressed air, vacuum and the like to coarse movement stage WCS via the tube. Further, a part of the power usage supplied to coarse movement stage WCS (for example, vacuum and the like) is supplied to fine movement stage WFS. The tube carrier is driven in the Y-axis direction following wafer stage WST by main controller 20, for example, via a linear motor and the like. The drive of the tube carrier in the Y-axis direction does not necessarily have to strictly follow wafer stage WST in the Y-axis direction, as long as the tube carrier follows wafer stage WST within a permissible range. Further, the tube carrier can be placed on base board 12, and in this case, the tube carrier can be driven by a planar motor to be described later which drives coarse movement stage WCS. Incidentally, the tube carrier can also be called a cable carrier, or a follower. Further, wafer stage WST does not necessarily have to have a coarse/fine movement structure.

Wafer stage WST (coarse movement stage WCS) is driven with predetermined strokes in the X-axis and Y-axis directions, and also finely driven in the θz direction by a coarse movement stage driving system 51A including the planar motor to be described later on (refer to FIG. 16). Further, fine movement stage WFS is driven in directions of six degrees of freedom (in each of the X-axis, the Y-axis, the Z-axis, the θx, the θy, and the θz directions) by a fine movement stage driving system 52A including the actuator previously described (refer to FIG. 16) with respect to coarse movement stage WCS. Incidentally, coarse movement stage WCS can be driven in directions of six degrees of freedom by the planar motor to be described later on.

Position information at least within the XY-plane (including rotational information in the θz direction) of wafer stage WST (coarse movement stage WCS) is measured by a wafer stage position measurement system 16A (refer to FIGS. 1 and 16) consisting of an interferometer system. Further, position information in directions of six degrees of freedom of fine movement stage WFS supported by coarse movement stage WCS in exposure station 200 is measured by the first fine movement stage position measurement system 110A (refer to FIG. 1). Incidentally, wafer stage position measurement system 16A does not necessarily have to be provided. In this case, position information in directions of six degrees of freedom of wafer stage WST in exposure station 200 can be measured with only the first fine movement stage position measurement system 110A.

Further, when coarse movement stage WCS is at measurement station 300, position information in directions of six degrees of freedom of fine movement stage WFS supported by coarse movement stage WCS is measured by a second fine movement stage position measurement system 110B (refer to FIG. 1).

Further, within measurement station 300, when performing focus mapping and the like to be described later on, position information of fine movement stage WFS is measured also by a third back side encoder system 70C and a third top side encoder system 80C (refer to FIG. 16) to be described later on. In the embodiment, because the positions in the Y direction differ with the detection center of alignment device 99 and the detection point of the multi-point AF system as is previously described, the third back side encoder system 70C and the third top side encoder system 80C are provided separately from the second fine movement stage position measurement system 110B. Therefore, in mark detection of wafer W and the like by alignment device 99, the second fine movement stage position measurement system 110B can measure position information of wafer stage WST at substantially the same position as the detection center of alignment device 99 at least for the Y direction, and in measurement of position information in the Z direction of wafer W and the like by multi-point AF system, the third back side encoder system 70C and the third top side encoder system 80C can measure position information of wafer stage WST at substantially the same position as the detection point of the multi-point AF system at least for the Y direction.

Incidentally, in the case the positions in the Y direction are substantially the same, or the spacing in the Y direction is small with the detection center of alignment device 99 and the detection point of the multi-point AF system, the third back side encoder system 70C and the third top side encoder system 80C do not necessarily have to be provided. In this case, also in the measurement operation of the multi-point AF system, the second fine movement stage position measurement system 110B can be used to measure the position information of wafer stage WST. Further, even if the positions are different with the detection center of alignment device 99 and the detection point of the multi-point AF system, in the case that the third back side encoder system 70C and the third top side encoder system 80C are not provided and only the second fine movement stage position measurement system 110B is used, the second fine movement stage position measurement system 110B can be placed so that position information of wafer stage WST is measured in between the detection center of alignment device 99 and the detection point of the multi-point AF system in the Y direction, such as, for example, in the center.

Furthermore, position information of fine movement stage WFS between exposure station 200 and measurement station 300, that is, between the measurement ranges of the first fine movement stage position measurement system 110A and the second fine movement stage position measurement system 110B, is measured by a fourth top side encoder system 80D (refer to FIG. 16) to be described later on. Incidentally, in the range where position information of wafer stage can no longer be measured by the first and the second fine movement stage position measurement systems 110A and 110B, or in other words, outside the measurement range previously described, the measurement device for measuring the position information of wafer stage WST is not limited to the fourth top side encoder system 80D, and other measurement devices, such as for example, the interferometer system, an encoder system having a detection method and/or structure different from the fourth top side encoder system 80D, or the like can also be used.

Further, position information of measurement stage MST within the XY-plane is measured by a measurement stage position measuring system 16B (refer to FIGS. 1 and 16), consisting of an interferometer system. Incidentally, the measurement device for measuring the position information of measurement stage MST is not limited to the interferometer system, and other measurement devices such as for example, an encoder system (including the fifth top side encoder system which will be described later on) can also be used.

Measurement values (position information) of wafer stage position measurement system 16A, measurement stage position measuring system 16B, and the fourth top side encoder system 80D are supplied to main controller 20 (refer to FIG. 16), for position control of coarse movement stage WCS, measurement stage MST, and fine movement stage WFS, respectively. Further, measurement results of the first and the second fine movement stage position measurement systems 110A and 110B, and the third back side encoder system 70C and the third top side encoder system 80C are supplied to main controller 20 (refer to FIG. 16) via switching sections 150A to 150C, respectively, that will be described later on, for position control of coarse movement stage WCS, measurement stage MST, and fine movement stage WFS, respectively.

Now, details of the structure and the like of the stage systems, including the various measurement systems described above will be described. First of all, wafer stage WST will be described.

Coarse movement stage WCS, as shown in FIG. 2B, is equipped with a coarse movement slider section 91, a pair of side wall sections 92a and 92b, and a pair of stator sections 93a and 93b. Coarse movement slider section 91 consists of a rectangular plate shaped member whose length in the X-axis direction in a planar view (when viewing from the +Z direction) is slightly longer than the length in the Y-axis direction. The pair of side wall sections 92a and 92b each consist of a rectangular plate shaped member whose longitudinal direction is in the Y-axis direction, and are each fixed to the upper surfaces on one end and the other end, respectively, in the longitudinal direction of coarse movement slider section 91 in a state parallel to a YZ-plane. The pair of stator sections 93a and 93b is fixed, facing toward the center in the center along the Y-axis direction on each of the upper surfaces of side wall sections 92a and 92b. Coarse movement stage WCS, as a whole, has a short rectangular parallelepiped shape with openings in the center of the X-axis direction on the upper surface and in both side surfaces in the Y-axis direction. That is, in coarse movement stage WCS, a space is formed inside penetrated in the Y-axis direction. Measurement arms 71A and 71B are inserted into this space, at the time of exposure, the time of alignment and the like which will be described later on. Incidentally, the length in the Y-axis direction of side wall sections 92a and 92b can be substantially the same as the stator sections 93a and 93b. That is, side wall sections 92a and 92b can be provided only in the center along the Y-axis direction on the upper surface of one end and the other end in the longitudinal direction of coarse movement slider section 91. Further, coarse movement stage WCS only has to be movable supporting fine movement stage WFS, and can also be referred to as a main section, a moving body, or a movable body of wafer stage WST.

Inside base board 12, as shown in FIG. 1, a coil unit is housed that includes a plurality of coils 17 which are placed in the shape of a matrix with the XY two-dimensional directions serving as a row direction and a column direction. Incidentally, base board 12 is placed below projection optical system PL so that its surface is substantially parallel with the XY plane.

Corresponding to the coil units, on the bottom surface of coarse movement stage WCS, or in other words, on the bottom surface of coarse movement slider section 91, as shown in FIG. 2B, a magnet unit is provided, consisting of a plurality of permanent magnets 18 placed in the shape of a matrix with the XY two-dimensional directions serving as a row direction and a column direction. The magnet unit, along with the coil unit of base board 12, structures coarse movement stage driving system 51A (refer to FIG. 16) consisting of an electromagnetically (Lorentz force) driven planar motor like the ones disclosed in, for example, U.S. Pat. No. 5,196,745 and the like. The magnitude and the direction of current supplied to each coil 17 structuring the coil unit are controlled by main controller 20.

On the bottom surface of coarse movement slider section 91 in the vicinity of the magnet unit described above, a plurality of air bearings 94 is fixed. Coarse movement stage WCS is supported by levitation above base board 12 by the plurality of air bearings 94 via a predetermined clearance gap (clearance, gap), for example, a clearance gap of around several μm, and is driven by coarse movement stage driving system 51A in the X-axis direction, the Y-axis direction, and the θz direction.

Incidentally, coarse movement stage driving system 51A is not limited to the electromagnetically (Lorentz force) driven planar motor, and for example, a planar motor which employs a variable reluctance drive method can also be used. Besides this, coarse movement stage driving system 51A can be structured using a magnetically levitated type planar motor, and with the planar motor, coarse movement stage WCS can be driven in directions of six degrees of freedom. In this case, air bearings do not have to be provided on the bottom surface of coarse movement slider section 91.

The pair of stator sections 93a and 93b are each made of a member whose external shape is a plate, and coil units CUa and CUb consisting of a plurality of coils used to drive fine movement stage WFS are housed inside. The magnitude and the direction of current supplied to each coil structuring coil units CUa and CUb are controlled by main controller 20.

Fine movement stage WFS, as shown in FIG. 2B, is equipped with a main section 81, a pair of mover sections 82a and 82b fixed to one edge and the other edge in the longitudinal direction of main section 81, respectively, and wafer table WTB consisting of a plate member having a rectangular shape in a planar view integrally fixed to the upper surface of main section 81.

Main section 81 consists of an octagonal plate shaped member whose longitudinal direction is in the X-axis direction in a planar view. On the lower surface of main section 81, a scale plate 83 consisting of a plate shaped member of a predetermined thickness and a predetermined shape, such as for example, a rectangular shape or an octagonal shape slightly larger than main section 81 in a planar view, is placed and fixed horizontally (parallel to the wafer W surface). On the lower surface of scale plate 83 in an area at least slightly larger than wafer W, a two-dimensional grating (hereinafter, simply referred to as a grating) RG is provided.

Grating RG includes a reflection type diffraction grating (X diffraction grating) whose period direction is in the X-axis direction and a reflection type diffraction grating (Y diffraction grating) whose period direction is in the Y-axis direction. The pitch of the grid lines of the X diffraction grating and the Y diffraction grating is set, for example, to 1 μm.

Main section 81 and scale plate 83 are preferably formed, for example, of a material having a thermal expansion coefficient which is the same or about the same, and the material is preferably a material having a low thermal expansion coefficient. Further, the surface of grating RG can be protected, being covered by a protective member, such as, for example, a cover glass which is made of a transparent material having transmittance to light and a low thermal expansion coefficient. Incidentally, grating RG may employ any structure as long as grating RG is arranged periodically in two different directions, and the periodic directions do not have to coincide with the X direction and the Y direction, such as for example, the periodic directions being rotated by 45 degrees to the X direction and the Y direction.

In the present embodiment, while fine movement stage WFS has main section 81 and wafer table WTB, for example, wafer table WTB can be driven by the actuator previously described, without main section 81 provided. Further, fine movement stage WFS only has to have a mounting area of wafer W on a part of its upper surface, and can be referred to as a holding section, table, or moving section of wafer stage WST.

The pair of mover sections 82a and 82b each have a housing whose YZ section is rectangular frame shaped fixed to one end and the other end in the X-axis direction of main section 81, respectively. Hereinafter, for the sake of convenience, these housings will be expressed as housings 82a and 82b, using the same reference signs as mover sections 82a and 82b.

Housing 82a has a space (opening section) having a rectangular YZ shape elongated in the Y-axis direction and whose size (length) in the Y-axis direction and size (height) in the Z-axis direction are both slightly larger than stator section 93a. Into the space of housing 82a, the edge on the −X side of stator section 93a of coarse movement stage WCS is inserted in a non-contact manner. Inside housing 82a in an upper wall section $82a_1$ and a bottom wall section $82a_2$, magnet units $MUa_1$ and $MUa_2$ are provided.

Mover section 82b is similarly structured to mover section 82a, while being horizontally symmetric. Into the space of housing (mover section) 82b, the edge on the +X side of stator section 93b of coarse movement stage WCS is inserted in a non-contact manner. Inside housing 82b in an upper wall section $82b_1$ and a bottom wall section $82b_2$, magnet units $MUb_1$ and $MUb_2$ which are structured similarly to magnet units $MUa_1$ and $MUa_2$ are provided.

Coil units CUa and CUb described above are housed inside stator sections 93a and 93b, respectively, corresponding to magnet units $MUa_1$ and $MUa_2$, and $MUb_1$ and $MUb_2$, respectively.

The structures of magnet units $MUa_1$ and $MUa_2$, and $MUb_1$ and $MUb_2$, and coil units CUa and CUb are disclosed in detail in, for example, U.S. Patent Application Publication No. 2010/0073652, U.S. Patent Application Publication No. 2010/0073653 and the like.

In the present embodiment, fine movement stage driving system 52A (refer to FIG. 16) is structured, including the pair of magnet units $MUa_1$ and $MUa_2$ which mover section 82a has and coil unit CUa which stator section 93a has, and the pair of magnet units $MUb_1$ and $MUb_2$ which mover section 82b has and coil unit CUb which stator section 93b has that are previously described, that supports fine movement stage WFS by levitation with respect to coarse movement stage WCS in a non-contact state, and also drives fine movement stage WFS in directions of six degrees of freedom in a non-contact manner, similarly to the U.S. Patent Application Publication No. 2010/0073652 and U.S. Patent Application Publication No. 2010/0073653 described above.

Incidentally, in the case of using a magnetic levitation type planar motor as coarse movement stage driving system 51A (refer to FIG. 16), because fine movement stage WFS can be finely driven in each of the Z-axis, the θx, and the θy directions integrally with coarse movement stage WCS by the planar motor, fine movement stage driving system 52A can employ a structure where fine movement stage WFS is drivable in each of the X-axis, the Y-axis, and the θz directions, that is, in directions of three degrees of freedom within the XY-plane. Besides this, for example, to each of the pair of side wall sections 92a and 92b of coarse movement stage WCS, electromagnets can be provided in pairs, each facing the oblique side section of the octagonal shape of fine movement stage WFS, and in fine movement stage WFS, a magnetic body member can be provided facing each electromagnet. Because this allows fine movement stage WFS to be driven within the XY-plane by the magnetic force of the electromagnet, mover sections 82a and 82b and stator sections 93a and 93b can structure a pair of Y-axis linear motors.

In the center of the upper surface of wafer table WTB, a wafer holder (not shown) is provided which holds wafer W by vacuum chucking and the like. The wafer holder can be integrally formed with wafer table WTB, or can be fixed to wafer table WTB, for example, via an electrostatic chuck mechanism, a clamp mechanism and the like, or by adhesion and the like. Here, although it is omitted in the drawings in FIG. 2B and the like, in main section 81, a plurality of, for example, three vertical movement pins 140 (refer to FIG. 6A), which are vertically movable via holes provided in wafer table WTB and the wafer holder are provided. The three vertical movement pins 140 are vertically movable so that their upper surfaces vertically move between a first position above the upper surface of the wafer holder (wafer table WTB) and a second position below the upper surface of the wafer holder (wafer table WTB). The three vertical movement pins 140 are driven by main controller 20 via a driver 142 (refer to FIG. 16).

On the outside the wafer holder (mounting area of the wafer) on the upper surface of wafer table WTB, as shown in FIG. 2A, a circular opening slightly larger than the wafer holder is formed in the center, and a plate (liquid repellent plate) 28 is provided that has a rectangular outer shape (outline). Plate 28 is made of a material with a low thermal expansion coefficient, such as, for example, glass or ceramics (e.g., Zerodur (product name) of Schott AG, $Al_2O_3$ or TiC and the like), and on its surface, a liquid repellent processing to liquid Lq is applied. To be specific, a liquid repellent film is formed of, for example, a fluorine-based resin material such as a fluororesin material or polytetrafluoroethylene (Teflon (registered trademark)), an acrylic-based resin material, a silicon-based resin material or the like. Incidentally, plate 28 is fixed to the upper surface of wafer table WTB so that its entire (or a part of the) surface is substantially flush with the surface of wafer W.

Plate 28 is positioned in the center in the X-axis direction of wafer table WTB, and has a first liquid repellent area 28a having a rectangular outer shape (outline) and a circular opening formed in the center, and a pair of second liquid repellent areas 28b having a rectangular shape and being positioned on the +X side edge and the −X side edge of wafer table WTB, with the first liquid repellent area 28a in between in the X-axis direction. Incidentally, in the present embodiment, because water is used as liquid Lq as is previously described, hereinafter, the first liquid repellent area 28a and the second liquid repellent area 28b will also be referred to as a first water repellent plate 28a and a second water repellent plate 28b, respectively.

In the vicinity of the edge on the +Y side of the first water repellent plate 28a, a measurement plate 30 is provided. In this measurement plate 30, a fiducial mark FM is provided in the center, and a pair of aerial image measurement slit patterns (slit shaped measurement patterns) SL is provided, with fiducial mark FM in between. And, corresponding to each aerial image measurement slit pattern SL, a light transmitting system (not shown) is provided which guides illumination light IL passing through the slit patterns to the outside of wafer stage WST (a light receiving system provided in measurement stage MST to be described later on). Measurement plate 30 is placed, for example, within an opening of plate 28 different from the opening where the wafer holder is placed, and a gap between measurement plate 30 and plate 28 is blocked so that the liquid does not flow into wafer table WTB by a seal member and the like. Further, measurement plate 30 is provided on wafer table WTB so that its surface is substantially flush with the surface of plate 28. Incidentally, at least one opening section (light transmitting section) different from slit pattern SL can be formed on measurement plate 30, and by detecting illumination light IL passing through the opening section via projection optical system PL and the liquid with a sensor, for example, optical properties of projection optical system PL (including wavefront aberration and the like) and/or properties of illumination light IL (including light amount, illuminance distribution within exposure area IA previously described and the like) can be measured.

On the pair of the second water repellent plates 28b, scales $39_1$ and $39_2$ are formed, respectively, for the first to fourth top side encoder systems 80A to 80D. To describe this in detail, scales $39_1$ and $39_2$ are each structured by a reflection type two-dimensional diffraction grating which is a combination of, for example, a diffraction grating whose period direction is in the Y-axis direction and a diffraction grating whose period direction is in the X-axis direction. The pitch of the grid lines of the two-dimensional diffraction grating is set to, for example, 1 μm for both the Y-axis direction and the X-axis direction. Further, because the pair of the second water repellent plates 28b each have scales (two-dimensional gratings) $39_1$ and $39_2$, the second water repellent plates are referred to as a grating member, a scale plate, or a grid plate, and in the present embodiment, for example, a two-dimensional grating is formed on a surface of a glass plate having a low thermal expansion coefficient, and a liquid repellent film is formed so as to cover the two-dimensional grating. Incidentally, in FIG. 2A, for the sake of convenience in the drawings, the pitch of the grating is illustrated larger than the actual pitch. This is the same in other drawings as well. Further, the two-dimensional grating can have any structure as long as the grating is arranged periodically in two different directions, and the periodic directions do not have to coincide with the X direction and the Y direction, and for example, the, periodic direction can be rotated by 45 degrees with respect to the X direction and the Y direction.

Incidentally, to protect the diffraction grating of the pair of the second water repellent plates 28b, it is also effective to cover the diffraction grating with a low thermal expansion coefficient glass plate that has water repellency. Here, as the glass plate, a plate whose thickness is around the same as the wafer, such as for example, a plate having a 1 mm thickness, can be used, and as an example, the plate is installed on the upper surface of wafer table WTB so that the surface of the glass plate is at the same height (surface position) as the wafer surface. Further, in the case the pair of the second water repellent plates 28b is placed away from wafer W to an extent where the pair of the second water repellent plates 28b is not in contact with the liquid of the liquid immersion area previously described at least during the exposure operation of wafer W, the surface of the pair of the second water repellent plates 28b does not have to be liquid repellent. That is, the pair of the second water repellent plates 28b can each simply be a grating member on which a scale (two-dimensional grating) is formed.

In the present embodiment, while plate 28 is provided on wafer table WTB, plate 28 does not have to be provided. in this case, a recess portion in which the wafer holder is placed can be provided on the upper surface of wafer table WTB, and for example, a pair of grating members previously described whose surface is not liquid repellent can be placed on wafer table WTB in the X direction, with the recess section in between. As previously described, this pair of grating members should be placed apart from the recess section to an extent so that the pair of grating members is not in contact with the liquid of the liquid immersion area. Further, the recess can be formed so that the surface of wafer W held by the wafer holder within the recess section becomes substantially flush with the upper surface of wafer table WTB. Incidentally, the whole, or a part of the upper surface of wafer table WTB (including at least a periphery area surrounding the recess section) can be liquid repellent. Further, in the case the pair of grating members on which scales (two-dimensional grating) $39_1$ and $39_2$ are formed is placed in proximity to the recess section, the pair of the second water repellent plates 28 previously described can be used, instead of the pair of grating members whose surface is not liquid repellent.

Incidentally, near the edge the scales of each of the second water repellent plates 28b, positioning patterns not shown are provided, respectively, which are used to decide a relative position between an encoder head to be described later on and the scales. This positioning pattern is structured, for example, of grid lines with different reflectivity, and when the encoder head scans this positioning pattern, the intensity of the output signal of the encoder changes. Therefore, a threshold value is decided in advance, and the position where the intensity of the output signal exceeds the threshold value is detected. The relative position between the encoder head and the scale is set with the detected position serving as a reference. Further, as described above, in the present embodiment, because fine movement stage WFS is equipped with wafer table WTB, in the description hereinafter, fine movement stage WFS including wafer table WTB will also be described as wafer table WTB.

Next, although it is out of sequence, chuck unit 120 will be described. Chuck unit 120 is used to hold a wafer which is not yet exposed above its loading position prior to loading the wafer on wafer table WTB, and to load the wafer on wafer table WTB.

Figure 6A:
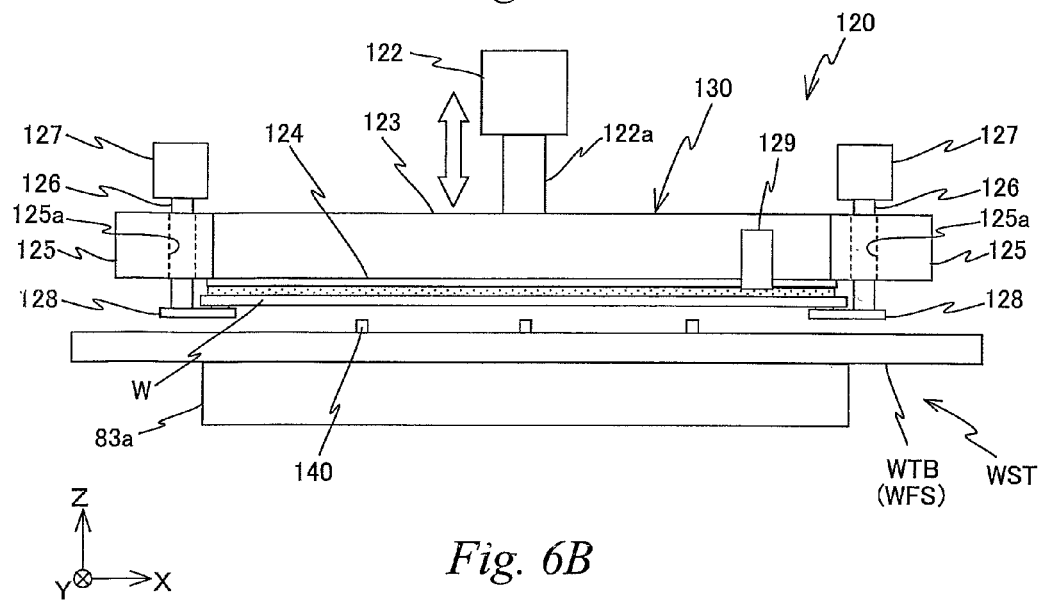
FIG. 6A is a schematic front view (when viewed from a −Y direction) of a chuck unit.
Figure 6B:
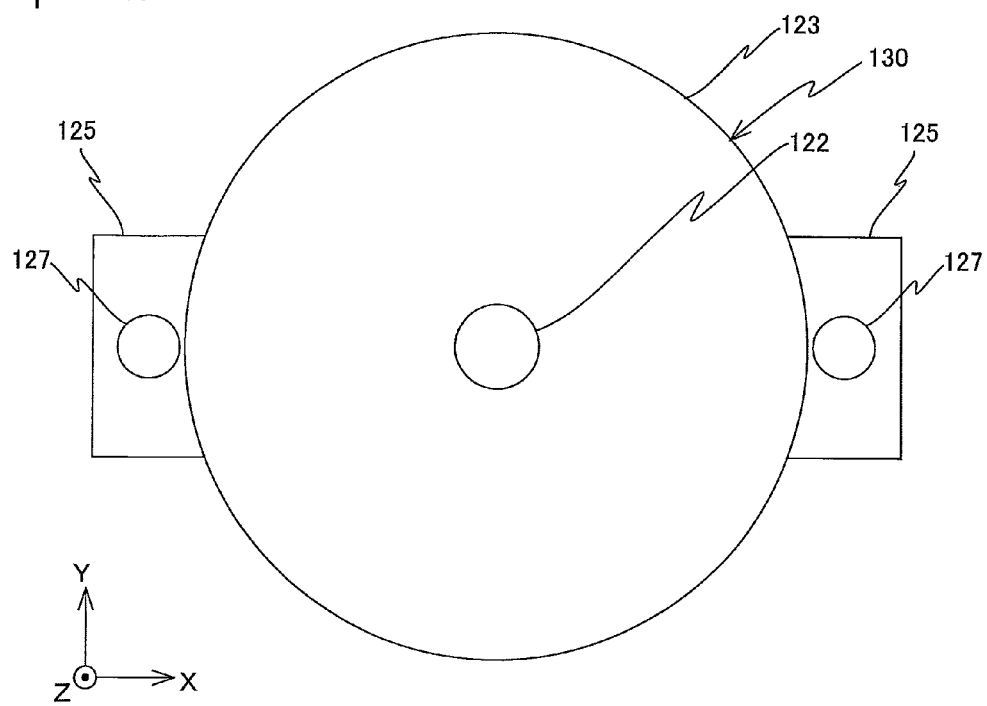
FIG. 6B is a schematic planar view of the chuck unit.

Chuck unit 120, as shown in FIG. 1, is equipped with a drive section 122 fixed to the lower surface of main frame BD via a vibration isolation member which is not shown, and a chuck main section 130 which is vertically moved by drive section 122. FIG. 6A schematically shows a front view of chuck unit 120 (when viewed from the −Y direction), and FIG. 6B schematically shows a planar view of chuck unit 120, respectively. Drive section 122 incorporates a motor, and drives chuck main section 130 via a vertical movement shaft 122a in a vertical direction (Z-axis direction) as shown in FIG. 6A.

Chuck main section 130 is equipped with a cool plate 123 consisting of a plate shaped member which is circular in a planar view having a predetermined thickness and whose upper surface is fixed to the lower end of vertical movement shaft 122a, a Bernoulli chuck (or also called a float chuck) 124 whose upper surface is fixed to the lower surface of cool plate 123, and the like.

Cool plate 123 is used to control the temperature of the wafer to a predetermined temperature, and for example, the wafer is controlled to a predetermined temperature by a piping and the like being provided inside the plate, and a liquid whose temperature is controlled to a predetermined temperature flowing in the piping. On both ends in the X-axis direction of cool plate 123, a pair of guide sections 125 is provided. In each of the pair of guide sections 125, a guide hole 125a is formed consisting of a through hole which is running in the vertical direction.

Inside guide hole 125a formed in one of guide sections 125, a shaft 126 extending in the vertical direction is inserted with a predetermined interval formed. The upper end of shaft 126 is exposed above guide section 125, and is connected to a vertical movement rotation driving section 127. Vertical movement rotation driving section 127 is attached to main frame BD via an attachment member not shown. The lower end of shaft 126 is exposed below guide sections 125, and a support plate 128 extending in an uniaxial direction within the XY-plane (extending in the X-axis direction in FIG. 6A) is fixed to its lower end surface. Incidentally, to prevent dust from being generated, it is preferable to place a non-contact bearing such as an air bearing at a plurality of places on the inner circumference surface of guide hole 125a. The upper surface near one end in the longitudinal direction of support plate 128 is fixed to shaft 126. The other end in the longitudinal direction of support plate 128 is rotationally driven by vertical movement rotation driving section 127 in the θz direction between a first rotating position which faces the outer circumference of Bernoulli chuck 124 and a second rotating position which does not face Bernoulli chuck 124, and is driven in the vertical direction as well in predetermined strokes.

Vertical movement rotation driving section 127, shaft 126, and support plate 128 are also provided in the other guide section 125 side, in the place and structure similar to the description above.

Bernoulli chuck 124 consists of a plate shaped member which is substantially the same size as cool plate 123 but much thinner than cool plate 123. To three places on the outer circumference surface of Bernoulli chuck 124, an imaging device 129, such as, for example, a CCD and the like, is attached in an embedded state (in FIG. 6A and the like, only one of the imaging devices is shown representatively). One of the three imaging devices 129 is placed at a position facing a notch (cut in a V-shape, not shown) of wafer W in a state where the center of wafer W substantially coincides with the center of Bernoulli chuck 124, and the remaining two imaging devices 129 are each placed at a position facing a part of the outer circumference of wafer W in a state where the center of wafer W substantially coincides with the center of Bernoulli chuck 124. Further, in Bernoulli chuck 124, for example, a gap sensor which is not shown consisting of an electrostatic capacitance sensor is provided, and its output is supplied to main controller 20.

Bernoulli chuck is a chuck, as is well known, which utilizes the Bernoulli effect to locally increase the flow velocity of a fluid (for example, air) that blows out, and fixes (hereinafter also appropriately referred to as supports, holds, or suctions) a subject in a non-contact manner. Here, the Bernoulli effect refers to an effect of the Bernoulli's theory (principle) in which the pressure of a fluid decreases when the flow velocity of the fluid increases that is exerted on fluid machinery and the like. In the Bernoulli chuck, the holding state (suction/levitation state) is decided according to the weight of the subject which is suctioned (fixed), and the flow velocity of the fluid that blows out from the chuck. That is, in the case the size of the subject is known, the size of the gap between the chuck upon holding and the subject to be held is decided according to the flow velocity of the fluid blowing out from the chuck. In the present embodiment, Bernoulli chuck 124 is used to suction (support or hold) a wafer (W). Movement of the wafer in the Z-axis direction, and the θx and θy directions is limited by the wafer being held by suction by Bernoulli chuck 124, while movement in the X-axis direction, the Y-axis direction and the θz direction is limited by a frictional force occurring when being in contact and supported from below at two places near the outer circumference on the lower surface (rear surface) of the pair of support plates 128 in a state where the wafer is suctioned (supported or held) by Bernoulli chuck 124.

Incidentally, the chuck used is not limited to the chuck utilizing the Bernoulli effect, and a chuck which holds a wafer in a non-contact manner without utilizing the Bernoulli effect can also be used. In the embodiment, such chucks are included (referred to in general) as a Bernoulli chuck.

Imaging signals of imaging device 129 described above are sent to a signal processing system 116 (refer to FIG. 16), and by using the method disclosed in, for example, U.S. Pat. No. 6,624,433 and the like, signal processing system 116 detects three places of the wafer in the periphery including the cut (such as the notch) and obtains positional deviation of wafer W in the X-axis direction and the Y-axis direction and rotation (θz rotation) errors. And, information of the positional deviation and rotation errors is supplied to main controller 20 (refer to FIG. 16). In the present embodiment, while the three imaging devices 129 are used as a pre-alignment device for performing position measurement of wafer W held by Bernoulli chuck 124, the pre-alignment device is not limited to the imaging devices, and other sensors such as for example, a light amount sensor and the like can also be used. Further, while the pre-alignment device is provided in Bernoulli chuck 124, for example, one of a light-emitting section and a light-receiving section structuring the pre-alignment device can be provided in Bernoulli chuck 124, and the other can be provided in wafer stage WST or in main frame BD and the like. Furthermore, at least a part of the light-emitting section and a light-receiving section, such as for example, a light source and/or a sensor (detector) and the like can be provided not in Bernoulli chuck 124, but in other places such as for example, in the main section frame and the like.

Figure 16:
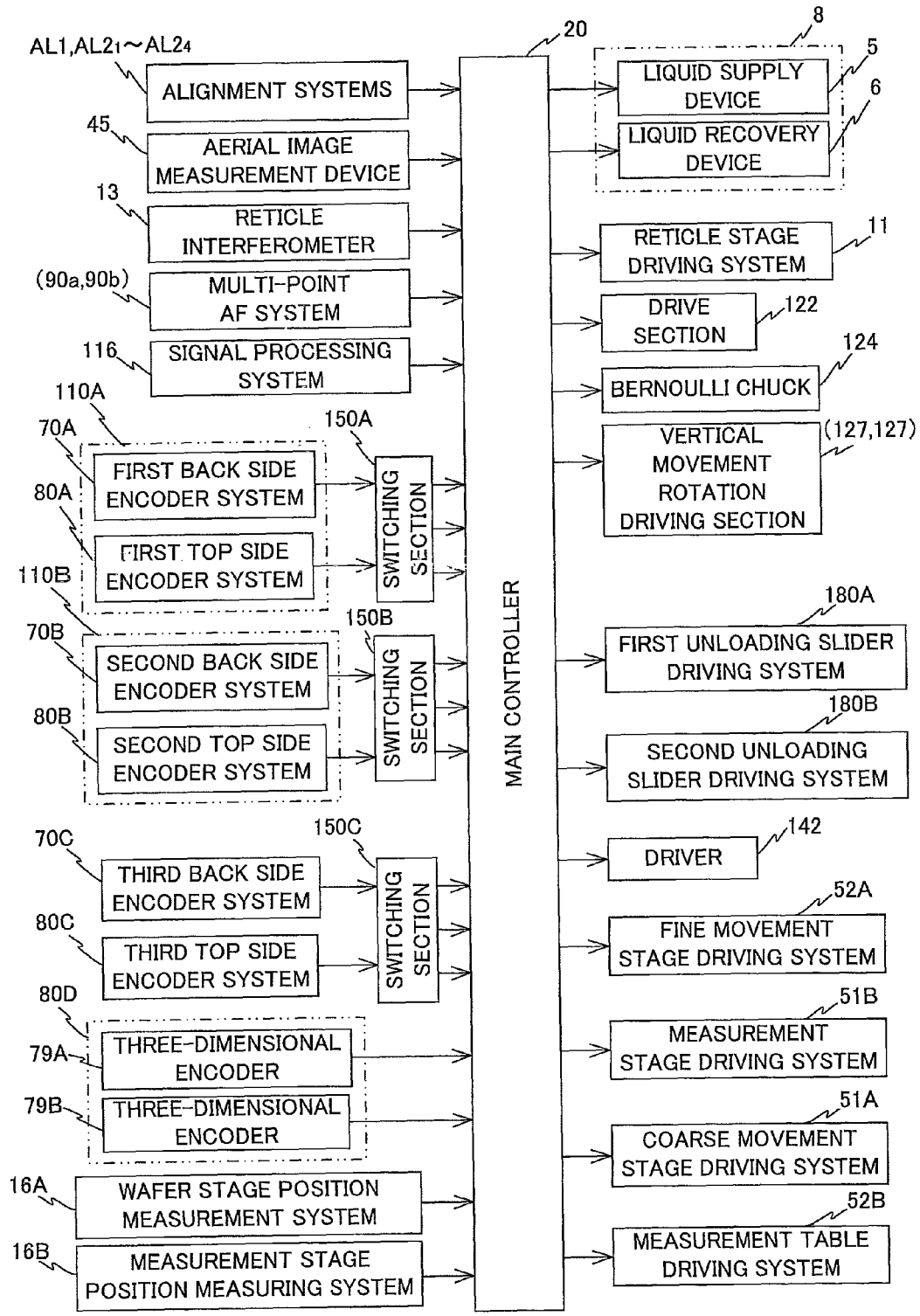
FIG. 16 is a block diagram showing an input/output relation of a main controller mainly structuring a control system of an exposure apparatus related to an embodiment.

Drive section 122, Bernoulli chuck 124, a pair of vertical movement rotation driving sections 127 and the like of chuck unit 120 are controlled by main controller 20 (refer to FIG. 16). Each operation performed by main controller 20 using chuck unit 120 will be described later in the description.

Next, measurement stage MST will be described. FIGS. 3A, 3B, and 3C show a front view (when viewed from the −Y direction), a side view (when viewed from the −X direction), and a planar view (when viewed from +Z direction) of measurement stage MST, respectively. As shown in these FIGS. 3A to 3C, measurement stage MST is equipped with a slider section 60 which has a rectangular shape and whose longitudinal direction is in the X-axis direction in a planar view (when viewed from the +Z direction), a support section 62 consisting of a rectangular parallelepiped member fixed to the end on the +X side on the upper surface of slider section 60, and a measurement table MTB which has a rectangular plate shape and is supported in a cantilevered manner on support section 62, and is finely driven, for example, in directions of six degrees of freedom (or directions of three degrees of freedom within the XY-plane), via a measurement table driving system 52B (refer to FIG. 16).

On the bottom surface of slider section 60, although it is not shown, a magnet unit consisting of a plurality of permanent magnets is provided, which structures a measurement stage driving system 51B (refer to FIG. 16) consisting of an electromagnetically (Lorentz force) driven planar motor, along with a coil unit (coil 17) of base board 12. On the bottom surface of slider section 60, in the periphery of the magnet unit described above, a plurality of air bearings (not shown) is fixed. Measurement stage MST is supported by levitation above base board 12 by the air bearings previously described via a predetermined clearance gap (gap, clearance), such as for example, a clearance gap of around several μm, and is driven in the X-axis direction and the Y-axis direction by measurement stage driving system 51B. Incidentally, while coarse movement stage driving system 51A and measurement stage driving system 51B share the same coil unit, in the embodiment, for the sake of convenience, a concept of separately showing coarse movement stage driving system 51A and measurement stage driving system 51B is employed. In practice, because different coils 17 in the coil unit are used for the drive of wafer stage WST and measurement stage MST, respectively, this concept does not cause any problems. Incidentally, although measurement stage MST employs the air levitation method, for example, measurement stage MST can employ a magnetic floating method.

In measurement table MTB, various measurement members are provided. As such measurement members, for example, as shown in FIG. 3C, an illuminance irregularity sensor 95 which has a pin-hole shaped light receiving section that receives illumination light IL on an image plane of projection optical system PL, an aerial image measuring instrument 96 which measures an aerial image (projection image) of a pattern projected by projection optical system PL, a wavefront aberration measuring instrument 97 which employs a Shack-Hartmann (Shack-Hartmann) method whose details are disclosed in, for example, International Publication No. 03/065428 and the like, an illuminance monitor 98 which has a light receiving section of a predetermined area that receives illumination light IL on an image plane of projection optical system PL and the like are provided.

As illuminance irregularity sensor 95, a sensor having a structure similar to the one disclosed in, for example, U.S. Pat. No. 4,465,368 and the like can be used. Further, as aerial image measuring instrument 96, an instrument having a structure similar to the one disclosed in, for example, U.S. Patent Application Publication No. 2002/0041377 and the like can be used. As wavefront aberration measuring instrument 97, the one disclosed in, for example, International Publication 99/60361 (corresponding European Patent No. 1079223) can be used. As illuminance monitor 98, a monitor having a structure similar to the one disclosed in, for example, U.S. Patent Application Publication No. 2002/0061469 and the like can be used.

Further, in measurement table MTB, in a placement that can face the pair of light transmitting systems (not shown) previously described, a pair of light receiving systems (not shown) is provided. In the present embodiment, an aerial image measurement device 45 (refer to FIG. 16) is structured in which each light transmitting system (not shown) guides illumination light IL having passed through each aerial image measurement slit pattern SL of measurement plate 30 on wafer stage WST, and a photodetection element of each light receiving system (not shown) within measurement stage MST receives the light, in a state where wafer stage WST and measurement stage MST are close within a predetermined distance in the Y-axis direction (including a state in contact).

Incidentally, in the embodiment, while the four measurement members (95, 96, 97, and 98) were provided on measurement table MTB, the type and/or the number of the measurement members are/is not limited to this. As the measurement members, for example, a transmittance measuring instrument, and/or a measuring instrument which observes local liquid immersion device 8 previously described, such as for example, nozzle unit 32 (or tip lens 191) and the like, can also be used. Furthermore, a member different from the measurement members, such as, for example, a cleaning member used to clean nozzle unit 32, tip lens 191 and the like can also be installed in measurement stage MST.

Incidentally, in the embodiment, corresponding to performing the liquid immersion exposure of wafer W by exposure light (illumination light) IL via projection optical system PL and liquid (water) Lq, in illuminance irregularity sensor 95, aerial image measuring instrument 96, wavefront aberration measuring instrument 97, and illuminance monitor 98 described above used in measurement using illumination light IL, illumination light IL is to be received via projection optical system PL and the water. Further, each sensor can have a part of the sensor, such as for example, a light receiving surface (light receiving section) which receives illumination light via an optical system and water and a part of the optical system placed at measurement table MTB, or the whole sensor can be placed at measurement table MTB.

On the upper surface of measurement table MTB, a plate 63 is fixed, consisting of a transparent member whose surface is covered with a liquid repellent film (water repellent film). Plate 63 is made of a material similar to plate 28 previously described. On the lower surface (surface on the −Z side) of measurement table MTB, a grating RGa similar to grating RG previously described is provided.

Incidentally, in the case measurement stage driving system 51B is structured using a magnetic levitation type planar motor, the measurement stage can be, for example, a standalone stage which is movable in directions of six degrees of freedom. Further, plate 63 does not have to be provided on measurement table MTB. In this case, on the upper surface of measurement table MTB, a plurality of openings in which light-receiving surfaces (light transmitting sections) of the plurality of sensors previously described are each placed should be formed, and for example, at least a part of the sensors including the light-receiving surfaces can be provided on measurement table MTB so that the light-receiving surfaces within the opening becomes substantially flush with the upper surface of measurement table MTB.

Position information of measurement stage MST within the XY-plane is measured by main controller 20, using measurement stage position measuring system 16B (refer to FIGS. 1 and 16) consisting of a similar interferometer system to wafer stage position measurement system 16A.

Measurement stage MST is engageable to measurement arm 71A from the −X side, and in the engaged state, measurement table MTB is positioned right above measurement arm 71A. At this point, position information of measurement table MTB is measured by a plurality of encoder heads which irradiate a measurement beam on grating RGa that measurement arm 71A to be described later on has.

Further, measurement table MTB can be as near as a distance of, for example, around 300 μm or be in contact from the +Y side to/with wafer table WTB (fine movement stage WFS) supported by coarse movement stage WCS, and in the proximity or contact state, forms a surface (for example, refer to FIG. 27) that appears to be completely flat, along with the upper surface of wafer table WTB. Measurement table MTB (measurement stage MST) is driven by main controller 20 via measurement stage driving system 51B, and performs delivery of liquid immersion area (liquid Lq) with wafer table WTB. That is, a part of a border (boundary) which sets the liquid immersion space formed below projection optical system PL is switched from one of the upper surface of wafer table WTB and the upper surface of measurement table MTB to the other of the upper surface of wafer table WTB and the upper surface of measurement table MTB. Incidentally, the delivery of the liquid immersion area (liquid Lq) between measurement table MTB and wafer table WTB will be further described later on.

Next, the structure of the first fine movement stage position measurement system 110A (refer to FIG. 16), which is used to measure position information of fine movement stage WFS held movable by coarse movement stage WCS located at exposure station 200, will be described.

The first back side encoder system 70A of the first fine movement stage position measurement system 110A, as shown in FIG. 1, is equipped with measurement arm 71A which is inserted into a space provided inside coarse movement stage WCS in a state where wafer stage WST is placed below projection optical system PL.

Figure 7:
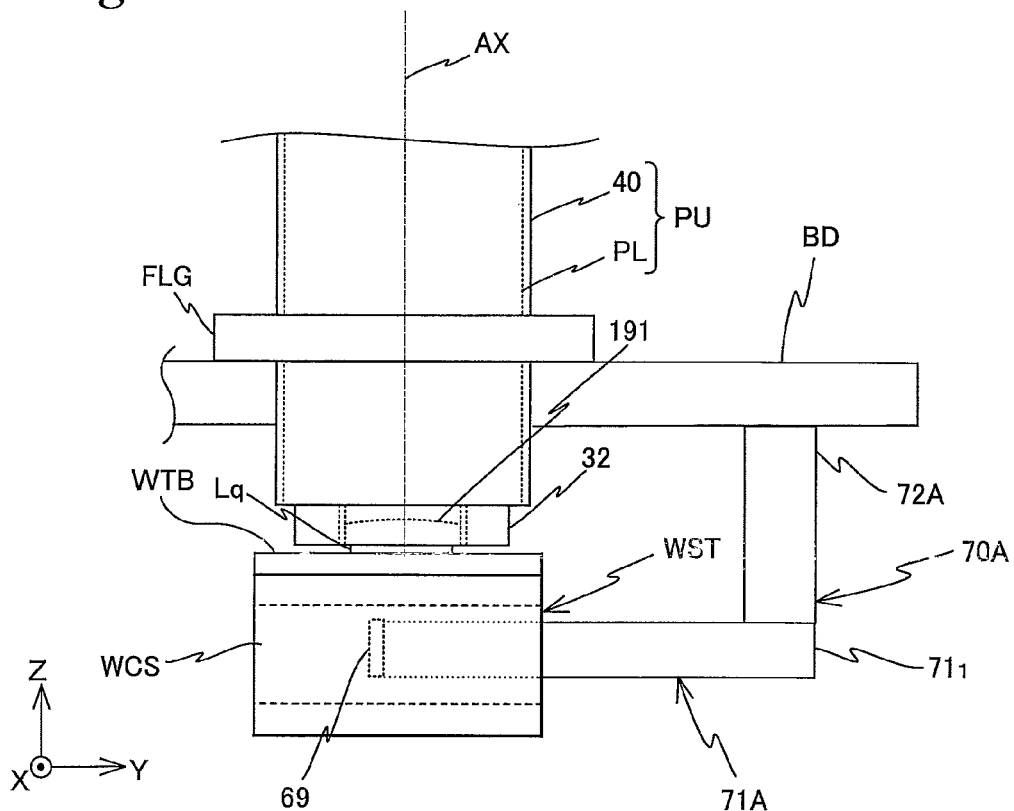
FIG. 7 is a view used to describe a schematic structure of a first back side encoder system in FIG. 1.
Figure 19:
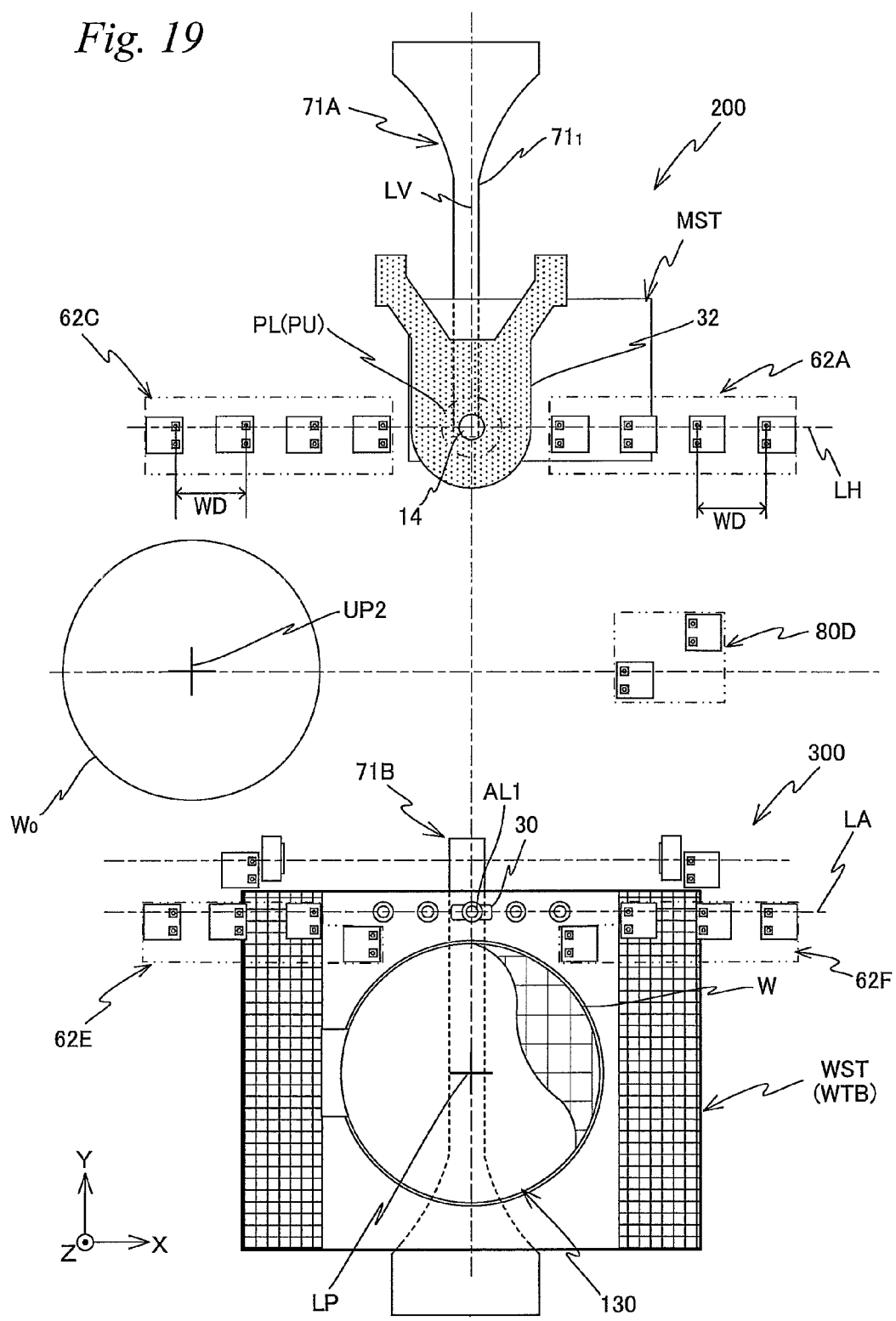
FIG. 19 is a view (No. 1) used to describe a concurrent processing operation using wafer stage WST and measurement stage MST.

Measurement arm 71A, as shown in FIG. 7, has an arm member 71$_1$ supported by main frame BD in a cantilevered state via support member 72A, and an encoder head (at least a part of the optical system) to be described later on housed inside arm member 71$_1$. That is, a head section (including at least a part of the optical system) of the first back side encoder system 70A is supported by a measurement member (also referred to as a support member or a metrology arm) including arm member 71$_1$ of measurement arm 71A and support member 72A so that the head section is placed lower than grating RG of wafer table WTB. This allows the measurement beam of the first back side encoder system 70A to be irradiated on grating RG from below. Arm member 71$_1$, as shown enlarged in FIG. 8A, consists of a hollow columnar member having a rectangular cross section whose longitudinal direction is in the Y-axis direction. The size in the width direction (the X-axis direction) of arm member 71$_1$, for example, as shown in FIG. 19, is widest near the base end, and the width narrows gradually from the base end toward the tip end side to a position slightly to the base end from the center in the longitudinal direction, and the width is substantially constant from the position slightly to the base end from the center in the longitudinal direction to the tip end. In the present embodiment, while the head section of the first back side encoder system 70A is placed in between grating RG of wafer table WTB and the surface of base board 12, for example, the head section can be place below base board 12.

Arm member 71$_1$ is made of a material having a low thermal expansion coefficient, preferably a material of zero expansion (for example, Zerodur (product name) of Schott AG and the like), and at the tip end, as shown in FIG. 7, for example, a mass damper (also called a dynamic mass damper) 69 having a specific resonance frequency of around 100 Hz is provided. Here, the mass damper is an elastic member such as, for example, a pendulum structured with a spring and a weight, and when this is attached, in the case vibration is applied externally to a structure (in this case, arm member 71$_1$), if the vibration frequency is the same as the resonance of the mass damper, the weight resonantly vibrates and alternatively absorbs the vibration energy of the structure (in this case, arm member 71$_1$). This can reduce the vibration of a particular frequency of the structure (in this case, arm member 71$_1$). Incidentally, the vibration of arm member 71$_1$ can be suppressed or prevented by a vibration suppressing member other than the mass damper. Further, this vibration suppressing member is one of a compensating device which compensates measurement errors of the first back side encoder system 70A which occurs due to the vibration of arm member 71$_1$, and the first top side encoder system 80A to be described later on is also one of a compensating device.

Arm member 71$_1$ has high rigidity because of being hollow and having a wide base end, and because the shape in a planar view is set in the manner described above, in a state where wafer stage WST is placed below projection optical system PL, wafer stage WST moves in a state where the tip of arm member 71$_1$ is inserted into the space of coarse movement stage WCS, and on this movement, this structure can keep arm member 71$_1$ from interfering the movement of the stage. Further, an optical fiber of a light transmitting side (light source side) and a light receiving side (detector side) and the like, which is used for transmitting light (measurement beam) between an encoder head to be described later on, runs through the inside the hollow space of arm member 71$_1$. Incidentally, arm member 71$_1$ can be formed, for example, of a member having a portion where only the optical fiber runs through is hollow, and other portions are solid.

As previously described, in the state where wafer stage WST is placed below projection optical system PL, the tip of arm member 71$_1$ of measurement arm 71A is inserted into the space within coarse movement stage WCS, and as shown in FIGS. 1 and 7, its upper surface faces grating RG (not shown in FIGS. 1 and 7, refer to FIG. 2B and the like) provided on the lower surface of fine movement stage WFS (to be more precise, the lower surface of main section 81). The upper surface of arm member 71$_1$ is placed substantially parallel to the lower surface of fine movement stage WFS, in a state where a predetermined clearance gap (gap, clearance), for example, a clearance of around several mm, is formed with the lower surface of fine movement stage WFS.

Figure 17:
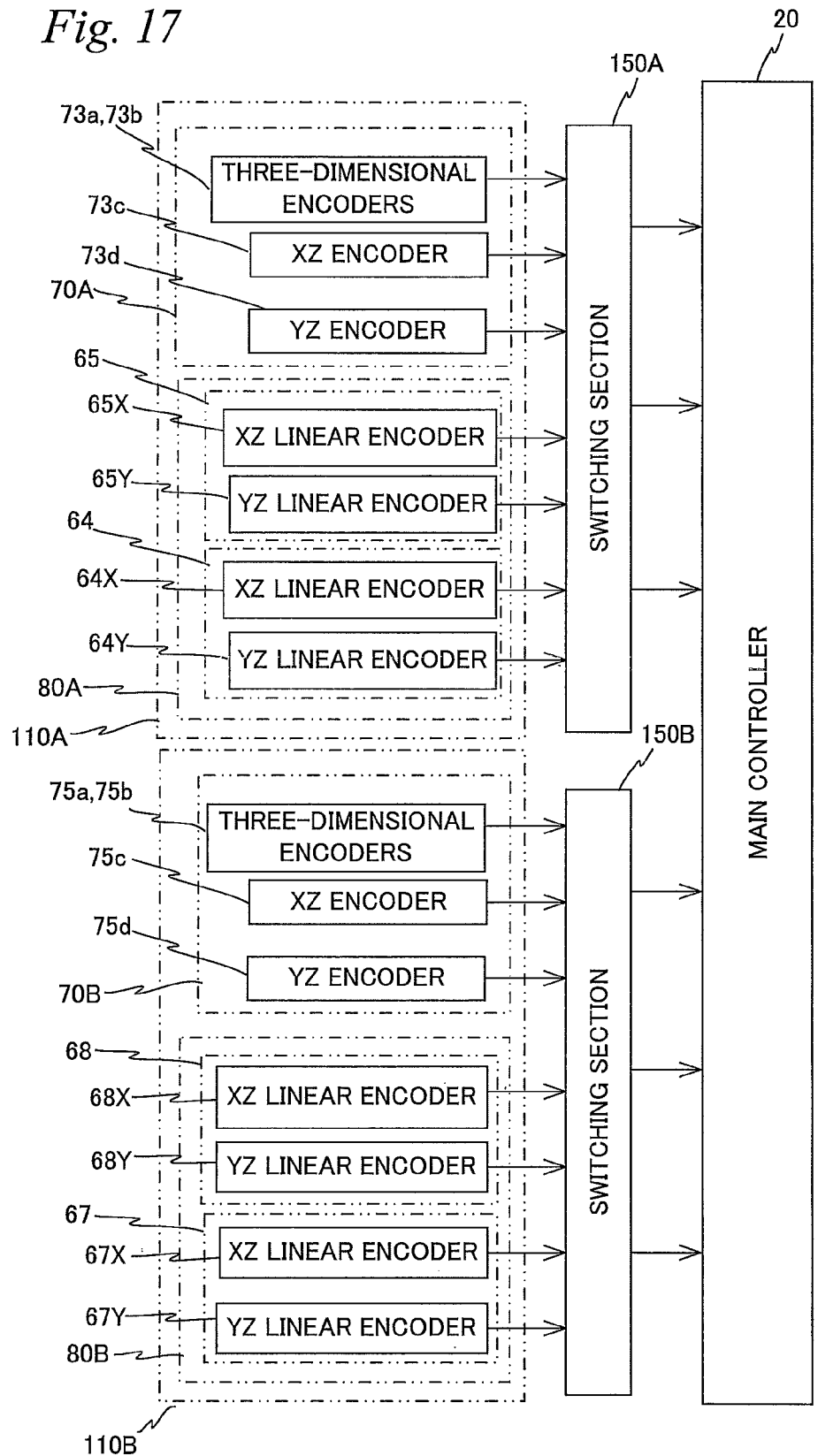
FIG. 17 is a view showing an example of a concrete structure of a first and second fine movement stage position measurement system in FIG. 16.

The first back side encoder system 70A, as shown in FIG. 17, includes a pair of three-dimensional encoders 73$a$ and 73$b$ which each measures a position of fine movement stage WFS in each of the X-axis, the Y-axis, and the Z-axis directions, an XZ encoder 73$c$ which measures a position of fine movement stage WFS in the X-axis and the Z-axis directions, and a YZ encoder 73$d$ which measures a position of fine movement stage WFS in the Y-axis and the Z-axis directions.

XZ encoder 73c and YZ encoder 73d are equipped with a two-dimensional head whose measurement direction is in the X-axis and the Z-axis directions and a two-dimensional head whose measurement direction is in the Y-axis and the Z-axis directions, respectively, housed inside the arm member of measurement arm 71A, respectively. Hereinafter, for the sake of convenience, the two-dimensional heads that XZ encoder 73c and YZ encoder 73d respectively have will be described as XZ head 73c and YZ head 73d, using the same reference sign as each of the encoders. As each of such XZ head 73c and YZ head 73d, an encoder head (hereinafter, appropriately shortened to as a head) having a structure similar to the displacement measurement sensor head disclosed in, for example, U.S. Pat. No. 7,561,280, can be used. Further, the pair of three-dimensional encoders 73a and 73b is equipped with a three-dimensional head whose measurement direction is in the X-axis, the Y-axis, and the Z-axis directions, each housed inside arm member $71_1$ of measurement arm 71A. Hereinafter, for the sake of convenience, the three-dimensional heads that three-dimensional encoders 73a and 73b have, respectively, will be described as three-dimensional heads 73a and 73b, using the same reference sign as each of the encoders. As three-dimensional heads 73a and 73b, for example, a three-dimensional head which is structured combining XZ head 73c and YZ head 73d so that the measurement point (detection point) of each of the heads is at the same point, and measurement in the X-axis direction, the Y-axis direction, and the Z-axis direction is also possible, can be used.

Figure 8A:
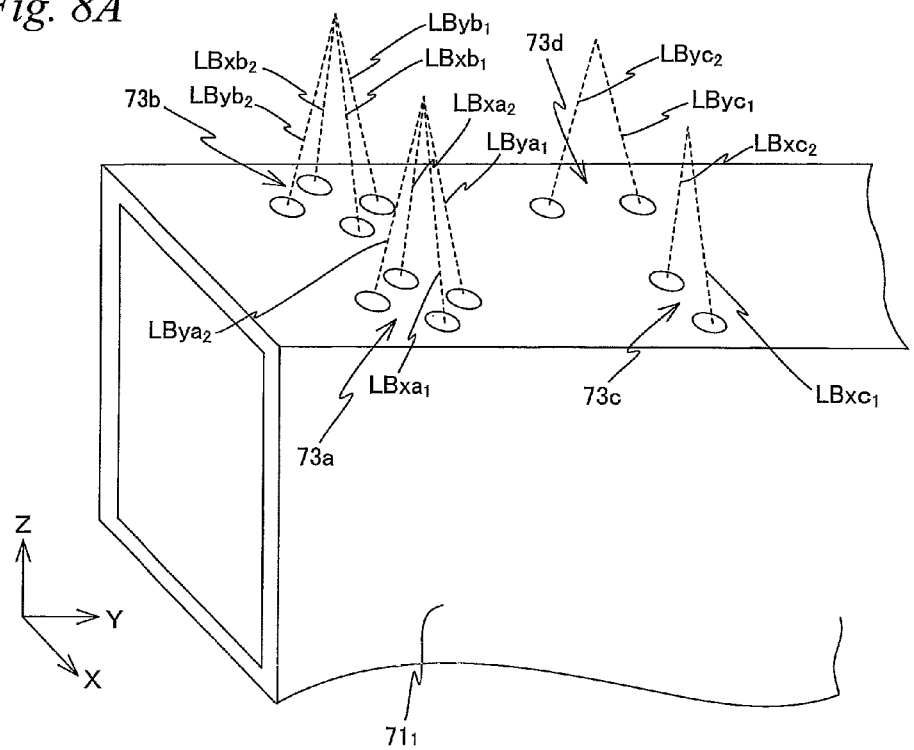
FIG. 8A is a perspective view showing the tip of a measurement arm of the second back side encoder system.
Figure 8B:
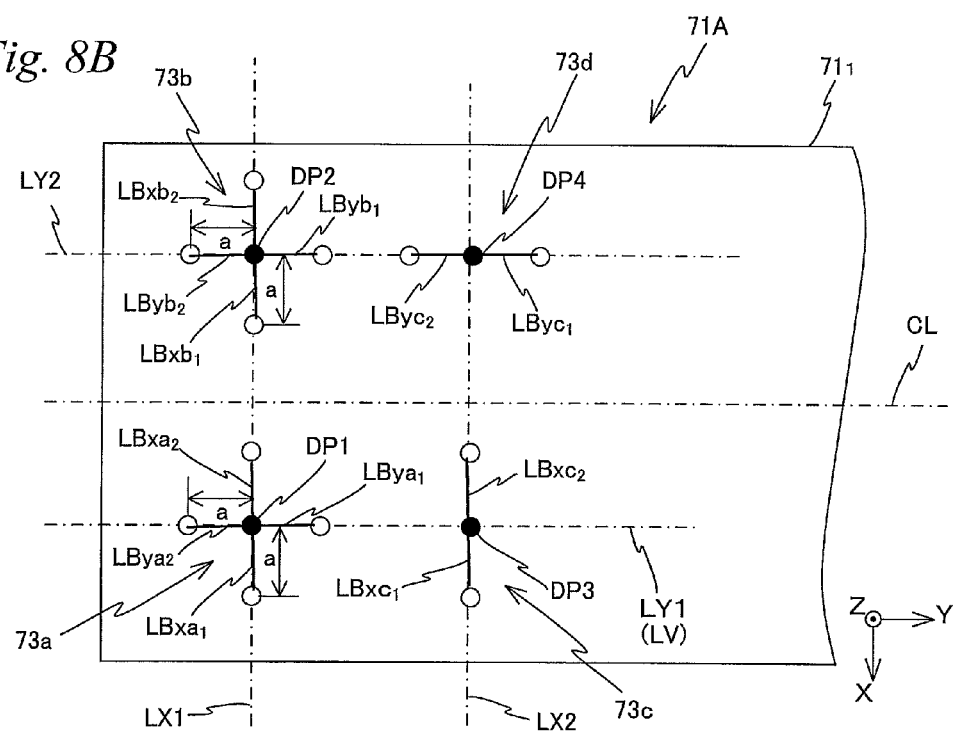
FIG. 8B is a planar view showing the tip of the measurement arm in FIG. 8A.

FIG. 8A shows a perspective view of the tip of arm member $71_1$, and FIG. 8B shows a planar view of the upper surface of the tip of arm member $71_1$ when viewed from the +Z direction. As shown in FIGS. 8A and 8B, the pair of three-dimensional heads 73a and 73b are placed at positions symmetrical to center line CL of arm member $71_1$. One of three-dimensional heads 73a irradiates measurement beams $LBxa_1$ and $LBxa_2$ (refer to FIG. 8A) on grating RG from two points (refer to the white circles in FIG. 8B) which are on a straight line LX1 parallel to the X-axis, at positions of an equal distance (referred to as a distance a) from a straight line LY1 parallel to the Y-axis that is a predetermined distance away from center line CL. Further, three-dimensional head 73a irradiates measurement beams $LBya_1$ and $LBya_2$ on grating RG from two points that are at positions on straight line LY1 and of distance a from straight line LX1. Measurement beams $LBxa_1$ and $LBxa_2$ are irradiated on the same irradiation point on grating RG, and further, measurement beams $LBya_1$ and $LBya_2$ are also irradiated on the irradiation point. In the present embodiment, the irradiation point of measurement beams $LBxa_1$ and $LBxa_2$ and measurement beams $LBya_1$ and $LBya_2$, or in other words, the detection point (refer to reference sign DP1 in FIG. 8B) of the three-dimensional head 73a coincides with the exposure position which is the center of irradiation area (exposure area) IA of illumination light IL irradiated on wafer W (refer to FIG. 1). Here, straight line LY1 coincides with reference axis LV previously described.

Three-dimensional head 73b irradiates measurement beams $LBxb_1$ and $LBxb_2$ on grating RG from two points (refer to the white circles in FIG. 8B) located on straight line LX1 at positions that are away from a straight line LY2 symmetrical to straight line LY1 regarding center line CL by distance a. Further, three-dimensional head 73b irradiates measurement beams $LByb_1$ and $LByb_2$ on grating RG from two points located on straight line LY2 at positions that are away from straight line LX1 by distance a. Measurement beams $LBxb_1$ and $LBxb_2$ are irradiated on the same irradiation point on grating RG, and further, measurement beams $LByb_1$ and $LByb_2$ are also irradiated on the irradiation point. The irradiation point of measurement beams $LBxb_1$ and $LBxb_2$ and measurement beams $LByb_1$ and $LByb_2$, that is to say, the detection point (refer to reference sign DP2 in FIG. 8B) of three-dimensional head 73b is a point a predetermined distance away to the −X side of the exposure position.

XZ head 73c is placed at a position a predetermined distance away to the +Y side of three-dimensional head 73a. XZ head 73c, as shown in FIG. 8B, irradiates measurement beams $LBxc_1$ and $LBxc_2$ each shown in broken lines in FIG. 8A on a common irradiation point on grating RG from two points (refer to the white circles in FIG. 8B) which are on a straight line LX2 that is parallel to the X-axis and is positioned a predetermined distance to the +Y side of straight line LX1, at positions that are each away from straight line LY1 by distance a. The irradiation point of measurement beams $LBxc_1$ and $LBxc_2$, that is to say, the detection point of XZ head 73c is shown as reference sign DP3 in FIG. 8B.

YZ head 73d is placed at a position a predetermined distance away to the +Y side of three-dimensional head 73b. YZ head 73d, as shown in FIG. 8B, irradiates measurement beams $LByc_1$ and $LByc_2$ each shown in broken lines in FIG. 8A on a common irradiation point on grating RG from two points (refer to the white circles in FIG. 8B) which are placed on straight line LY2, at positions that are away from straight line LX2 by distance a. The irradiation point of measurement beams $LByc_1$ and $LByc_2$, that is to say, the detection point of YZ head 73d is shown as reference sign DP4 in FIG. 8B.

In the first back side encoder system 70A, three-dimensional encoders 73a and 73b are structured by the pair of three-dimensional heads 73a and 73b, respectively, which measure the position of fine movement stage WFS in the X-axis, the Y-axis, and the Z-axis directions using the X diffraction grating and the Y diffraction grating of grating RG, XZ encoder 73c is structured by XZ head 73c which measures the position of fine movement stage WFS in the X-axis and the Z-axis directions using the X diffraction grating of grating RG, and YZ encoder 73d is structured by YZ head 73d which measures the position of fine movement stage WFS in the Y-axis and the Z-axis directions using the Y diffraction grating of grating RG.

The output of encoders 73a, 73b, 73c, and 73d of the first back side encoder system 70A is supplied to main controller 20 via switching section 150A to be described later on (refer to FIGS. 16, 17 and the like).

Now, measurement of the position of fine movement stage WFS in directions of six degrees of freedom using the first back side encoder system 70A and measurement of the difference of the XYZ grids that are performed by main controller 20 when the output of the first back side encoder system 70A is supplied to main controller 20, via switching section 150A, will be described, based on FIGS. 10A to 12B.

Figures 10A, 10B:
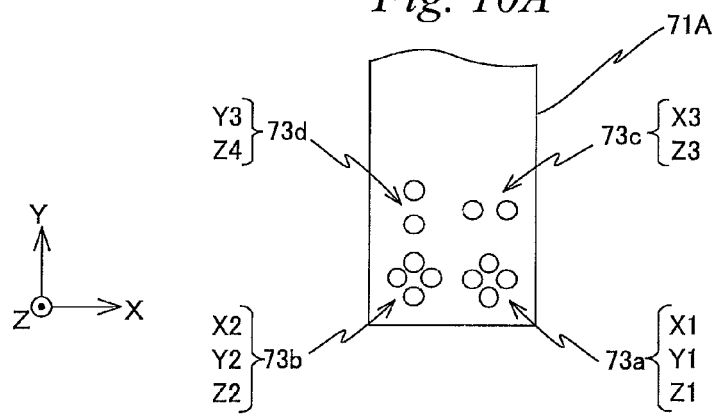
FIGS. 10A and 10B are views used to describe position measurement of fine movement stage WFS in directions of six degrees of freedom performed using the first back side encoder system 70A, and difference measurement of the XYZ grids.

Here, as a premise, as shown in FIG. 10A, measurement values of three-dimensional encoders 73a and 73b are to be (X1, Y1, Z1) and (X2, Y2, Z2), respectively, and measurement values of XZ encoder 73c are to be (X3, Z3), and measurement values of YZ encoder 73d are to be (Y3, Z4).

In the present embodiment, as an example, as shown blackened in FIG. 10B, X1, Y1, Y2, Z1, Z2, and Z3 are used for position measurement of fine movement stage WFS in directions of six degrees of freedom (in each of the X-axis, the Y-axis, the Z-axis, the θx, the θy, and the θz directions). To be specific, main controller 20 uses X1, Y1, and Z1 to calculate the position of fine movement stage WFS in the X-axis, the Y-axis, and the Z-axis directions, uses Y1 and Y2 to calculate the position of fine movement stage WFS in the θz direction, uses Z1 and Z2 to calculate the position of fine movement stage WFS in the θy direction, and uses Z1 and Z3 to calculate the position of fine movement stage WFS in the θx direction.

Here, in the present embodiment, because detection point DP1 of three-dimensional head 73a coincides with the exposure position, in order to measure the position of fine movement stage WFS in the X-axis, the Y-axis, and the Z-axis directions at detection points DP1, the position of fine movement stage WFS in the X-axis, the Y-axis, and the Z-axis directions is calculated using X1, Y1, and Z1. Accordingly, for example, in the case the exposure position coincides with a point in the center of detection points DP1 and DP2 of the pair of three-dimensional heads 73a and 73b, main controller 20 can obtain the position of fine movement stage WFS in the X-axis, the Y-axis, and the Z-axis directions, based on an average value of X1 and X2, an average value of Y1 and Y2, and an average value of Z1 and Z2.

Figure 11A:
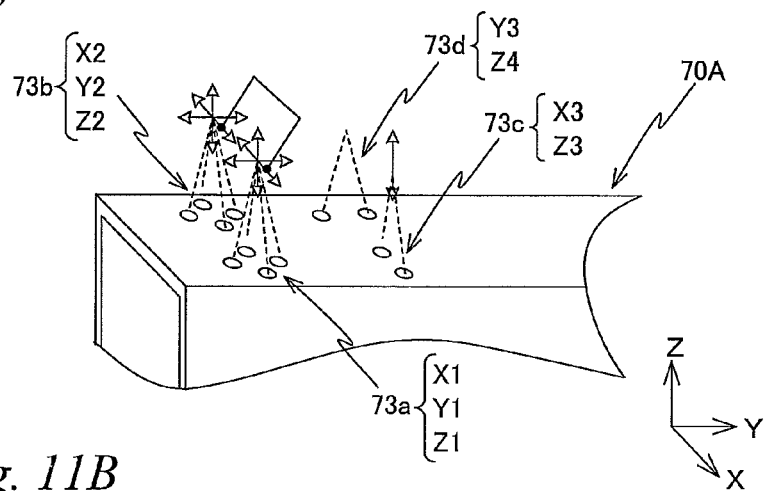
FIGS. 11A to 11C are views used to describe a situation where an ΔX map is obtained by difference measurement.
Figure 11B:
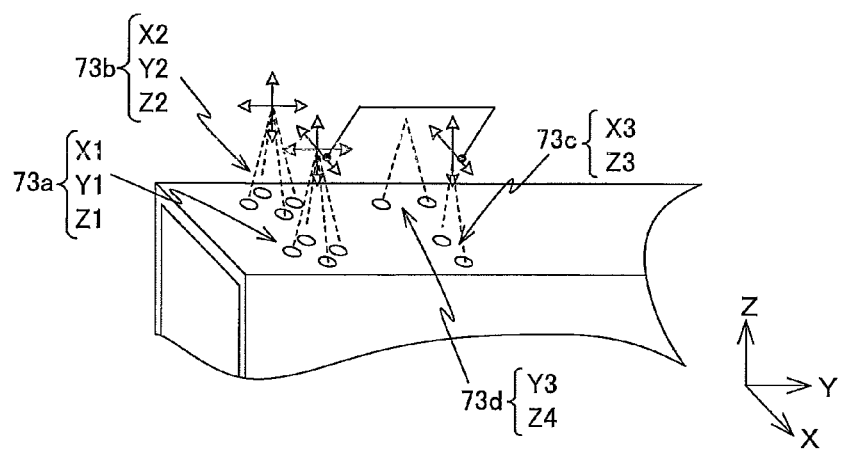
Figure 11C:
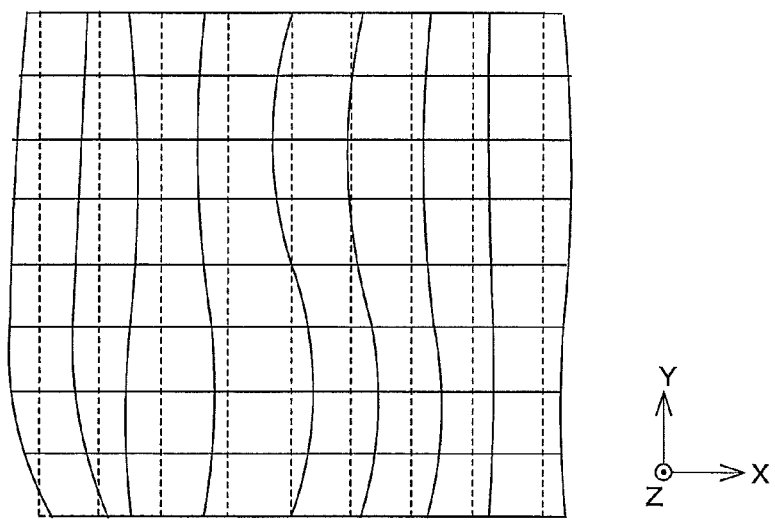

Further, concurrently with the position measurement of fine movement stage WFS in directions of six degrees of freedom described above, main controller 20 performs a difference measurement described below, and obtains X, Y, and Z grids (grid errors) of a coordinate system of the first back side encoder system 70A. That is, as shown in FIGS. 10B and 11A, main controller 20 obtains a deviation $\Delta X/\delta x$ corresponding to the X position of the X grid using X1 and X2, and as shown in FIGS. 10B and 11B, obtains a deviation $\Delta X/\delta y$ corresponding to the Y position of the X grid using X1 and X3. By this operation, a $\Delta X$ map as is shown in FIG. 11C can be obtained.

Figure 12A:
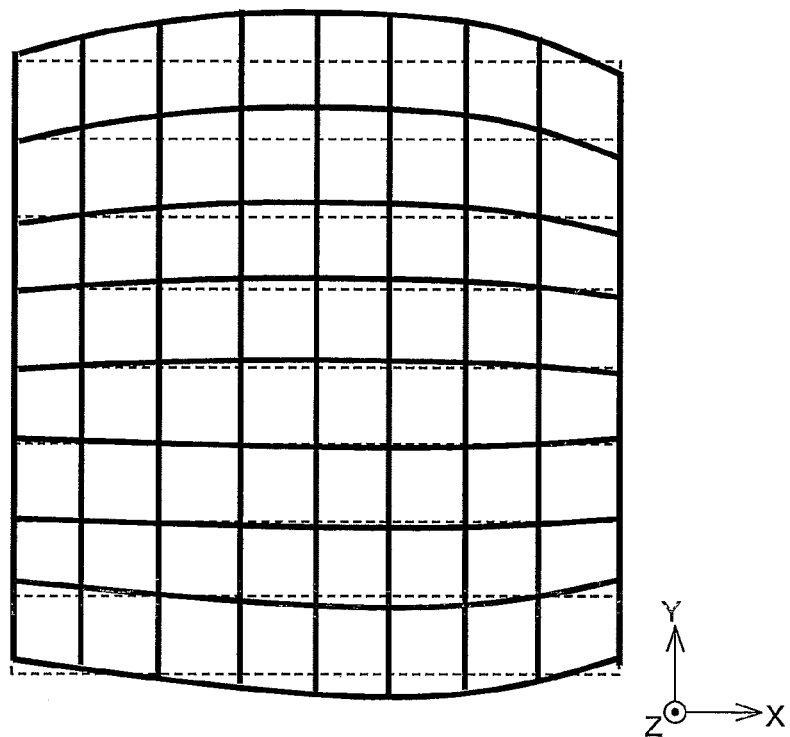
FIGS. 12A and 12B are examples of a ΔY map and a ΔZ map, respectively.
Figure 12B:
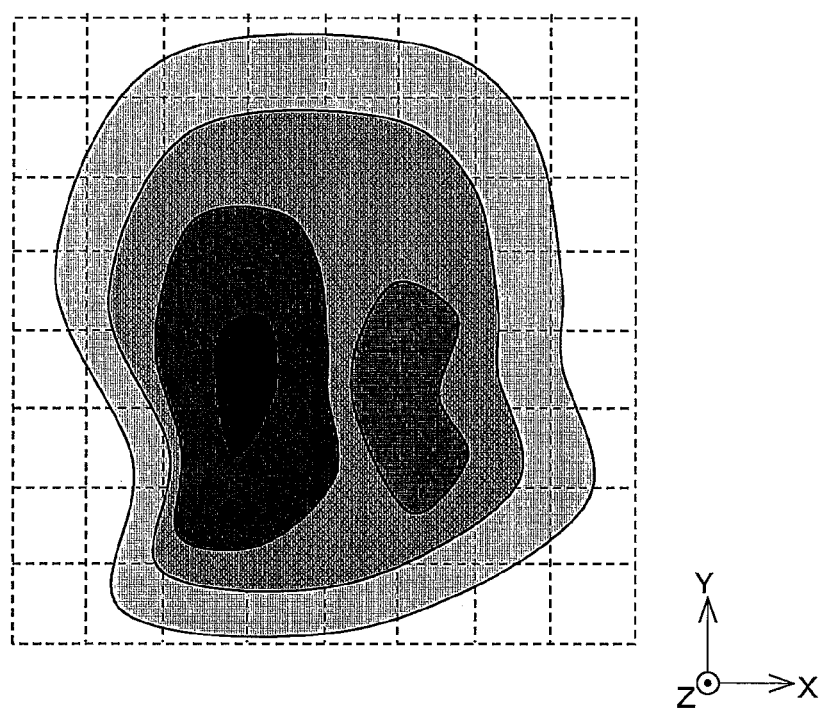

Similarly, as shown in FIG. 10B, main controller 20 obtains a deviation $\Delta Y/\delta y$ corresponding to the Y position of the Y grid using Y2 and Y3, obtains a deviation $\Delta Z/\delta x$ corresponding to the X position of the Z grid using Z3 and Z4, and obtains a deviation $\Delta Z/\delta y$ corresponding to the Y position of the Z grid using Z2 and Z4. Further, while main controller 20 obtains a deviation $\Delta Y/\delta x$ corresponding to the X position of the Y grid using Y1 and Y2, in this operation, the position of fine movement stage WFS in the θz direction is calculated using X1 and X3. By this operation, a $\Delta Y$ map and a $\Delta Z$ map as is shown in FIGS. 12A and 12B, respectively, can be obtained.

Concurrently with the position measurement of fine movement stage WFS in directions of six degrees of freedom described above, main controller 20, at a predetermined sampling interval, repeatedly performs the difference measurement described above, and performs an update of grid errors of the coordinate system of the first back side encoder system 70A. Hereinafter, this update of grid errors will be called, refreshing the coordinate system of the first back side encoder system 70A.

Accordingly, in the present embodiment, by using the first back side encoder system 70A, main controller 20 can constantly perform measurement of position information of fine movement stage WFS within the XY-plane directly below the exposure position (the rear surface side of fine movement stage WFS) when transferring the pattern of reticle R onto a plurality of shot areas of wafer W mounted on fine movement stage WFS.

In this case, with heads 73a to 73d described above, because the optical paths of the measurement beams in the air are extremely short and are substantially equal, the influence of air fluctuation can be practically ignored. Accordingly, position information of fine movement stage WFS in directions of six degrees of freedom can be measured with high precision by the first back side encoder system 70A. Further, because the substantial detection points on the grating in the X-axis, the Y-axis, and the Z-axis directions according to the first back side encoder system 70A each coincide with the center (exposure position) of exposure area IA, generation of the so-called Abbe error can be suppressed to a level that can be practically ignored. Accordingly, by using the first back side encoder system 70A, main controller 20 can measure the position of fine movement stage WFS in the X-axis direction, the Y-axis direction, and the Z-axis direction with high precision, without any Abbe errors. Incidentally, while the first back side encoder system 70A can be made only to measure position information in directions of six degrees of freedom of wafer table WTB (or wafer stage WST), the first back side encoder system 70A can preferably be made to measure position information of wafer table WTB (or wafer stage WST) using at least another measurement beam other than the plurality of measurement beams necessary for measurement of position information in directions of six degrees of freedom, as in the present embodiment.

Next, a structure and the like of the first top side encoder system 80A structuring a part of the first fine movement stage position measurement system 110A will be described. The first top side encoder system 80A can measure position information of fine movement stage WFS in directions of six degrees of freedom concurrently with the first back side encoder system 70A.

In exposure apparatus 100, as shown in FIG. 4, a pair of head sections 62A and 62C are placed on the +X side and the −X side of projection unit PU (nozzle unit 32), respectively. Head sections 62A and 62C to be described later on, each include a plurality of heads, and these heads are fixed to main frame BD (not shown in FIG. 4, refer to FIG. 1 and the like) in a suspended state, via a support member.

Head sections 62A and 62C, as shown in FIG. 4, are equipped with four-spindle heads $65_1$ to $65_4$ and four-spindle heads $64_1$ to $64_4$, each having four heads. Inside the respective housings of four-spindle heads $65_1$ to $65_4$, as shown in FIG. 5, XZ heads $65X_1$ to $65X_4$ whose measurement directions are in the X-axis and the Z-axis directions, and YZ heads $65Y_1$ to $65Y_4$ whose measurement directions are in the Y-axis and the Z-axis directions are housed. Similarly, inside the respective housings of four-spindle heads $64_1$ to $64_4$, XZ heads $64X_1$ to $64X_4$ and YZ heads $64Y_1$ to $64Y_4$ are housed. As each of the XZ heads $65X_1$ to $65X_4$ and $64X_1$ to $64X_4$, and YZ heads $65Y_1$ to $65Y_4$ and $64Y_1$ to $64Y_4$, an encoder head having a structure similar to the displacement measurement sensor head disclosed in, for example, U.S. Pat. No. 7,561,280, can be used.

XZ heads $65X_1$ to $65X_4$ and $64X_1$ to $64X_4$ (to be more precise, irradiation points on scales $39_1$ and $39_2$ of the measurement beams generated by XZ heads $65X_1$ to $65X_4$ and $64X_1$ to $64X_4$) are placed on a straight line (hereinafter called a reference axis) LH which passes through optical axis AX (in the present embodiment, also coinciding with the center of exposure area IA previously described) of projection optical system PL and is also parallel to the X-axis, at a predetermined interval WD. Further, YZ heads $65Y_1$ to $65Y_4$ and $64Y_1$ to $64Y_4$ (to be more precise, irradiation points on scales $39_1$ and $39_2$ of the measurement beams generated by YZ heads $65Y_1$ to $65Y_4$ and $64Y_1$ to $64Y_4$) are placed on a straight line $LH_1$ which is parallel to reference axis LH and is also a predetermined distance away from reference axis LH to the −Y side, at the same X positions corresponding to XZ heads $65X_1$ to $65X_4$ and $64X_1$ to $64X_4$. Hereinafter, XZ heads $65X_1$ to $65X_4$ and $64X_1$ to $64X_4$, and YZ heads $65Y_1$ to $65Y_4$ and $64Y_1$ to $64Y_4$ will also be expressed as XZ heads 65X and 64X, and YZ heads 65Y and 64Y, respectively, as necessary. Incidentally, reference axis LH coincides with straight line LX1 previously described.

Head sections 62A and 62C use scales $39_1$ and $39_2$, respectively, to structure a multiple-lens (four-lens in this case) XZ linear encoder which measures the position in the X-axis direction (X position) and the position in the Z-axis direction (Z position) of wafer table WTB, and to structure a multiple-lens (four-lens in this case) YZ linear encoder which measures the position in the Y-axis direction (Y position) and the Z position. Hereinafter, for the sake of convenience, these encoders will be expressed as XZ linear encoders 65X and 64X, and YZ linear encoders 65Y and 64Y (refer to FIG. 17), using the same reference signs as XZ heads 65X and 64X, and YZ heads 65Y and 64Y, respectively.

In the present embodiment, XZ linear encoder 65X and YZ linear encoder 65Y structure (refer to FIG. 17) a multiple-lens (four-lens in this case) four-spindle encoder 65 which measures position information related to each of the X-axis, the Y-axis, the Z-axis, and the θx directions of wafer table WTB. Similarly, XZ linear encoder 64X and YZ linear encoder 64Y structure (refer to FIG. 17) a multiple-lens (four-lens in this case) four-spindle encoder 64 which measures position information related to each of the X-axis, the Y-axis, the Z-axis, and the θx directions of wafer table WTB.

Here, interval WD in the X-axis direction of the four XZ heads 65X and 64X (to be more precise, irradiation points on scales $39_1$ and $39_2$ of the measurement beams generated by XZ heads 65X and 64X) and the four YZ heads 65Y and 64Y (to be more precise, irradiation points on the scales of the measurement beams generated by YZ heads 65Y and 64Y) that head sections 62A and 62C are equipped with, respectively, is set narrower than the width of scales $39_1$ and $39_2$ in the X-axis direction. Accordingly, on exposure and the like, at least one head each of each of the four XZ heads 65X and 64X and YZ heads 65Y and 64Y constantly faces (irradiates the measurement beam on) the corresponding scales $39_1$ and $39_2$. Here, the width of the scale refers to the width of the diffraction grating (or the area formed), or to be more precise, a range where position measurement using the head is possible.

Accordingly, four-spindle encoder 65 and four-spindle encoder 64 structure the first top side encoder system 80A which measures position information in directions of six degrees of freedom of fine movement stage WFS supported by coarse movement stage WCS, in the case wafer stage WST is at exposure station 200.

Measurement values of each encoder structuring the first top side encoder system 80A are supplied to main controller 20, via switching section 150A (refer to FIGS. 16, 17 and the like).

Further, although it is omitted in the drawings, when main controller 20 drives wafer stage WST in the X-axis direction, main controller 20 sequentially switches XZ heads 65X and 64X and YZ heads 65Y and 64Y which measure position information of wafer table WTB to adjacent XZ heads 65X and 64X and YZ heads 65Y and 64Y. That is, in order to smoothly perform this switching (joint) of such XZ heads and YZ heads, as previously described, interval WD of adjacent XZ heads and YZ heads included in head sections 62A and 62C is set smaller than the width of scales $39_1$ and $39_2$ in the X-axis direction.

As it can be seen from the description so far, in the present embodiment, in the case wafer stage WST is located at exposure station 200, position information in directions of six degrees of freedom of fine movement stage WFS supported by coarse movement stage WCS can be measured concurrently using the first back side encoder system 70A and the first top side encoder system 80A.

However, the first top side encoder system 80A and the first back side encoder system 70A each have the following merits and demerits.

While the first top side encoder system 80A has a demerit of having a disadvantage infrequency characteristic because a variation in a static component (including a component in an extremely low frequency band) of the measurement signal is large due to a long-term variation such as deformation of plate 28 and drift and the like of heads 65X, 64X, 65Y, and 64Y, and a place of wafer table WTB having a low rigidity and a large amplitude is observed, on the contrary, influence by vibration of the body is small, and the encoder system has a merit of keeping measurement deception small except for the extremely low frequency band.

Meanwhile, while the first back side encoder system 70A has a merit of having an advantage in frequency characteristic because there is little long-term variation such as deformation of grating RG and drift and the like of heads 73a to 73d, reliability in a static component of the measurement signal is high and also a high rigidity portion of fine movement stage WFS is observed in the high frequency band, because measurement arm 71A (arm member $71_1$) is structured supported in a cantilevered state and the length of the arm is 500 mm or more, the encoder system has a demerit of being significantly influenced by a background vibration (vibration of body) in a band of around 100 Hz to 400 Hz.

Figure 13A:
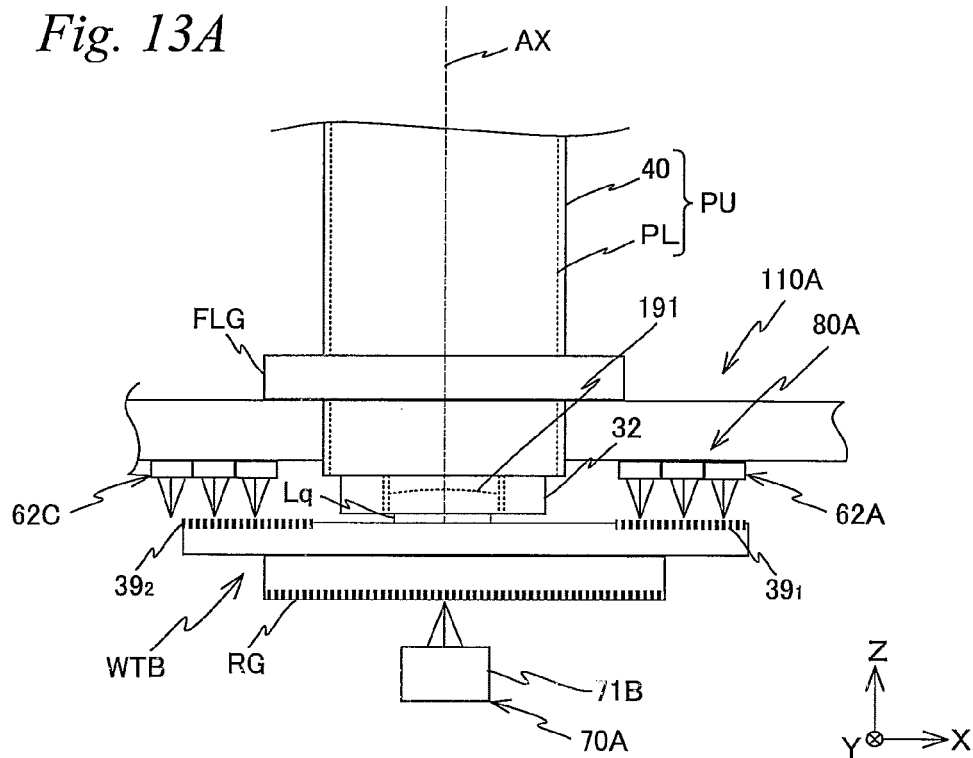
FIG. 13A is a view showing a situation of a position measurement processing of wafer table WTB, performed concurrently by the first top side encoder system and the first back side encoder system.

Therefore, in the present embodiment, when wafer stage WST is positioned at exposure station 200 including the time of exposure to be described later on, as shown in FIG. 13A, for example, the first back side encoder system 70A and the first top side encoder system 80A concurrently perform measurement of position information of fine movement stage WFS (wafer table WTB), so that position control of wafer table WTB is performed based on the position information having higher reliability. Therefore, the first back side encoder system 70A and the first top side encoder system 80A are connected to main controller 20 via switching section 150A (refer to FIGS. 16, 17 and the like).

Figure 18:
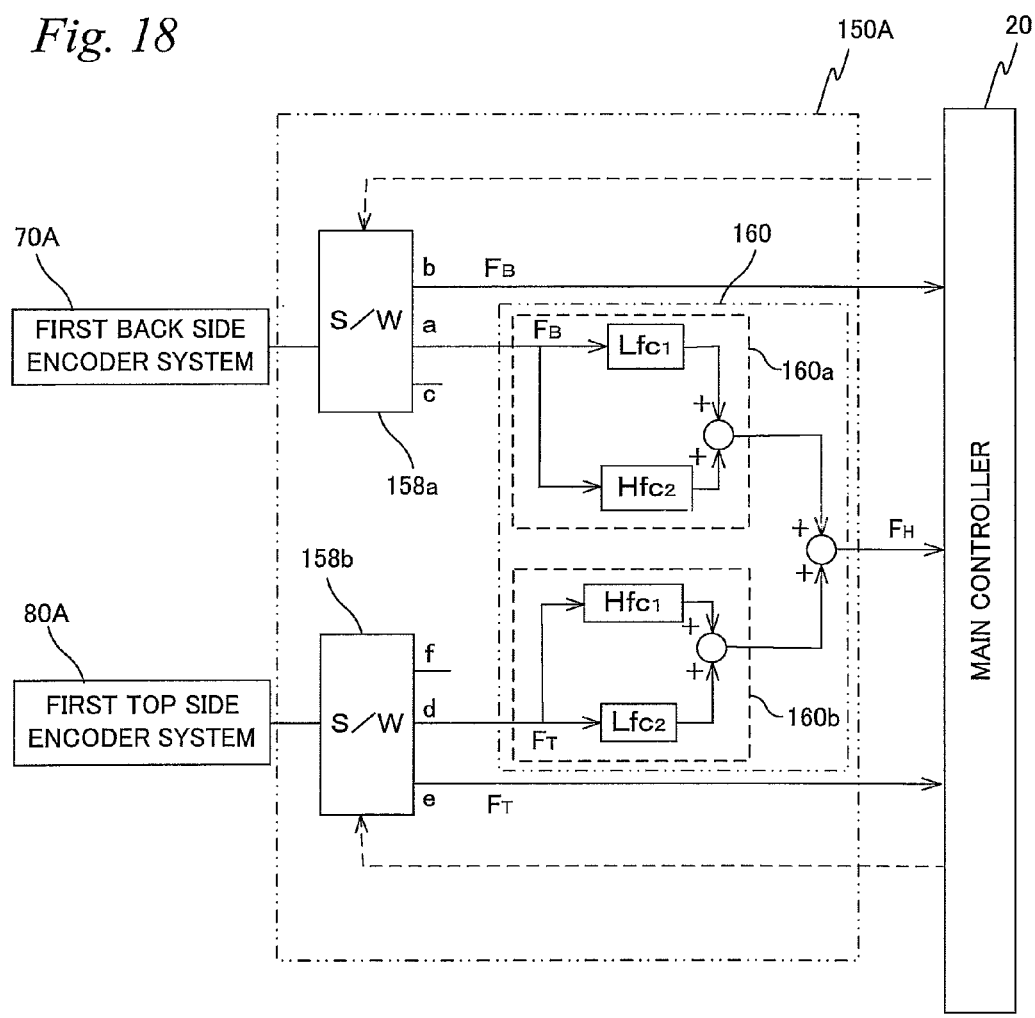
FIG. 18 is a block diagram showing an example of a structure of a switching section 150A in FIG. 16.

FIG. 18 shows an example of a concrete structure of switching section 150A. Switching section 150A is equipped with two selector switch sections 158a and 158b, and a hybrid filter section 160 where an output signal $F_B$ of the first back side encoder system 70A is input via one output terminal a of selector switch section 158a and an output signal $F_T$ of the first top side encoder system 80A is input via one output terminal d of selector switch section 158b, and a hybrid position signal $F_H$ is output to main controller 20.

Selector switch section 158a has an input terminal (not shown) connected to the first back side encoder system 70A and three output terminals a, b, and c, and performs switching and connecting between the input terminal and one of the three output terminals a, b, and c. In this case, output terminal b is connected to main controller 20, and output terminal c is a terminal which is not connected anywhere (hereinafter referred to as an open terminal).

Selector switch section 158b has an input terminal (not shown) connected to the first top side encoder system 80A and three output terminals d, e, and f, and performs switching and connecting between the input terminal and one of the three output terminals d, e, and f. In this case, output terminal e is connected to main controller 20, and output terminal f is an open terminal.

The switching in selector switch sections 158a and 158b is performed by the input of a switching signal (or a selecting signal) shown by a broken line in FIG. 18 from main controller 20. Main controller 20 inputs the switching signal (or the selecting signal) to selector switch sections 158a and 158b, according to a predetermined processing algorithm, or from instructions from the outside.

In the present embodiment, switching section 150A is selectively set to the following four states by main controller 20.

Switching section 150A is set to a first state where the input terminal of selector switch section 158a is connected to output terminal a, and the input terminal of selector switch section 158b is connected to output terminal d, respectively. In this first state, as it will be described later on, switching section 150A outputs hybrid position signal $F_H$ to main controller 20.

Switching section 150A is set to a second state where the input terminal of selector switch section 158a is connected to output terminal b, and the input terminal of selector switch section 158b is connected to output terminal e, respectively. In this second state, switching section 150A outputs output signal $F_B$ of the first back side encoder system 70A, and output signal $F_T$ of the first top side encoder system 80A to main controller 20.

Switching section 150A is set to a third state where the input terminal of selector switch section 158a is connected to output terminal b, and the input terminal of selector switch section 158b is connected to an open terminal f, respectively. In this third state, switching section 150A outputs only output signal $F_B$ of the first back side encoder system 70A to main controller 20.

Switching section 150A is set to a fourth state where the input terminal of selector switch section 158a is connected to open terminal c, and the input terminal of selector switch section 158b is connected to output terminal e, respectively. In this fourth state, switching section 150A outputs only output signal $F_T$ of the first top side encoder system 80A to main controller 20.

Hereinafter, for the sake of convenience, the first, the second, the third, and the fourth states will be called the first, the second, the third, and the fourth modes of switching section 150A. That is, switching section 150A is a mode setting section which selectively sets the four modes of the output to main controller 20.

When switching section 150A is set to the first mode described above, with output signal $F_B$ of the first back side encoder system 70A and output signal $F_T$ of the first top side encoder system 80A serving as the inputs, hybrid filter section 160 outputs hybrid position signal $F_H$ used for position control of fine movement stage WFS to main controller 20.

Hybrid filter section 160 is equipped with a first filter section 160a, which has a low pass filter $Lfc_1$ whose cutoff frequency is $fc_1$ and a high pass filter $Hfc_2$ whose cutoff frequency is $fc_2$ ($>fc_1$) to which output signal $F_B$ of the first back side encoder system 70A is input, and outputs an addition signal of signals that have passed through each of the two filters $Lfc_1$ and $Hfc_2$, and a second filter section 160b, which has a high pass filter $Hfc_1$ whose cutoff frequency is $fc_1$ and a low pass filter $Lfc_2$ whose cutoff frequency is $fc_2$ to which output signal $F_T$ of the first top side encoder system 80A is input, and outputs an addition signal of signals that have passed through each of the two filters $Hfc_1$ and $Lfc_2$. Hybrid filter section 160 outputs an addition signal of the output of the first filter section 160a and the output of the second filter section 160b as hybrid position signal $F_H$, to main controller 20.

Here, cutoff frequency $fc_1$ is set, for example, to a frequency slightly lower than the lower limit frequency 100 Hz of a frequency band 100 Hz to 400 Hz of the background vibration which affects the first back side encoder system 70A, such as, for example, to 50 Hz. Further, cutoff frequency $fc_2$ is set, for example, to a frequency slightly higher than the upper limit frequency 400 Hz of the frequency band 100 Hz to 400 Hz of the background vibration which affects the first back side encoder system 70A, such as, for example, to 500 Hz.

Figure 13B:
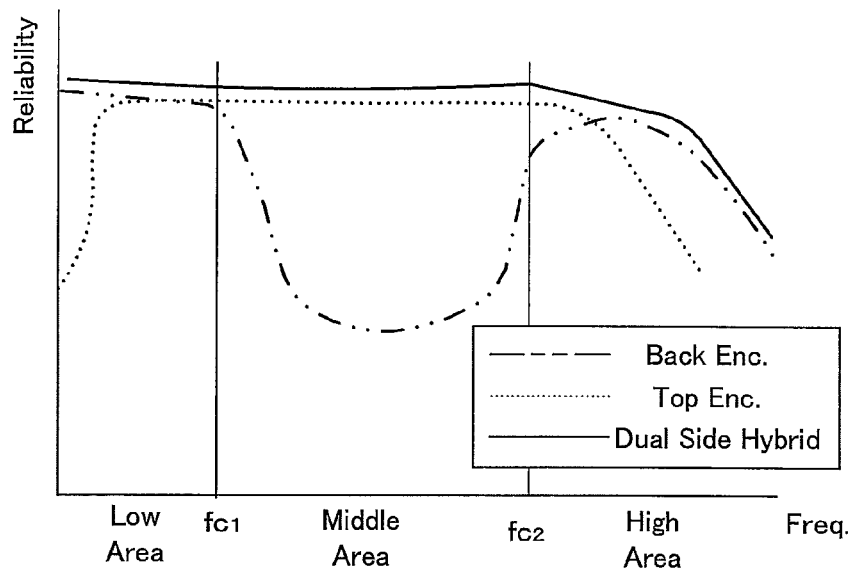
FIG. 13B is a view showing an example of a hybrid position signal which can be obtained by the position measurement described above when a switching section is set to a first mode.

In the case of setting the cutoff frequencies $fc_1$ and $fc_2$ in the manner described above, from hybrid filter section 160, as shown by a solid line in FIG. 13B, in the low-frequency area lower than 50 Hz, the output signal (measurement results of the position) of the first back side encoder system 70A, in a midfrequency band higher than 50 Hz and lower than 500 Hz, the output signal (measurement results of the position) of the first top side encoder system 80A, and in a high-frequency area higher than 500 Hz, the output signal (measurement results of the position) of the first back side encoder system 70A, are each output as hybrid position signal $F_H$.

By such setting, in the low-frequency area where reliability of measurement values decreases due to the first top side encoder system 80A being affected by plate deformation and head drift, measurement values of the first back side encoder system 70A which is not affected by such issues and has high reliability, in the midfrequency area where reliability of measurement values decreases due to the first back side encoder system 70A being affected by background vibration, measurement values of the first top side encoder system 80A which is hardly affected by such vibration and has high reliability, and in a high-frequency area where there is a demerit in frequency characteristic because the first top side encoder system 80A observes a place of wafer table WTB whose rigidity is low and amplitude is high, measurement values of the first back side encoder system 70A having an advantage in frequency characteristic, are each output to main controller 20 as measurement results of a position of wafer table WTB within the XY-plane. Accordingly, main controller 20 can drive (control the position of) fine movement stage WFS when wafer stage WST is at exposure station 200, constantly based on position measurement values of wafer table WTB having high reliability.

As is described, in the present embodiment, when switching section 150A is set to the first mode, position control of wafer table WTB is performed by switching the measurement information (measurement signal) of the first back side encoder system 70A and the first top side encoder system 80A depending on the frequency band, so that as a consequence, position control is performed based on the measurement information with a higher reliability. Incidentally, for example, in the case the first top side encoder system 80A does not cause a disadvantage in frequency characteristic in the high-frequency area, cutoff frequency $fc_2$ does not have to be set. In this case, only a filter circuit section has to be provided which synthesizes a hybrid position signal of the output signals of the first back side encoder system 70A and the first top side encoder system 80A, using the high pass filter and the low pass filter of cutoff frequency $fc_1$.

Further, switching section 150A is set, for example, to the third mode or to the fourth mode in the case when reliability of the measurement information of the first back side encoder system 70A is obviously higher, or in the case when reliability of the measurement information of the first top side encoder system 80A is higher.

Further, switching section 150A is set to the second mode in the case when both of the measurement information of the first back side encoder system 70A and the measurement information of the first top side encoder system 80A have to be taken in.

Meanwhile, as described above, in the present embodiment, when switching section 150A is set to the first mode, because drive (position control) of fine movement stage WFS is performed based on the measurement values of the first top side encoder system 80A in the midfrequency area, it is preferable that an update of a coordinate system set by a two-dimensional grating of the pair of scales $39_1$ and $39_2$ be performed, that is, an update (hereinafter called refreshing the coordinate system of the first top side encoder system 80A) of the grid (grid error) of the pair of scales $39_1$ and $39_2$ be performed.

Therefore, when wafer stage WST is at exposure station 200 such as, for example, during exposure, main controller 20 performs refreshing the coordinate system of the first top side encoder system 80A in the manner described below.

Figure 14A:
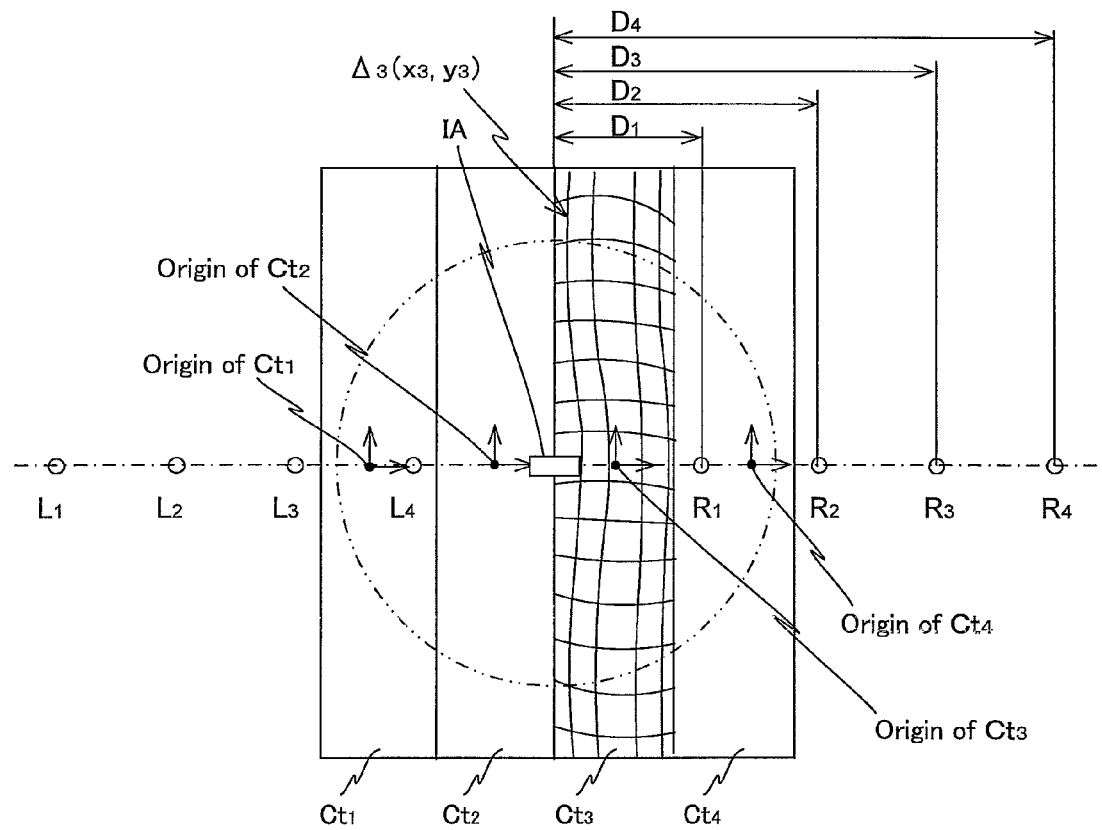
FIGS. 14A and 14B are views to describe refreshing of a coordinate system of the first top side encoder system.

The relation between the coordinate system of the first back side encoder system 70A and the plurality of four-spindle heads $65_1$ to $65_4$ and $64_1$ to $64_4$ of the first top side encoder system 80A in the present embodiment can be expressed as shown in FIG. 14A. Here, $R_1$, $R_2$, $R_3$, and $R_4$ are equivalent to four-spindle heads $65_1$, $65_2$, $65_3$, and $65_4$, respectively, and $L_1$, $L_2$, $L_3$, and $L_4$ are equivalent to four-spindle heads $64_1$, $64_2$, $64_3$, and $64_4$, respectively.

Reference sign $Ct_i$ (i=1, 2, 3, 4) denotes the coordinate system of the first back side encoder system 70A suspended by $L_i$ and $R_i$, that is, denotes a partial coordinate system corresponding to an area on two-dimensional grating RG observed by three-dimensional encoder 73a directly below the exposure position of the first back side encoder system 70A when $R_i$ and $L_i$ observe scales $39_1$ and $39_2$, respectively. The distance from the center of a whole coordinate system of the first back side encoder system 70A to $R_1$, $R_2$, $R_3$, and $R_4$ is expressed as $D_1$, $D_2$, $D_3$, and $D_4$, respectively, and when $D_i+D_{(5-i)}=W$, then grid distortion $\Delta_i(x_i, y_i)$ of $Ct_i$ can be expressed as in formula (1) below. Here, A is a three-dimensional vector that has x, y, and z components.

$$\Delta_i(x_i,y_i)=1/W \cdot \{D_i\Delta L(x_i,y_i)+D_{(5-i)}\Delta R(x_i,y_i)\} \quad (1)$$

When $(x_i,y_i)$ in formula (1) is generalized and deformed to (x,y), the following formula (1)' can be obtained.

$$W\Delta_i(x,y)=D_i\Delta_L(x,y)+D_{(5-i)}\Delta_R(x,y) \quad (1)'$$

When substituting 1, 2, 3, 4 into i of formula (1)', the following formulas (2) to (5) can be obtained.

$$W\Delta_1(x,y)=D_1\Delta_L(x,y)+D_4\Delta_R(x,y) \quad (2)$$

$$W\Delta_2(x,y)=D_2\Delta_L(x,y)+D_3\Delta_R(x,y) \quad (3)$$

$$W\Delta_3(x,y)=D_3\Delta_L(x,y)+D_2\Delta_R(x,y) \quad (4)$$

$$W\Delta_4(x,y)=D_4\Delta_L(x,y)+D_1\Delta_R(x,y) \quad (5)$$

From the sum and difference of formulas (2) and (5), two formulas are obtained, and by solving the two formulas, the following two formulas can be obtained.

$$\Delta_L(x,y)=W\Delta_1(x,y)/D_1$$

$$\Delta_R(x,y)=W\Delta_4(x,y)/D_4$$

Similarly, from the sum and difference of formulas (3) and (4), two formulas are obtained, and by solving the two formulas, the following two formulas can be obtained.

$$\Delta_L(x,y)=W\Delta_2(x,y)/D_2$$

$$\Delta_R(x,y)=W\Delta_3(x,y)/D_3$$

Figure 14B:
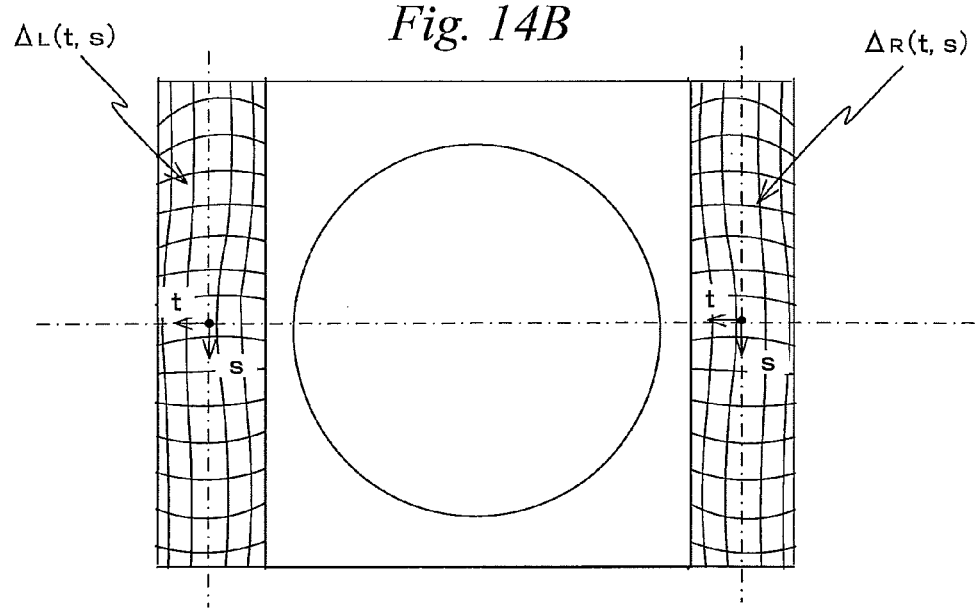

Accordingly, it can be seen that from grid distortion $\Delta_i(x_i, y_i)$ of $Ct_i$, grid distortion $\Delta_L(t,s)$, $\Delta_R(t,s)$ of scales $39_2$ and $39_1$ as shown in FIG. 14B can be obtained.

Main controller 20 obtains and updates grid distortion $\Delta_L(t,s)$, $\Delta_R(t,s)$ of scales $39_2$ and $39_1$ according to the principle described above at least once, for example, during exposure of each wafer at a predetermined interval. That is, by comparing and adjusting the grid of the scale of the first top side encoder system 80A to the coordinate system of the first back side encoder system 70A whose grid has been updated, the grid is updated. That is, refreshing the coordinate system of the first top side encoder system 80A is performed in the manner described above.

However, on refreshing the coordinate system of the first top side encoder system 80A, main controller 20 does not perform the comparing and adjusting and the update described above regarding offset of the coordinate system in directions of six degrees of freedom (in each of the X-axis, the Y-axis, the Z-axis, the θx, the θy and the θz directions), and stores the information without any changes. The reason for this is because the coordinate system of back side encoder system 70A does not have long-term stability in directions of six degrees of freedom, and the top side encoder system 80A coordinate system is more reliable, due to reasons such as measurement arm 71A lacking in mechanical long-term stability, and further, for example, the interval between the detection points of the plurality of heads used for position measurement in the θx, θy, and θz directions is small. Accordingly, the refreshing processing described above is performed after removing the offset in directions of six degrees of freedom described above from the back/top difference. The offset component in the six degrees of freedom described above will be used in a post stream processing which will be described later on.

Next, a structure of the second fine movement stage position measurement system 110B (refer to FIG. 16) used for measuring position information of fine movement stage WFS, which is movably held by coarse movement stage WCS located at measurement station 300, will be described.

The second back side encoder system 70B of the second fine movement stage position measurement system 110B is equipped with measurement arm 71B (refer to FIG. 1) which is inserted within a space provided inside coarse movement stage WCS, in a state where wafer stage WST is placed below alignment device 99 (alignment systems AL1, and AL2$_1$ to AL2$_4$).

Figure 9A:
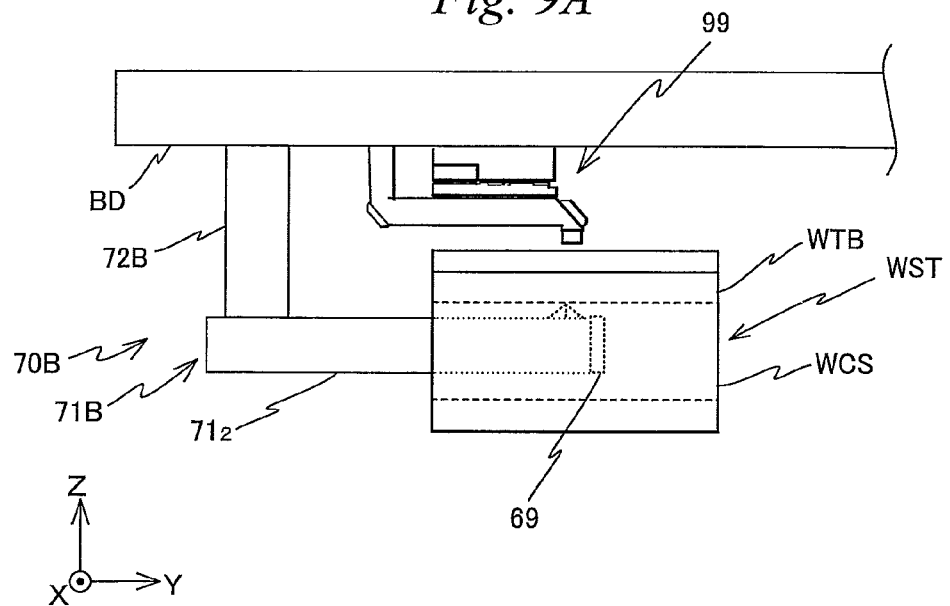
FIG. 9A is a view used to describe a schematic structure of the first back side encoder system in FIG. 1.

Measurement arm 71B, as shown in FIG. 9A, has an arm member 71$_2$ which is supported by main frame BD via support member 72B in a cantilevered state, and an encoder head (optical system) which will be described later on housed inside arm member 71$_2$. In measurement arm 71B, while the length of arm member 71$_2$ is longer than arm member 71$_1$ previously described, as a whole, measurement arm 71B is structured roughly symmetrical to measurement arm 71A previously described.

As previously described, in the state where wafer stage WST is placed below alignment device 99 (alignment systems AL1, and AL2$_1$ to AL2$_4$), as shown in FIG. 9A, the tip of arm member 71$_2$ of measurement arm 71B is inserted into the space of coarse movement stage WCS, and its upper surface faces grating RG (not shown in FIGS. 1 and 7, refer to FIG. 2B and the like) provided on the lower surface of fine movement stage WFS (wafer table WTB) (to be more precise, the lower surface of main section 81). The upper surface of arm member $71_2$ is placed almost parallel to the fine movement stage WFS lower surface, in a state where a predetermined clearance gap (clearance, gap), such as for example, a gap or around several mm, is formed with the lower surface of fine movement stage WFS.

The second back side encoder system 70B, as shown in FIG. 17, includes a pair of three-dimensional encoders 75a and 75b which each measures the position of fine movement stage WFS in the X-axis, the Y-axis, and the Z-axis directions, an XZ encoder 75c which measures a position of fine movement stage WFS in the X-axis and the Z-axis directions, and a YZ encoder 75d which measures a position of fine movement stage WFS in the Y-axis and the Z-axis directions, similar to the first back side encoder system 70A previously described.

XZ encoder 75c and YZ encoder 75d are equipped, respectively, with a two-dimensional head whose measurement direction is in the X-axis and the Z-axis direction, and a two-dimensional head whose measurement direction is in the Y-axis and the Z-axis direction, housed respectively inside of arm member $71_2$. Hereinafter, for the sake of convenience, the two-dimensional heads that XZ encoder 75c and YZ encoder 75d each are equipped with will be expressed as XZ head 75c and YZ head 75d, using the same reference signs as each of the encoders. Three-dimensional encoders 75a and 75b are equipped with a three-dimensional head whose measurement direction is in the X-axis, Y-axis, and Z-axis directions. Hereinafter, for the sake of convenience, the three-dimensional heads that three-dimensional encoders 75a and 75b each are equipped with will be expressed as three-dimensional heads 75a and 75b, using the same reference signs as each of the encoders. As two-dimensional heads 75c and 75d, and three-dimensional heads 75a and 75b, heads having a structure similar to two-dimensional heads 73c and 73d, and three-dimensional heads 73a and 73b previously described can be used.

Figure 9B:
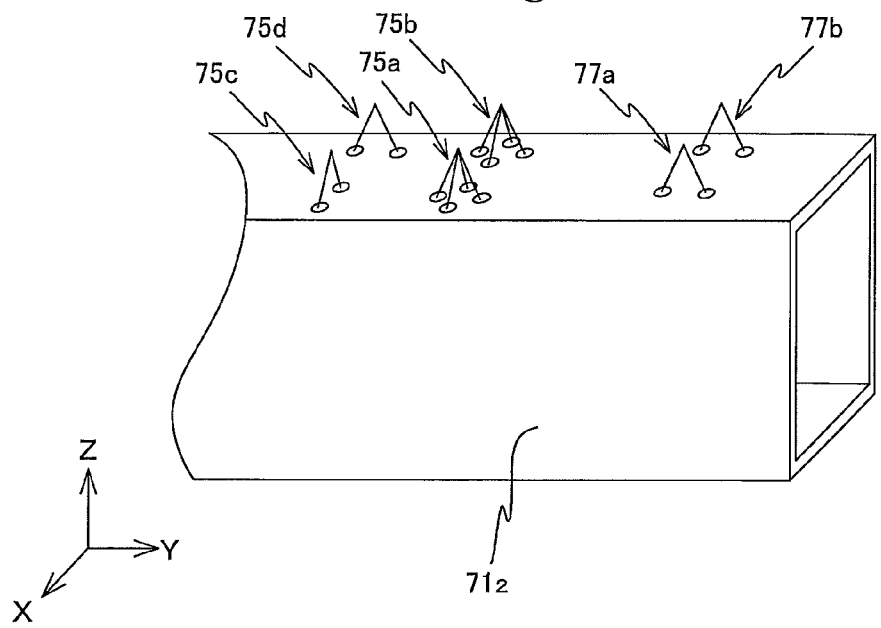
FIG. 9B is a perspective view showing the tip of a measurement arm of a second back side encoder system.

FIG. 9B shows a perspective view of the tip of measurement arm 71B. As shown in FIG. 9B, three-dimensional heads 75a and 75b, and two-dimensional heads 75c and 75d are placed in a symmetrical but similar positional relation to three-dimensional heads 73a and 73b, and two-dimensional heads 73c and 73d previously described, inside of arm member $71_2$. The detection center of one of three-dimensional heads 75a coincides with the alignment position, that is, with the detection center of primary alignment system AL1.

The output of encoders 73a and 73b, and 73c and 73d of the second back side encoder system 70B is supplied to main controller 20 via switching section 150B (refer to FIGS. 16, 17 and the like), which is structured similarly to switching section 150A previously described.

When wafer stage WST is positioned at measurement station 300, such as for example, at the time of wafer alignment which will be described later on, main controller 20 performs refreshing the coordinate system of the second back side encoder system by repeatedly performing position measurement of wafer table WTB in directions of six degrees of freedom as is previously described while concurrently performing difference measurement as is previously described at a predetermined sampling interval, based on measurement values of a total of ten degrees of freedom by heads 75a to 75d of the second back side encoder system 70B. The preceding description can be applied without any changes to the position measurement and difference measurement in this case, if the exposure position previously described is replaced to alignment position.

Incidentally, in the present embodiment, because the detection point of three-dimensional head 75a coincides with the alignment position, and the position of fine movement stage WFS in the X-axis, the Y-axis, and the Z-axis directions is measured at the detection point, the position of fine movement stage WFS in the X-axis, the Y-axis, and the Z-axis directions is calculated using the measurement values of three-dimensional head 75a. Different from this, such as for example, in the case the alignment position coincides with a point in the center of the detection points of a pair of three-dimensional heads 75a and 75b, main controller 20 can obtain the position of fine movement stage WFS in the X-axis, the Y-axis, and the Z-axis directions, based on an average value of the measurement values of the pair of three-dimensional heads 75a and 75b in each of the X-axis, the Y-axis, and the Z-axis directions.

Further, because the substantial detection points on grating RG in the X-axis, Y-axis and Z-axis directions by the second back side encoder system 70B each coincide with the detection center (alignment position) of primary alignment system AL1, generation of the so-called Abbe error is suppressed to a level which can be substantially ignored. Accordingly, by using the second back side encoder system 70B, main controller 20 can measure the position of fine movement stage WFS in the X-axis direction, the Y-axis direction, and the Z-axis directions with high precision, without the Abbe error.

Next, a structure and the like of the second top side encoder system 80B structuring a part of the second fine movement stage position measurement system 110B will be described. The second top side encoder system 80B can measure position information of fine movement stage WFS in directions of six degrees of freedom concurrently with the second back side encoder system 70B.

In exposure apparatus 100, as shown in FIG. 4, on the −Y side of each of the head sections 62C and 62A and almost at the same Y position as alignment systems AL1, and $AL2_1$ to $AL2_4$, head sections 62E and 62F are placed, respectively. Head sections 62E and 62F, as described later on, each include a plurality of heads, and these heads are fixed to main frame BD in a suspended state via a support member.

Head sections 62F and 62E, as shown in FIG. 4, are equipped with four each of four-spindle heads $68_1$ to $68_4$, and $67_1$ to $67_4$. Inside the respective housings of four-spindle heads $68_1$ to $68_4$, as shown in FIG. 5, similar to four-spindle heads $65_1$ to $65_4$ and the like previously described, XZ heads $68X_1$ to $68X_4$ and YZ heads $68Y_1$ to $68Y_3$ are housed. Similarly, inside the respective housings of four-spindle heads $67_1$ to $67_4$, XZ heads $67X_1$ to $67X_4$ and YZ heads $67Y_1$ to $67Y_4$ are housed. As each of the XZ heads $68X_1$ to $68X_4$ and $67X_1$ to $67X_4$, and YZ heads $68Y_1$ to $68Y_3$ and $67Y_1$ to $67Y_4$, an encoder head having a structure similar to the displacement measurement sensor head disclosed in, for example, U.S. Pat. No. 7,561,280 can be used.

XZ heads $67X_1$ to $67X_3$ and $68X_2$ to $68X_4$ (to be more precise, irradiation points on scales $39_1$ and $39_2$ of the measurement beams generated by XZ heads $67X_1$ to $67X_3$ and $68X_2$ to $68X_4$) are placed along reference axis LA previously described, at almost the same X position as XZ heads $64X_1$ to $64X_3$ and $65X_2$ to $65X_4$, respectively.

YZ heads $67Y_1$ to $67Y_3$ and $68Y_2$ to $68Y_4$ (to be more precise, irradiation points on scales $39_1$ and $39_2$ of the measurement beams generated by YZ heads $67Y_1$ to $67Y_3$ and $68Y_2$ to $68Y_4$) are placed on a straight line $LA_1$ which is parallel to reference axis LA and is distanced to the −Y side from reference axis LA, at almost the same X position as the corresponding XZ heads $67X_1$ to $67X_3$ and $68X_2$ to $68X_4$.

Further, the remaining XZ heads $67X_4$ and $68X_1$ and YZ heads $67Y_4$ and $68Y_1$ are placed at almost the same X position as each of the XZ heads $64X_4$ and $65X_1$ on the −Y side of the detection center of each of the secondary alignment systems $AL2_1$ and $AL2_4$, shifted to the −Y direction by the same distance from reference axis LA and straight line $LA_1$. Hereinafter, as necessary, XZ heads $68X_1$ to $68X_4$ and $67X_1$ to $67X_4$, and YZ heads $68Y_1$ to $68Y_4$ and $67Y_1$ to $67Y_4$ will each be expressed also as XZ heads 68X and 67X, and YZ heads 68Y and 67Y.

Head sections 62F and 62E use scales $39_1$ and $39_2$, respectively, and structure a multiple-lens (four-lens in this case) XZ linear encoder which measures the X position and Z position of wafer table WTB, and a multiple-lens (four-lens in this case) YZ linear encoder which measures the Y position and Z position. Hereinafter, for the sake of convenience, these encoders will be expressed as XZ linear encoders 68X and 67X and YZ linear encoders 68Y and 67Y (refer to FIG. 17), using the same reference signs as XZ heads 68X and 67X, and YZ heads 68Y and 67Y, respectively.

In the present embodiment, XZ linear encoder 68X and YZ linear encoder 68Y structure (refer to FIG. 17) a multiple-lens (four-lens in this case) four-spindle encoder 68 which measures position information of wafer table WTB related to each direction in the X-axis, the Y-axis, the Z-axis and θx directions. Similarly, XZ linear encoder 67X and YZ linear encoder 67Y structure (refer to FIG. 17) a multiple-lens (four-lens in this case) four-spindle encoder 67 which measures position information of wafer table WTB related to each direction in the X-axis, the Y-axis, the Z-axis and the θx directions.

Here, for the similar reasons as is previously described, on alignment measurement and the like, at least one head each of the four XZ heads 68X and 67X and YZ heads 68Y and 67Y constantly faces (irradiates a measurement beam on) the corresponding scales $39_1$ and $39_2$. Accordingly, four-spindle encoder 68 and four-spindle encoder 67 structure the second top side encoder system 80B which measures position information in directions of six degrees of freedom of fine movement stage WFS supported by coarse movement stage WCS, in the case wafer stage WST is at measurement station 300.

Measurement values of each encoder structuring the second top side encoder system 80B are supplied to main controller 20 via switching section 150B (refer to FIGS. 16, 17 and the like).

As is obvious from the description so far, in the present embodiment, in the case wafer stage WST is at measurement station 300, position information in directions of six degrees of freedom of fine movement stage WFS supported by coarse movement stage WCS can be measured concurrently by the second back side encoder system 70B and the second top side encoder system 80B.

Further, switching section 150B has a first mode to a fourth mode set by main controller 20, similar to switching section 150A. And, in the case the first, the third, or the fourth mode is set, according to the mode setting, hybrid filter section 160 supplies measurement values of a higher reliability to main controller 20 from measurement values of the second back side encoder system 70B and the second top side encoder system 80B, and drive (position control) of wafer table WTB is to be performed based on the supplied measurement values when wafer stage WST is at measurement station 300.

Further, main controller 20, as is previously described, performs refreshing the coordinate system of the second top side encoder system 80B by comparing and adjusting the grid of the scale of the second top side encoder system 80B to the coordinate system of the second back side encoder system 70B whose grid has been updated.

Incidentally, for the second back side encoder system 70B and the second top side encoder system 80B of the second fine movement stage position measurement system 110B, besides the description so far, the description earlier concerning the first back side encoder system 70A and the first top side encoder system 80A can also be applied without any changes.

Now, although the description falls out of sequence, the third back side encoder system 70C (refer to FIG. 16) will be described which is used at the time of focus mapping to be described later on, when necessary, on measuring the position of fine movement stage WFS (wafer table WTB) in each of the Y-axis, the Z-axis, the θy, and the θz directions.

In arm member $71_2$ of measurement arm 71B, as shown in FIG. 9B, a pair of YZ heads 77a and 77b is placed further inside of arm member $71_2$, so that points set apart by the same distance to the +Y side from the detection centers of three-dimensional heads 75a and 75b respectively serve as detection centers of the pair of YZ heads. The detection center of YZ head 77a on the +X side coincides with an AF center, or in other words, the detection center of the multipoint AF system (90a, 90b) previously described. This pair of YZ heads 77a and 77b structures the third back side encoder system 70C.

The output of the third back side encoder system 70C is supplied to main controller 20, via switching section 150C (refer to FIGS. 16, 17 and the like) structured in a similar manner as switching section 150A previously described. When the output of the third back side encoder system 70C is supplied to main controller 20 via switching section 150C, main controller 20 obtains a Y position and Z position of fine movement stage WFS (wafer table WTB) based on position information in the Y-axis and the Z-axis directions measured by YZ head 77a, and obtains a position in the θz direction (θz rotation) and a position in the θy direction (θy rotation) of fine movement stage WFS (wafer table WTB), based on position information in the Y-axis direction and the Z-axis direction measured by the pair of YZ heads 77a and 77b.

Incidentally, in the case the alignment center coincides with the center of detection points of the pair of three-dimensional heads 75a and 75b, the AF center is set so as to coincide with the center of the detection points of the pair of YZ heads 77a and 77b. Accordingly, in this case, main controller 20 obtains the Y position and Z position of fine movement stage WFS (wafer table WTB) from an average value of position information in the Y-axis and the Z-axis directions measured by the pair of YZ heads 77a and 77b.

Incidentally, for the third back side encoder system 70C, although there is some difference in position and number of the heads, besides the description so far, the description made earlier on the first back side encoder system 70A can be basically applied.

In the present embodiment, corresponding to the third back side encoder system 70C, the third top side encoder system 80C is also provided (refer to FIG. 16). The third top side encoder system 80C, as shown in FIG. 4, includes a pair of four-spindle heads $66_1$ and $66_2$ placed symmetrical to reference axis LV. The pair of four-spindle heads $66_1$ and $66_2$ are placed at a position to the +Y side of four-spindle head $68_3$ and a position to the +Y side of four-spindle head $67_2$, respectively, and are fixed to main frame BD in a suspended state via a support member. The pair of four-spindle heads $66_1$ and $66_2$, as shown in FIG. 5, include XZ heads $66X_1$ and $66X_2$ and YZ heads $66Y_1$ and $66Y_2$, respectively, with each of the detection points placed along the Y-axis direction, similar to the four-spindle heads $64_i$, $65_i$, $67_i$, and $68_i$ previously described. The Y position of the detection points of XZ heads $66X_1$ and $66X_2$ that the pair of four-spindle heads $66_1$ and $66_2$ have, respectively, coincides with the Y position (on straight line $LA_2$) of the detection center of the AF beam. Further, the X position of the detection point of XZ head $66X_2$ is positioned slightly to the +X side of the detection point of XZ head $67X_2$, and the X position of the detection point of XZ head $66X_1$ is positioned slightly to the −X side of the detection point of XZ head $68X_3$. The pair of four-spindle heads $66_1$ and $66_2$ structures a pair of four-spindle encoders which measures position information of wafer table WTB in each of the X-axis, the Y-axis, the Z-axis, and the θx directions, using scales $39_1$ and $39_2$, respectively. This pair of four-spindle encoders structures the third top side encoder system 80C.

Measurement values of each encoder structuring the third top side encoder system 80C are supplied to main controller 20, via switching section 150C (refer to FIGS. 16, 17 and the like) which is structured similar to switching section 150A.

In the present embodiment, by the third top side encoder system 80C and the third back side encoder system 70C, position information related to directions in four degrees of freedom (each of the Y-axis, the Z-axis, the θz and the θy directions) of wafer table WTB (fine movement stage WFS) can be measured concurrently.

Further, switching section 150C has a first mode to a fourth mode set by main controller 20, similar to switching section 150A. And, in the case the first, the third, or the fourth mode is set, according to the mode setting, hybrid filter section 160 supplies measurement values of a higher reliability to main controller 20 from measurement values of the third back side encoder system 70C and the third top side encoder system 80C.

However, at the time of focus mapping which will be described later on, wafer stage WST is at measurement station 300 and wafer alignment measurement is performed concurrently with the focus mapping, and until this alignment measurement is completed, main controller 20 performs servo control on the position in directions of six degrees of freedom of fine movement stage WFS (wafer table WTB), based on the hybrid position signal previously described of the second fine movement stage position measurement system 110B, and the measurement values of the third top side encoder system 80C and the third back side encoder system 70C are mainly used as measurement data on focus mapping. And, after wafer alignment measurement has been completed, until wafer table moves outside of the measurement range of the second fine movement stage position measurement system 110B and the focus mapping is completed, main controller 20 performs the drive (servo control of the position) of fine movement stage WFS based on the measurement values of the third top side encoder system 80C and/or the third back side encoder system 70C.

In the present embodiment, furthermore, when wafer stage WST moves from a finishing position of focus mapping to exposure station 200, the fourth top side encoder system 80D is provided (refer to FIG. 16) so as to measure the position in directions of six degrees of freedom of wafer table WTB during this movement. The fourth top side encoder system 80D, as shown in FIG. 4, includes a pair of three-dimensional heads $79_1$ and $79_2$ which are placed at a position halfway between head section 62A and head section 62F in the Y-axis direction, shifted to the X-axis direction and the Y-axis direction. The pair of three-dimensional heads $79_1$ and $79_2$ is fixed to main frame BD in a suspended state via a support member. The pair of three-dimensional heads $79_1$ and $79_2$, as shown in FIG. 5, include XZ heads $79X_1$ and $79X_2$ and Y heads $79Y_1$ and $79Y_2$, respectively, which are placed lined in the Y-axis direction. Y heads $79Y_1$ and $79Y_2$ are one-dimensional heads whose measurement direction is in the Y-axis direction. In this case, the X positions of XZ heads $79X_1$ and $79X_2$ are set to the same positions as XZ heads $68X_2$ and $66X_1$, respectively. As each of the Y heads $79Y_1$ and $79Y_2$, a diffractive interference type encoder head such as the one disclosed in, for example, U.S. Patent Application Publication No. 2008/0088843 and the like, can be used.

The pair of three-dimensional heads $79_1$ and $79_2$ structures a pair of three-dimensional encoders 79A and 79B (refer to FIG. 16) which measures position information in the X-axis, the Y-axis, and the Z-axis directions of wafer table WTB, both using scale $39_1$. Measurement values of this pair of three-dimensional encoders 79A and 79B are supplied to main controller 20. The pair of three-dimensional heads $79_1$ and $79_2$ can measure the position in directions of six degrees of freedom of wafer table WTB using the same scale $39_1$ when the center position of wafer table WTB in the X-axis direction coincides with reference axis LV. The pair of three-dimensional encoders 79A and 79B structures the fourth top side encoder system 80D.

Incidentally, for the fourth top side encoder system 80D, although there is some difference in position and number of the heads, besides the description so far, the description made earlier on the first back side encoder system 80A can be basically applied.

In exposure apparatus 100 of the present embodiment, as shown in FIG. 4, an unloading position UP1 is set at a predetermined position between the exposure position and the alignment position on reference axis LV, for example, at almost the same Y position as XZ head $79X_1$ of three-dimensional head $79_1$ on reference axis LV, and at a position a predetermined distance away to the −X side from unloading position UP1, a standby position UP2 is set. Further, on the −Y side of the alignment position on reference axis LV, a loading position LP is set.

Figure 15:
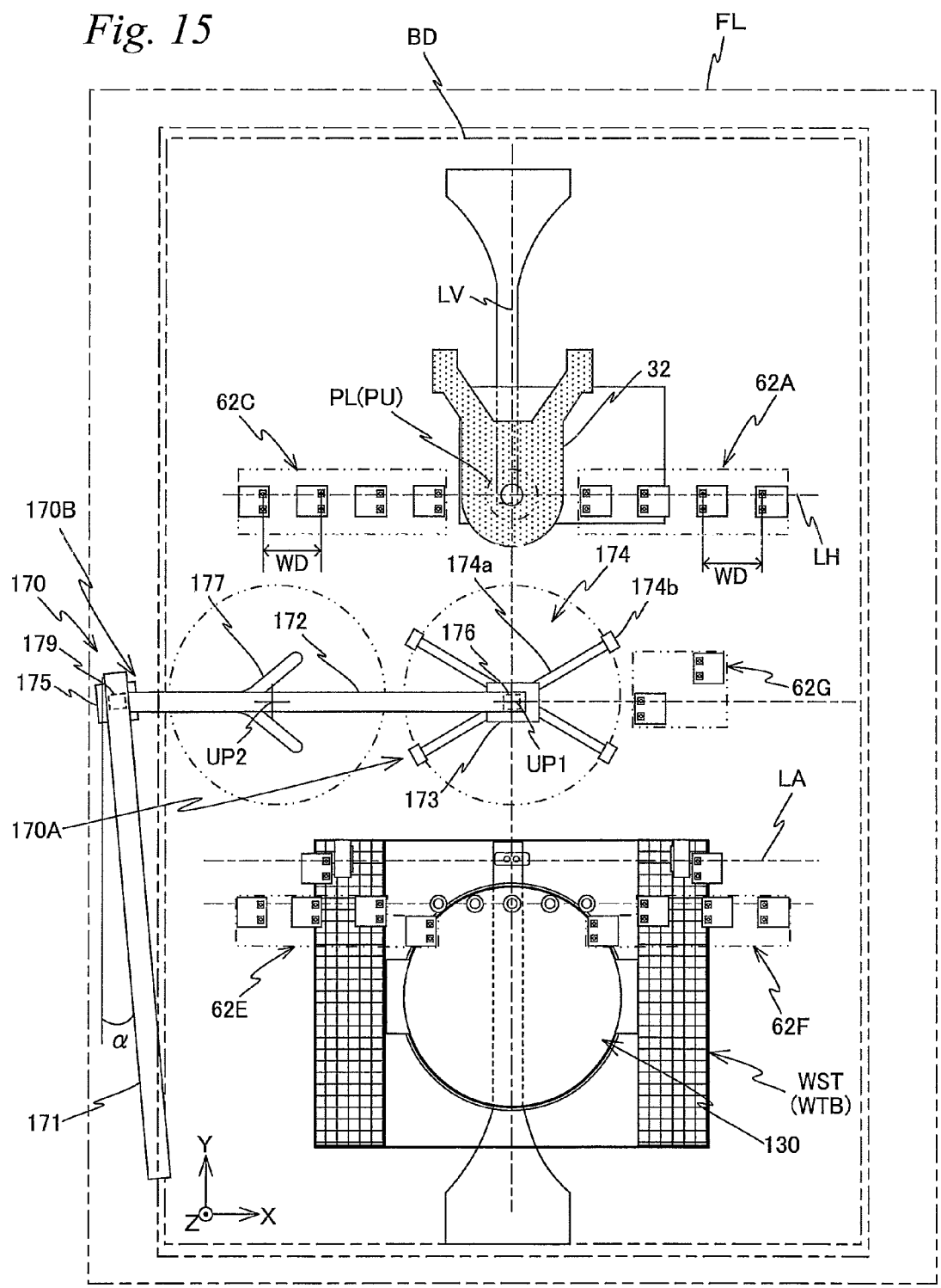
FIG. 15 is a view used to describe a structure of an unloading device.

At unloading position UP1, standby position UP2, and the area nearby, as shown in FIG. 15, an unloading device 170 is placed. Unloading device 170 is placed vibrationally separated from main frame BD in the periphery of main frame BD and for example, is attached to a frame FL, which has a rectangular frame shape in a planar view supported on the floor surface by a support member not shown.

Unloading device 170 is equipped with a first arm 171 which is fixed to the lower surface (a surface on the −Z side) of frame FL and extends, for example, in a direction forming a predetermined angle α (α is a predetermined angle, for example, smaller than 10 degrees) with respect to the Y-axis, a second arm 172 which extends in the X-axis direction whose edge surface on one end in the longitudinal direction is fixed to a side surface (+X side surface) on one end (+Y side end) in the longitudinal direction of the first arm 171, a first unloading slider 170A which is movable along the longitudinal direction of the second arm 172, and a second unloading slider 170B which is movable along the longitudinal direction of the first arm 171.

The first arm 171 consists of a rod-shaped member which is placed facing the lower surface of frame FL, in a state where one end in the longitudinal direction faces a side section of frame FL on the −X side close to the center in the Y-axis direction, and the other end in the longitudinal direction faces the side section of frame FL on the −X side at the end on the −Y side. The first arm 171 has its entire upper surface or a plurality of places of the upper surface fixed to the lower surface of frame FL. To the lower surface (rear surface) of the first arm 171, a guide which is not shown is provided along the longitudinal direction, and a stator which is not shown is placed parallel to the guide.

The second arm 172 consists of a rod-shaped member having almost the same length as the first arm 171. The second arm 172 is fixed on a side surface (+X side surface) on one end (+Y side end) in the longitudinal direction of the first arm 171, in a state where an angle of (90 degrees−α) is formed within the XY-plane with respect to the first arm 172. To the lower surface (rear surface) of the second arm 172, similar to the first arm 171, a guide which is not shown is provided along the longitudinal direction, and a stator which is not shown is placed parallel to the guide.

The first unloading slider 170A is equipped with a first slide member 173 provided movable along the guide described above on the rear surface of the second arm 172, and a wafer grasping member 174 having an X shape in a planar view that is placed below the first slide member 173 and is moved vertically by a vertical movement drive section 176 provided in the first slide member 173 (refer to, for example, FIG. 36A). In the first slide member 173, a mover is incorporated that structures a linear motor for driving the first slider along with the stator described above placed in the second arm 172.

Wafer grasping member 174, as shown in FIG. 15, is equipped with a main section 174a consisting of a pair of rod-shaped members which is combined in an X shape in a planar view, and four grasping members 174b each attached to the four tips of main section 174a.

The size of the pair of rod-shaped members in the longitudinal direction structuring main section 174a is slightly longer than the diameter of wafer W, and the pair of rod-shaped members are placed so that the rods intersect at a predetermined angle in the center of the longitudinal direction. With main section 174a, the intersecting part of the pair of rod-shaped members is fixed to the lower surface of a drive shaft of vertical movement drive section 176.

Here, with the pair of rod-shaped members of main section 174a, because the four grasping members 174b only has to grasp wafer W on wafer stage WST, a groove can be formed in the center on the upper surface (or the lower surface) of one of the rod-shaped members, and by inserting the other rod-shaped member into the groove, both rods can be fixed so that the height of the upper surface (or the lower surface) of each of the rod-shaped members becomes the same, or the lower surface of one of the rod-shaped members can be fixed to the other rod-shaped member. In the case of connecting the pair of rod-shaped members at a position where the height of the pair of rod-shaped members is different (for example, in the case when the other rod-shaped member is fixed to the lower surface of one of the rod-shaped members), it is preferable to match the Z-axis direction position of the lower end of the four grasping members 174b, such as by adjusting the length in the Z-axis direction of grasping members 174b provided in both ends of one of the rod-shaped members, or by using a member having a shape projecting upward (or projecting downward) so that both ends of one of the rod-shaped members are adjusted to have the same height as both ends of the other rod-shaped member.

Each of the four grasping members 174b have a claw section provided at the lower end that can support the rear surface of the wafer. Each of the four grasping members 174b can be moved and slid along the rod-shaped member to which each of the members are attached via a drive mechanism which is not shown. That is, the four grasping members 174b can be opened or closed (refer to FIG. 36C).

In the present embodiment, a first unloading slider driving system 180A (refer to FIG. 16) is structured including the linear motor for driving the first slider previously described, vertical movement drive section 176, and the drive mechanism described above for opening and closing the grasping member 174b.

Figure 32A:
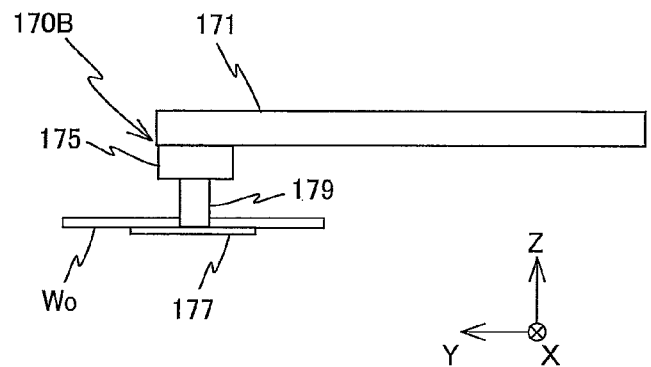
FIGS. 32A to 32D are views (No. 14) used to describe a concurrent processing operation using wafer stage WST and measurement stage MST, and to describe a procedure of carrying a wafer waiting at a standby position to a delivery position of a wafer carrier system.

The second unloading slider 170B is equipped with a second slide member 175 which is provided movable along the guide described above on the rear surface of the first arm 171, and a Y shape holding section 177 which is placed below the second slide member 175 and is vertically moved and rotationally driven around the Z-axis by a vertical movement rotation driving section 179 provided in the second slide member 175 (for example, refer to FIG. 32A). In the second slide member 175, a mover is incorporated which structures a linear motor for driving the second slider along with the stator described above placed on the first arm 171.

Y shape holding section 177, as shown in FIG. 15, consists of a thin plate member having a Y shape in a planar view, and has on its upper surface a suction section which is not shown where wafer W is held by suction by vacuum chucking (or electrostatic suction). The size in the XY-plane of Y shape holding section 177 is slightly smaller than wafer W, and in a state where wafer W is held above the suction section, the tip (that is, a tip-split section) of the Y shape fits the outer periphery of wafer W. The end on the opposite side of the Y shape tip of Y shape holding section 177 is fixed to the lower end of the drive shaft of vertical movement rotation driving section 179.

In the present embodiment, a second unloading slider driving system 180B (refer to FIG. 16) is structured including the linear motor for driving the second slider previously described, and vertical movement rotation driving section 179.

The first unloading slider driving system 180A and the second unloading slider driving system 180B are controlled by main controller 20 (refer to FIG. 16). Incidentally, the unloading device is not limited to the structure described above, and may be of any structure as long as it is movable holding wafer W. Further, the unloading position of wafer W is also not limited to the position between projection optical system PL and alignment device 99, and for example, unloading can be performed on the opposite side of projection optical system PL with respect to alignment device 99 as in the second embodiment to be described later on.

FIG. 16 is a block diagram showing an input/output relation of main controller 20 which mainly structures a control system of exposure apparatus 100 and has overall control over each structuring parts. Main controller 20 includes a workstation (or a microcomputer) and the like, and has overall control over each of the sections that structure exposure apparatus 100. FIG. 17 shows an example of a concrete structure of the first and the second fine movement stage position measurement systems 110A and 110B in FIG. 16. Further, FIG. 18 shows an example of a structure of switching section 150A in FIG. 16.

Next, a concurrent processing operation using wafer stage WST and measurement stage MST in exposure apparatus 100 related to the present embodiment will be described, based on FIGS. 19 to 37. Incidentally, in the following operation, main controller 20 performs control of liquid supply device 5 and liquid recovery device 6 of local liquid immersion device 8 as is previously described, and water is constantly filled in the space below tip lens 191 of projection optical system PL. However, in the description below, for a straightforward description, description on the control related to liquid supply device 5 and liquid recovery device 6 will be omitted. Further, while a number of drawings will be used in the description on the operation hereinafter, the same member may or may not have a reference sign applied in each of the drawings. That is, although the reference sign written for each of the drawings may be different, these drawings show the same structure, regardless of the availability of reference signs. The same is said for each of the drawings used in the description so far. Further, in the drawings following FIG. 19, measurement stage MST is briefly illustrated.

Further, in the case when each head of the first to the third back side encoder systems 70A to 70C and the first to the fourth top side encoder systems 80A to 80D, the multi-point AF system, the alignment systems and the like are used, or a little before their usage, while their state is set from an off state to an on state, the description regarding this point will be omitted when describing the operation hereinafter.

Further, as a premise, switching sections 150A and 150B, as an example, are both to be set to the first mode, and switching section 150C is, for example, to be set to the second mode. More specifically, from the first fine movement stage position measurement system 110A, measurement values (hereinafter, except for cases when it is especially necessary, the values will be referred to as measurement values of the first fine movement stage position measurement system 110A) corresponding to hybrid position signal $F_H$ of the first back side encoder system 70A and the first top side encoder system 80A, and from the second fine movement stage position measurement system 110B, measurement values (hereinafter, except for cases when it is especially necessary, the values will be referred to as measurement values of the second fine movement stage position measurement system 110B) corresponding to hybrid position signal $F_H$ of the second back side encoder system 70B and the first top side encoder system 80B, are output to main controller 20. Further, from the third back side encoder system 70C and the third top side encoder system 80C, the output signals (measurement values) are each output to main controller 20.

FIG. 19 shows a state where wafer stage WST is at loading position LP, and measurement stage MST is directly below projection optical system PL. At this point, measurement arm 71B is inserted into the space of wafer stage WST, and the rear surface (grating RG) of wafer table WTB faces measurement arm 71B. At this loading position LP, a new wafer W (here, as an example, the wafer is to be a wafer in the middle of a lot (1 lot including 25 or 50 slices of wafers)) which has not yet undergone exposure is loaded on wafer stage WST in the order described below.

Figure 20A:
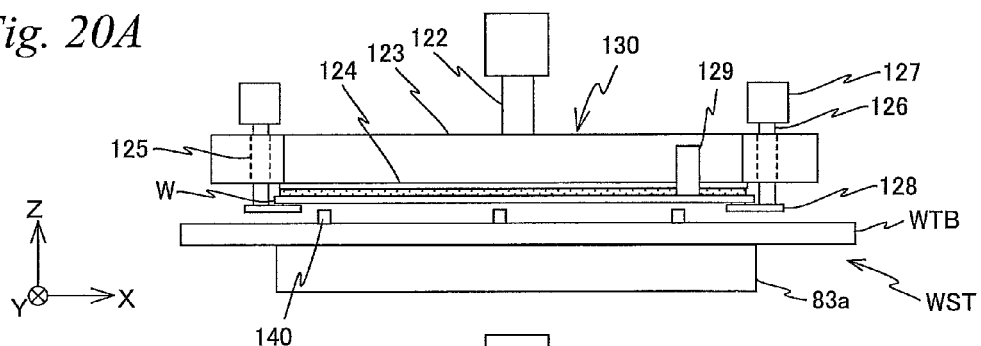
FIGS. 20A to 20D are views (No. 2) used to describe a concurrent processing operation using wafer stage WST and measurement stage MST, and to describe a procedure of a loading operation onto a wafer stage.

At this point, after a stream processing to be described later on to the preceding wafer has been completed, wafer W which has not yet been exposed is already supported by chuck unit 120 previously described at loading position LP at the point before exposure begins, and this support state is maintained. To be concrete, as shown in FIG. 20A, wafer W is suctioned (held or supported) in a non-contact manner while maintaining a predetermined distance (gap) by Bernoulli chuck 124 which is at a predetermined height position at loading position LP, and two places at the outer circumference of its rear surface are supported in a contact manner from below by the pair of support plates 128, which limits the movement in directions of six degrees of freedom. Further, the temperature of wafer W is controlled by cool plate 123 to a predetermined temperature, for example, to 23° C.

Figure 20B:
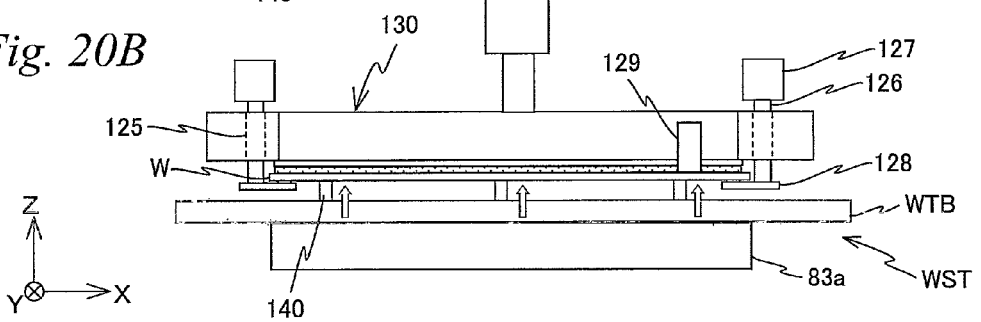

Main controller 20, first of all, as shown in FIG. 20B, drives the three vertical movement pins 140 previously described upward, via driver 142. And, when the three vertical movement pins 140 come into contact with the rear surface of wafer W supported by Bernoulli chuck 124, the upward drive of vertical movement pins 140 is stopped, while maintaining the contact state. When the upper end surface of the three vertical movement pins 140 is at a position other than the second position serving as a lowest end position of the upper end surface within the moving range, vertical movement pins 140 are pressed by a constant force in the +Z direction by springs not shown.

Figure 20C:
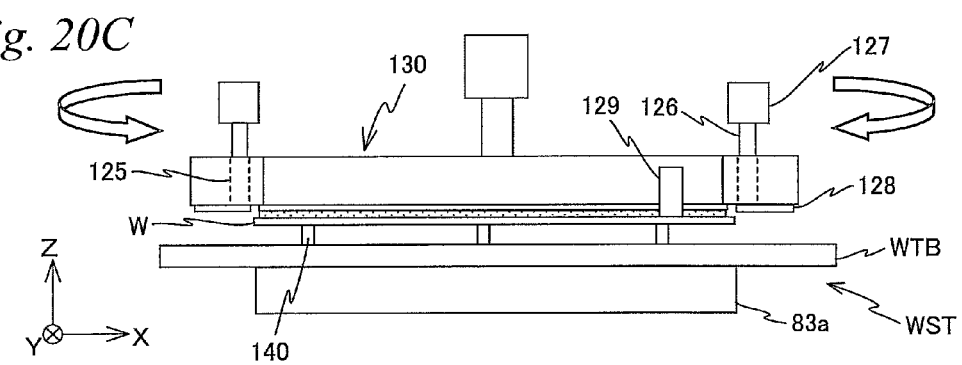

Next, main controller 20 drives the pair of support plates 128 slightly downward via the pair of vertical movement rotation driving sections 127 and separates the pair of support plates 128 from the rear surface of wafer W, and rotates the pair of support plates 128 at a predetermined angle as shown in FIG. 20C so as to position the pair of support plates 128 at the second rotating position. By the separation from the rear surface of wafer W of the pair of support plates 128 described above, the new wafer W has moved from a state where the wafer is supported by support plates 128 to a state where the wafer is supported by vertical movement pins 140. Incidentally, Bernoulli chuck 124 continues the suction (hold or support) of wafer W in this state as well, and by the suction (hold or support) of wafer W by Bernoulli chuck 124 and the frictional force due to the support from below of vertical movement pins 140, movement of wafer W is limited in directions of six degrees of freedom. Further, the temperature control of wafer W by cool plate 123 is also being continued.

Figure 20D:
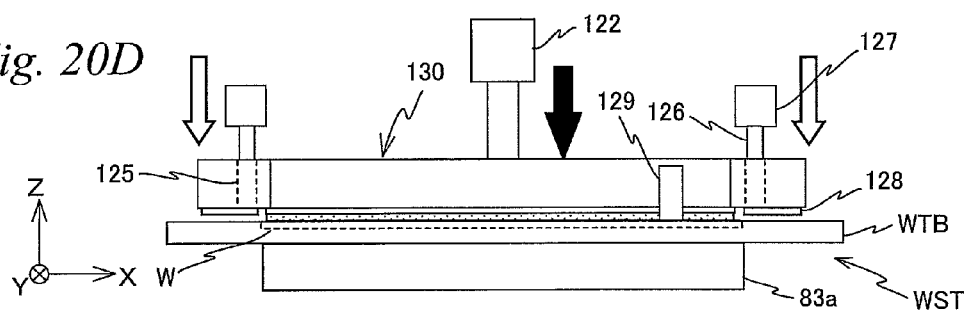

Next, main controller 20, as shown in FIG. 20D, controls drive section 122 and the pair of vertical movement rotation driving sections 127, and drives chuck main section 130 and the pair of support plates 128 downward. In this case, the upward force to the three vertical movement pins 140 by the force of the springs previously described is applied to wafer W as prepressure. Accordingly, by chuck main section 130 being driven downward, wafer W is pushed downward, and pushes the three vertical movement pins 140 downward resisting the prepressure. That is, in the manner described above, wafer W is driven downward along with chuck main section 130 and the three vertical movement pins 140, while maintaining a predetermined gap with respect to Bernoulli chuck 124. And, when the rear surface of wafer W comes into contact with the wafer holder (wafer table WTB), main controller 20 releases the suction (hold or support) of wafer W by Bernoulli chuck 124, and makes the wafer holder hold wafer W by suction. This allows wafer W to be held by the wafer holder with the bending which occurs substantially suppressed or prevented. That is, Bernoulli chuck 124 is equipped with not only the carrier function, and the temperature control function and pre-alignment function previously described, but also with a bending correcting (correction) function. Because the wafer W held by the wafer holder is flattened, this bending correction function can also be called a flattening function. Incidentally, while wafer W held by Bernoulli chuck 124 is maintained substantially flat without any bending, for example, by Bernoulli chuck 124 delivering wafer W to the wafer holder in a state where bending is generated in at least a part of wafer W which is held, as a consequence, the bending of wafer W held by the wafer holder can be suppressed or prevented. Further, a detection device (for example, the gap sensor and the like previously described) for detecting position information in the Z direction or bending information of the whole surface or a part of the surface of wafer W held by Bernoulli chuck 124 can be provided, and main controller 20 can use such detection results to maintain wafer W held by Bernoulli chuck 124 flat without bending, or with a bending generated in at least a part of the wafer by Bernoulli chuck 124. Furthermore, while suction release of wafer W by Bernoulli chuck 124 can be performed before suction of wafer W by the wafer holder begins, for example, for correction (flattening) of the bending of wafer W, the suction release can be performed simultaneously with the beginning of suction of wafer W by the wafer holder or after the beginning of suction. Further, main controller 20 can begin the suction hold of wafer W by the wafer holder simultaneously with releasing the support of wafer W by the three vertical movement pins 140, or can begin the suction hold of wafer W by the wafer holder prior to releasing the support of wafer W by the three vertical movement pins 140.

Here, prior to releasing the suction (hold or support) of wafer W by Bernoulli chuck 124, main controller 20 can apply a downward force from above by chuck main section 130 to a part of or to all of wafer W whose rear surface (lower surface) presses into (is in contact with) the wafer holder (wafer table WTB). Here, the downward force refers to a force other than gravity. As a means of applying this downward force, for example, increasing the flow volume and/or flow speed of the gas blowing out from Bernoulli chuck 124, or narrowing the gap (spacing) between the lower surface of Bernoulli chuck 124 and the surface of wafer W from the predetermined gap when chuck main section 130 is driven downward can be considered. In any case, the suction hold by the wafer holder of wafer W is to be performed after a downward force is applied, or while the downward force is being applied to wafer W. This substantially suppresses or prevents the bending from occurring in wafer W held by the wafer holder.

Further, main controller 20 can control the suction state by the wafer holder so that suction holding of wafer W by the wafer holder is performed with a time lag, for example, begins with a time lag from the periphery section toward the center, or begins from one side to its opposite side with a time lag. Especially in the latter case, the wafer holder (wafer table WTB) can be tilted in the θx direction and/or the θy direction. By performing such suction hold of wafer W by the wafer holder combined with the bending correction of wafer W by Bernoulli chuck 124, wafer W is held by the wafer holder with the bending substantially suppressed or prevented.

In the embodiment, while chuck main section 130 and the three vertical movement pins 140 are driven downward in the manner described above, imaging signals of imaging device 129 are sent to signal processing system 116 (refer to FIG. 16), and information on positional deviation and rotation errors of wafer W is supplied to main controller 20 (refer to FIG. 16). Incidentally, the three vertical movement pins 140 can be driven downward synchronously with Bernoulli chuck 124 (chuck main section 130), or can be driven downward without being in synch with Bernoulli chuck 124. Especially in the latter case, main controller 20 can make the lowering speed of the three vertical movement pins 140 and the lowering speed of chuck main section 130 different so that wafer W is flattened. In this case, for example, the gap sensor previously described can be placed at a plurality of places of Bernoulli chuck 124, and main controller 20 can detect a deformed state (for example, whether the wafer is projected upward or downward, and the like) of wafer W using the plurality of gap sensors, and can make the lowering speed of the three vertical movement pins 140 and the lowering speed of chuck main section 130 different according to results of the detection.

In the present embodiment, as it can be seen from FIG. 20A, because a state where vertical movement pins 140 have been driven upward by a predetermined amount is maintained at the point when wafer table WTB returns to loading position LP, wafer loading can be performed in a short time than when vertical movement pins 140 are housed inside of the wafer holder. FIG. 19 shows a state where wafer W is loaded on wafer table WTB.

In the present embodiment, as shown in FIG. 19, loading position LP is set to a position where fiducial mark FM on measurement plate 30 is positioned within the field (detection area) of primary alignment system AL1 (in other words, a position where the first half processing of base line measurement (Pri-BCHK) of primary alignment system AL1 is performed).

Here, the first half processing of Pri-BCHK refers to the processing described hereinafter. That is, main controller 20 detects (observes) fiducial mark FM located in the center of measurement plate 30 previously described with primary alignment system AL1, makes the detection results of primary alignment system AL1 correspond with the measurement values of fine movement stage position measurement system 110B at the time of detection, and stores the information in memory.

In the present embodiment, the first half processing of Pri-BCHK is performed concurrently with at least a part of the loading operation of wafer W.

At this point, measurement stage MST engages with measurement arm 71A in a state where the rear surface (grating RGa) of measurement table MTB faces measurement arm 71A. Further, a liquid immersion area 14 by liquid Lq is formed between measurement table MTB and projection optical system PL.

Further, at this point, a wafer (refer to as $W_0$) that has already been exposed, is held by Y shape holding section 177 of the second unloading slider 170B at a predetermined height position of standby position UL2. This waiting state of wafer $W_0$ is maintained until exposure of the next wafer W begins and wafer stage WST reaches a state where it withdraws from below standby position UL2.

Next, main controller 20 drives coarse movement stage WCS based on measurement values of wafer stage position measurement system 16A, and begins a moving operation in the +Y direction of wafer stage WST from loading position LP toward exposure station 200 while performing servo control on the position of wafer table WTB based on the measurement values of the second fine movement stage position measurement system 110B. This movement of wafer stage WST in the +Y direction, first of all, for example, begins with moving toward a position where alignment marks arranged in three first alignment shot areas (hereinafter shortly referred to as a first alignment mark) are detected. At this point, servo control is performed on the position of wafer table WTB in directions of six degrees of freedom, based on the measurement values of the second fine movement stage position measurement system 110B. Incidentally, while coarse movement stage WCS is driven within the XY-plane based on the position information measured by wafer stage position measurement system 16A in exposure station 200, measurement station 300, or in any areas in between, hereinafter, the description regarding this point will be omitted.

Figure 21:
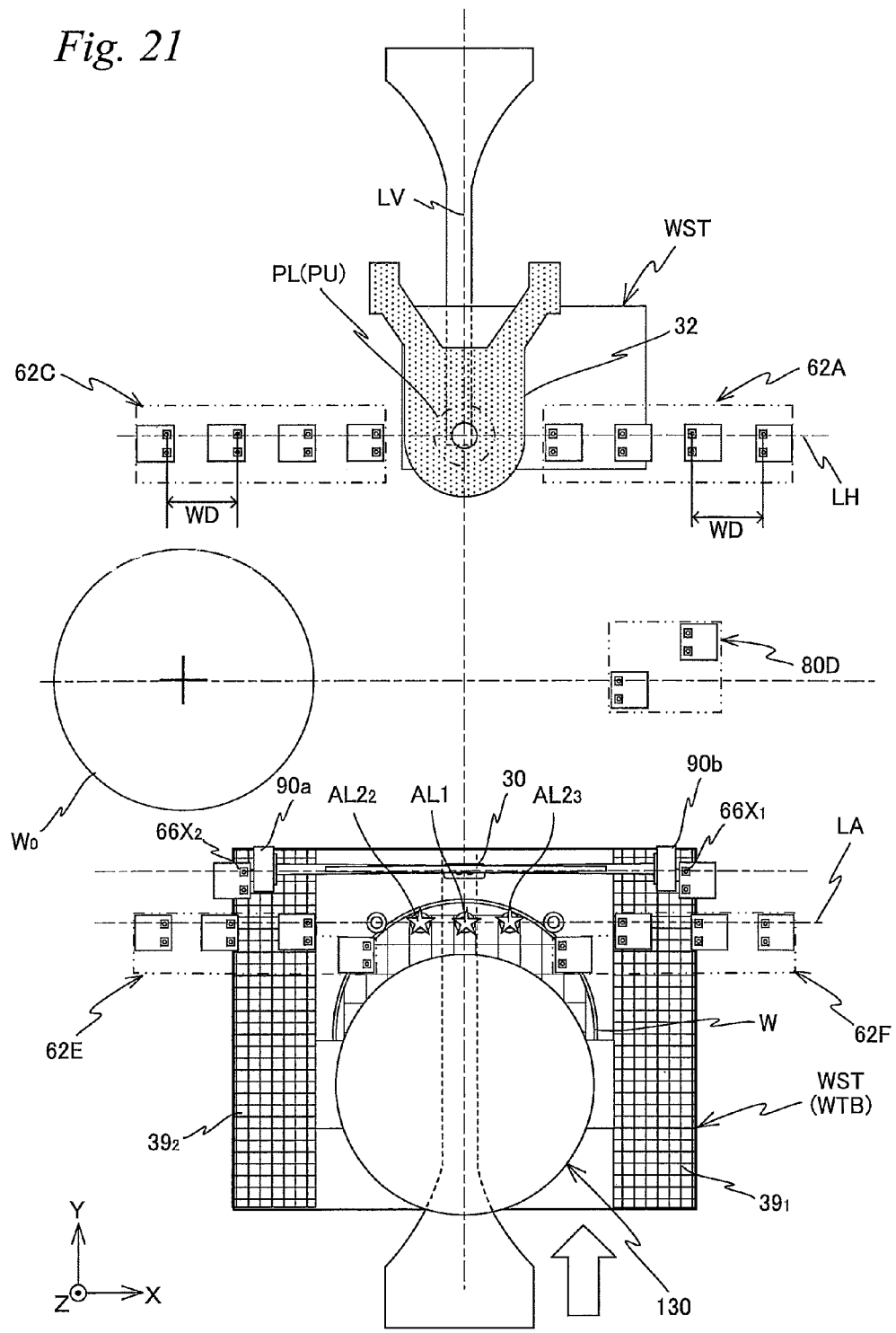
FIG. 21 is a view (No. 3) used to describe a concurrent processing operation using wafer stage WST and measurement stage MST.

Then, during the movement toward the +Y direction, when wafer stage WST reaches the position shown in FIG. 21, that is, a position where a detection beam from light transmitting system 90a is irradiated on measurement plate 30, main controller 20 stops wafer stage WST, and begins to perform the first half processing of focus calibration.

That is, while main controller 20 detects surface position information (Z position information of scales $39_1$ and $39_2$) at the end on one side and the other side in the X-axis direction of wafer table WTB detected by the pair of XZ heads $66X_1$ and $66X_2$ of the third top side encoder system 80C previously described, with a reference plane obtained from such information serving as a reference, main controller 20 detects surface position information of the surface of measurement plate 30 previously described, using the multi-point AF system (90a, 90b). From this detection, a relation is obtained between measurement values (the surface position information at the end on one side and the other side in the X-axis direction of wafer table WTB) of the pair of XZ heads $66X_1$ and $66X_2$ in a state where the center line of wafer table WTB coincides with reference axis LV previously described, and the detection results (surface position information) at a detection point (a detection point located at the center or near the center among a plurality of detection points) on the surface of measurement plate 30 of the multi-point AF system (90a, 90b).

Further, in the present embodiment, because the position of wafer table WTB where the first half processing of focus calibration described above is performed coincides with the position of wafer table WTB where processing of detecting the three first alignment marks is performed, main controller 20 detects the three first alignment marks (refer to the star marks in FIG. 21) almost simultaneously and individually using primary alignment system AL1, and secondary alignment systems $AL2_2$ and $AL2_3$, concurrently with the first half processing of focus calibration, and then associates the detection results of the three alignment systems AL1, $AL2_2$, and $AL2_3$ described above with the measurement values of the second fine movement stage position measurement system 110B at the time of detection, and stores the information in memory which is not shown. Incidentally, the simultaneous detection of the three first alignment marks in this case is performed by varying the Z position of wafer table WTB, while changing the relative positional relation in the Z-axis direction (focus direction) between the plurality of alignment systems AL1, $AL2_1$ to $AL2_4$, and wafer W mounted on wafer table WTB. The detection of alignment marks arranged in each alignment shot area from the second and subsequent alignment shot areas described below is also performed in a similar manner.

Incidentally, in the case the position of wafer table WTB where the first half processing of focus calibration is performed does not coincide with the position of wafer table WTB where processing of the detection of the first alignment mark is performed, main controller 20 can sequentially perform these processing according to the order in which wafer table WTB reaches the position where each of the processing is performed.

Next, main controller 20 begins movement (for example, step movement toward a position where alignment marks arranged in five second alignment shot areas (hereinafter shortly referred to as second alignment marks) are detected) of wafer stage WST in the +Y direction.

Figure 22:
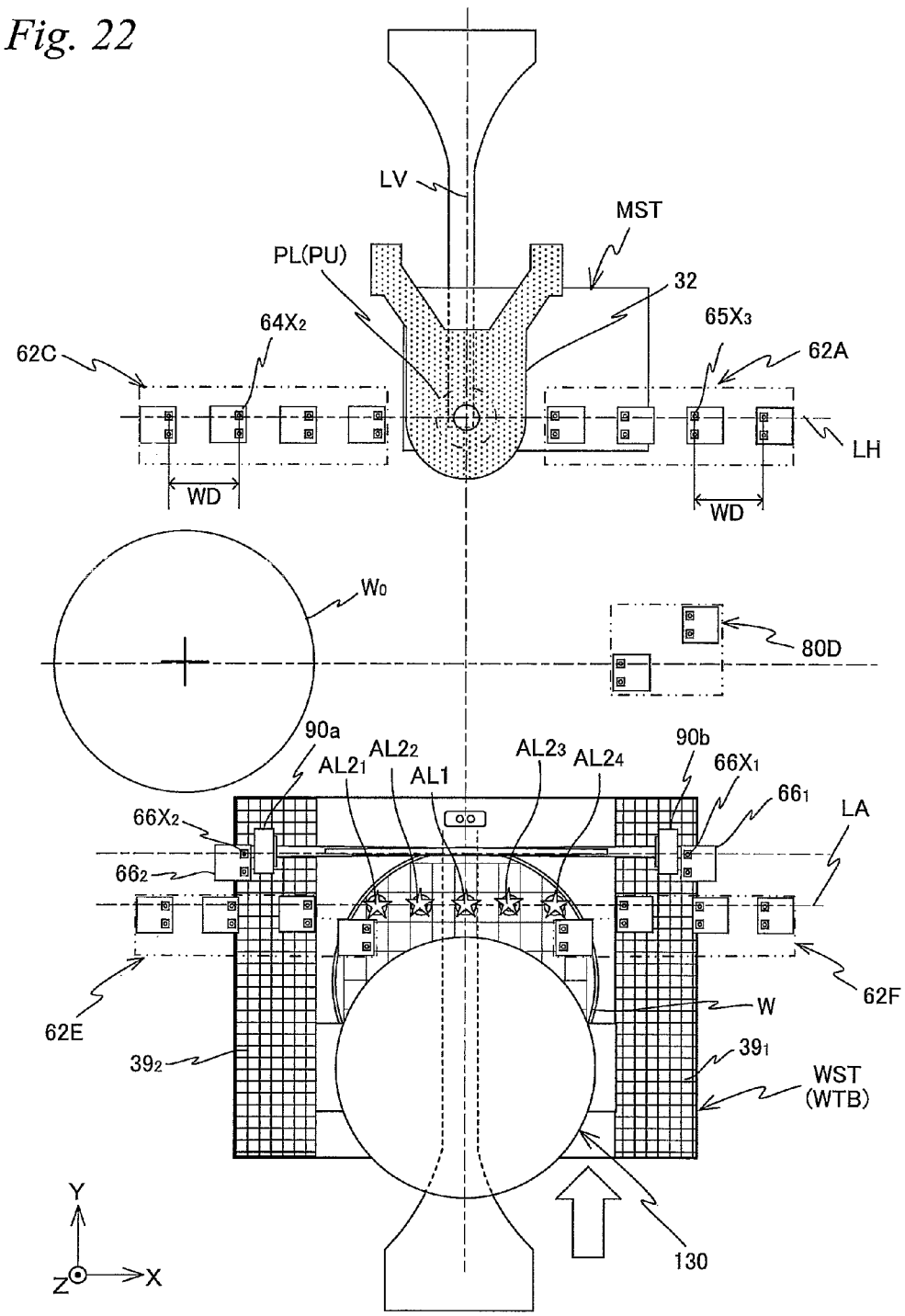
FIG. 22 is a view (No. 4) used to describe a concurrent processing operation using wafer stage WST and measurement stage MST.
Figure 23:
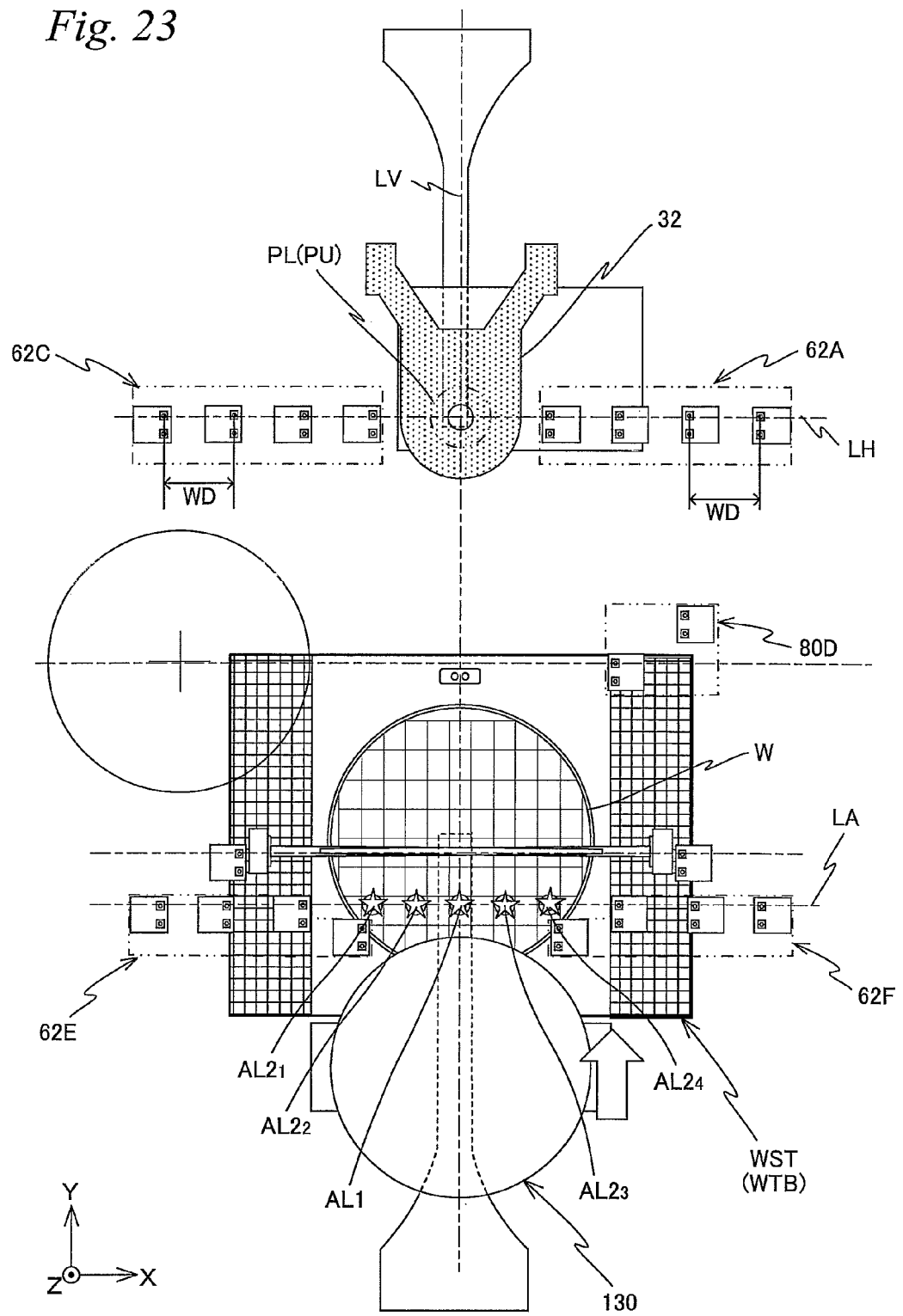
FIG. 23 is a view (No. 5) used to describe a concurrent processing operation using wafer stage WST and measurement stage MST.

Then, when wafer stage WST moves further in the +Y direction, and reaches the position shown in FIG. 22, main controller 20 detects the five second alignment marks almost simultaneously and individually using the five alignment systems AL1, and $AL2_1$ to $AL2_4$ (refer to the star marks in FIG. 22), and then associates the detection results of the five alignment systems AL1, and $AL2_1$ to $AL2_4$ described above with the measurement values of the second fine movement stage position measurement system 110B at the time of detection, and stores the information in memory which is not shown.

Further, in the present embodiment, as shown in FIG. 22, at this position to detect the second alignment marks, the detection beam from light transmitting system 90a begins to hit wafer W. And then, after the detection of the second alignment marks, main controller 20 begins focus mapping, using the four-spindle heads $66_1$ and $66_2$ of the third top side encoder system 80C and the multi-point AF system (90a, 90b).

Now, focus mapping performed in exposure apparatus 100 related to the present embodiment will be described. On this focus mapping, main controller 20, as shown in FIG. 22, for example, controls the position of wafer table WTB within the XY-plane, based on the measurement values of the two four-spindle heads $66_1$ and $66_2$ of the third top side encoder system 80C that face scales $39_1$ and $39_2$, respectively. In this state shown in FIG. 22, a straight line (center line) parallel to the Y-axis which passes through the center of wafer table WTB (substantially coincides with the center of wafer W) coincides with reference axis LV.

And, in this state, while wafer stage WST is proceeding toward the +Y direction, main controller 20 takes in position information related to the Y-axis and the Z-axis directions of both ends (the pair of the second water repellent plates 28b) in the X-axis direction of wafer table WTB surface (plate 28 surface) measured by each of the two four-spindle heads $66_1$ and $66_2$, and position information (surface position information) related to the Z-axis direction of the wafer W surface at the plurality of detection points detected by the multi-point AF system (90a, 90b) at a predetermined sampling interval, makes the position information related to the Y-axis and the Z-axis directions and the position information related to the Z-axis direction that have been taken in correspond to each other, and then stores the information in memory which is not shown.

Then, when the detection beam of the multi-point AF system (90a, 90b) moves off wafer W, main controller 20 completes the sampling described above, and converts the surface position information for each detection point of the multi-point AF system (90a, 90b) into data, which uses as a reference the position information related to the Z-axis direction measured by each of the two four-spindle heads $66_1$ and $66_2$ that has been taken in simultaneously.

To describe this further in detail, surface position information at a predetermined point (corresponding to a point on substantially the same X-axis as the arrangement of the plurality of detection points of the multi-point AF system (90a, 90b): hereinafter, referring to this point as a left measurement point) on an area (the second water repellent plate 28b on which scale $39_2$ is formed) near the −X side edge of plate 28 is obtained, based on measurement values of the Z position of one of the four-spindle heads $66_2$. Further, surface position information at a predetermined point (corresponding to a point on substantially the same X-axis as the arrangement of the plurality of detection points of the multi-point AF system (90a, 90b): hereinafter, referring to this point as a right measurement point) on an area (the second water repellent plate 28b on which scale $39_1$ is formed) near the +X side edge of plate 28 is obtained, based on measurement values of the Z position of the other four-spindle head $66_1$. Then, main controller 20 converts the surface position information at each detection point of the multi-point AF system (90a, 90b) to surface position data which uses a straight line formed by connecting the surface position of the left measurement point and the surface position of the right measurement point (hereinafter referred to as a table surface reference line) as a reference. Main controller 20 performs such a conversion on all of the information taken in at the time of sampling.

Here, in exposure apparatus 100 related to the present embodiment, concurrently with the measurement by the third top side encoder system 80C described above, measurement of position information of wafer table WTB (fine movement stage WFS) in the Y-axis direction, the Z-axis direction, and the θy direction (and the θz direction) is possible by the third back side encoder system 70C. Therefore, at the same timing as taking in position information related to the Y-axis and the Z-axis directions on both ends in the X-axis direction of the wafer table WTB surface (surface of plate 28) measured by each of the two four-spindle heads $66_1$ and $66_2$ described above, and position information (surface position information) related to the Z-axis direction of the wafer W surface at a plurality of detection points detected by the multi-point AF system (90a, 90b), main controller 20 also takes in measurement values related to position in each of the directions (Y, Z, and θy (and θz)) described above measured by the third back side encoder system 70C. Then, main controller 20 obtains a relation between the data (Z, θy) of table surface reference line obtained from the measurement information of the third top side encoder system 80C and the measurement information (Z, θy) of the third back side encoder system 70 which were simultaneously taken in. This allows the surface position data described above which uses the table surface reference line as a reference to be converted to surface position data which uses a reference line (hereinafter called a rear surface measurement reference line for the sake of convenience) that corresponds to the table surface reference line described above and is decided by the Z position and θy rotation of wafer table WTB obtained by the rear surface measurement.

By acquiring the conversion data described above in advance in the manner described above, for example, on exposure and the like, the wafer table WTB surface (a point on the second water repellent plate 28b on which scale $39_2$ is formed, and a point on the second water repellent plate 28b on which scale $39_1$ is formed) is measured with XZ heads 64X and 65X previously described, and the Z position and tilt (mainly θy rotation) with respect to the XY-plane of wafer table WTB are calculated. By using the Z position and the tilt with respect to the XY-plane of wafer table WTB which have been calculated and the surface position data (surface position data which uses the table surface reference line as a reference) previously described, it becomes possible to perform surface position control of wafer W, without actually obtaining the surface position information of the wafer W surface. Accordingly, because there are no problems when the multi-point AF system is placed at a position distanced from projection optical system PL, focus mapping of the present embodiment can be suitably applied even when the working distance (spacing between projection optical system PL and wafer W at the time of exposure) of the exposure apparatus is small.

The description so far is based on a premise that there is no unevenness on the wafer table WTB surface. However, actually, the surface of wafer table WTB, namely the surface of the second water repellent plate 28b on which scale $39_2$ is formed, the surface of the second water repellent plate 28b on which scale $39_1$ is formed and the like, are uneven. However, even if the surface of wafer table WTB is uneven as such, at points on a meridian of wafer W (a straight line passing through the wafer center parallel to the Y-axis), surface position control is possible at an extremely high precision.

The reason for this is because the shot area positioned on the meridian of wafer W when focus mapping is performed (while wafer stage WST is moving in the +Y direction) on exposure and the like is to be placed at the exposure position (below projection optical system PL), without wafer stage WST (wafer table WTB) being moved in the X-axis direction when compared with the time of focus mapping. When the shot area on the meridian reaches the exposure position, XZ head $65X_3$ whose detection point is placed at substantially the same X position as XZ head $66X_1$ and XZ head $64X_2$ whose detection point is placed at substantially the same X position as XZ head $66X_2$ are to detect surface position information at substantially the same point as the point on wafer table WTB whose surface position information was detected by each of XZ head $66X_1$ and XZ head $66X_2$ at the time of focus mapping. That is, a reference surface (a surface formed by continuously joining the table surface reference line in the Y-axis direction) measured by the pair of XZ heads, serving as a reference when detecting surface position information by the multi-point AF system (90a, 90b) becomes the same at the time of focus mapping and at the time of exposure. Therefore, even if the surface of wafer table WTB is uneven or has waviness, when the shot area on the meridian is exposed, because focus control of the wafer at the time of exposure can be performed without taking into consideration the unevenness and waviness, using the Z position obtained at the time of focus mapping as the Z position without any changes, focus control with high precision can be performed.

Similarly, when the shot area on the meridian reaches the exposure position, three-dimensional head 73a whose detection point is set on the same straight line (reference axis LV) parallel to the Y-axis as the detection point of YZ head 77a, and three-dimensional head 73b whose detection point is set on the same straight line parallel to the Y-axis as the detection point of YZ head 77b are to detect the Z position at the same point as a point on grating RG where the YZ head and the YZ head each detected the surface position information at the time of focus mapping, and based on the detection results, calculation of Z and θy is to be performed. That is, a surface formed by continuously joining the rear surface measurement reference line previously described in the Y-axis direction (hereinafter referred to as a rear surface measurement reference surface), which serves as a reference when detecting surface position information using the multi-point AF system (90a, 90b), is to be calculated, based on a measurement value of the Z position at the same point at the time of focus mapping and exposure.

When exposing a shot area other than the shot area on the meridian, in the case there are no unevenness and waviness on the surface of wafer table WTB, while focus control accuracy of around the same level as in the exposure of the shot area on the meridian described above can be secured, in the case there are unevenness, waviness, and the like on the surface of wafer table WTB, the focus control accuracy depends on the accuracy of a traverse checking which will be described later on.

Incidentally, in the present embodiment, because the detection beam from light transmitting system 90a begins to hit wafer W when wafer stage WST reaches the position for detecting the second alignment marks, focus mapping was made also to start at the position. However, in the case the detection beam from light transmitting system 90a begins to hit wafer W prior to, or after wafer stage WST has reached the position for detecting the second alignment marks, focus mapping can be started prior to, or after detecting the second alignment mark, at the point when the detection beam begins to hit wafer W.

The description now returns to describing the concurrent operation. When wafer stage WST moves in the +Y direction for the focus mapping described above, and reaches the position shown in FIG. 23, main controller 20 stops wafer stage WST at the position. Then, for example, using the five alignment systems AL1, and $AL2_1$ to $AL2_4$, main controller 20 detects alignment marks arranged in five third alignment shot areas (hereinafter shortly referred to as third alignment marks) (refer to the star marks in FIG. 23) almost simultaneously and individually, associates the detection results of the five alignment systems AL1, and $AL2_1$ to $AL2_4$ described above with the measurement values of the second fine movement stage position measurement system 110B at the time of detection, and stores the information in memory which is not shown. Further, focus mapping is still being continued at this point.

Next, main controller 20, for example, begins to move wafer stage WST in the +Y direction, toward a position for detecting alignment marks provided in three fourth alignment shot areas (hereinafter shortly referred to as fourth alignment marks). At this point, focus mapping is being continued.

Figure 24:
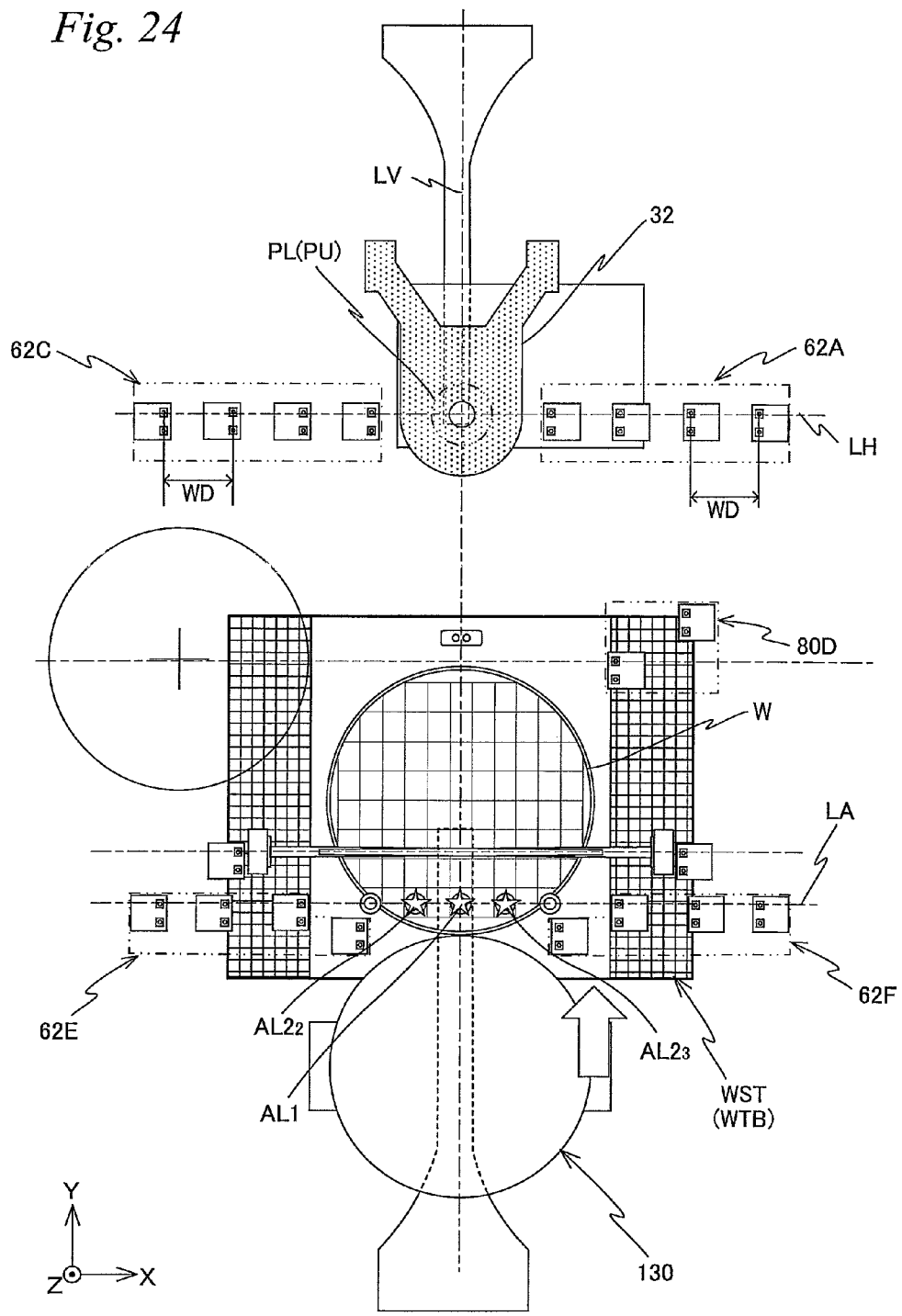
FIG. 24 is a view (No. 6) used to describe a concurrent processing operation using wafer stage WST and measurement stage MST.

Then, when wafer stage WST reaches the position shown in FIG. 24, main controller 20 immediately stops wafer stage WST, detects the three fourth alignment marks (refer to the star marks in FIG. 24) on wafer W almost simultaneously and individually, using primary alignment system AL1, and secondary alignment systems $AL2_2$ and $AL2_3$, and associates the detection results of the three alignment systems AL1, $AL2_2$, and $AL2_3$ above with the measurement values of the second fine movement stage position measurement system 110B at the time of detection, and stores the information in memory which is not shown.

Then, main controller 20 performs a statistical calculation based on an EGA method disclosed in, for example, U.S. Pat. No. 4,780,617, using the detection results of a total of 16 alignment marks obtained in the manner described above and the corresponding measurement values of the second fine movement stage position measurement system 110B, and calculates an EGA parameter (X offset, Y offset, orthogonal degree, wafer rotation, wafer X scaling, wafer Y scaling and the like).

Figure 27:
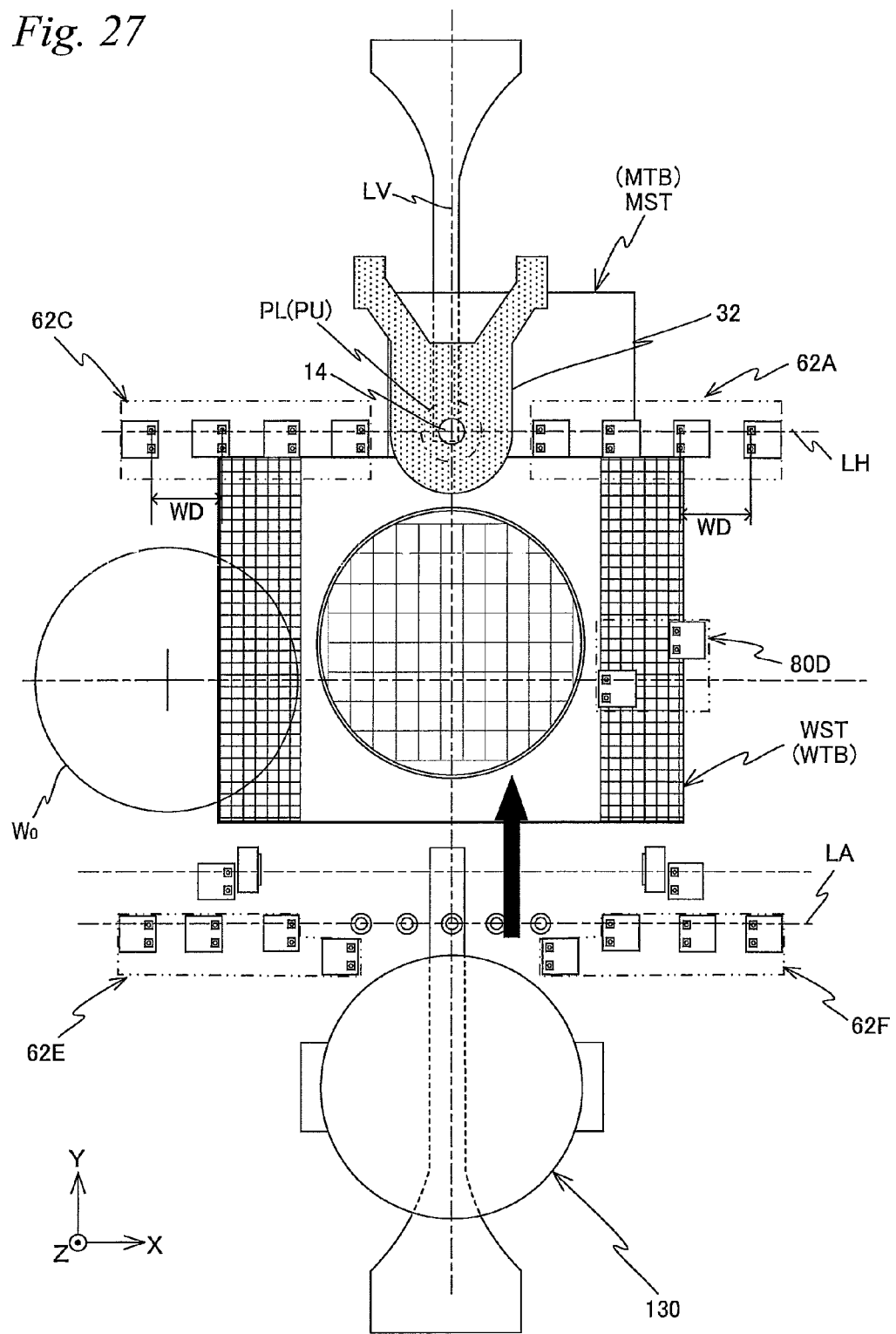
FIG. 27 is a view (No. 9) used to describe a concurrent processing operation using wafer stage WST and measurement stage MST.

After wafer alignment (processing until position measurement of at least the fourth alignment marks) described above has been completed, main controller 20 moves wafer stage WST to a position shown in FIG. 27, that is, to a starting position of a state where wafer stage WST and measurement stage MST are in contact, or for example, are approaching each other with a separation distance of around 300 μm in between (hereinafter, referred to as an in contact or proximity state) in the Y-axis direction. This movement is performed by main controller 20 moving wafer stage WST at a high speed with long strokes at once in the +Y direction, in a state where wafer table WTB does not come into contact with the liquid. Further, during this movement, because wafer stage WST moves away from the measurement range of the second fine movement stage position measurement system 110B, prior to this, main controller 20 switches the measurement system used for servo control of the position of wafer table WTB from the second fine movement stage position measurement system 110B to the fourth top side encoder system 80D.

Figure 25:
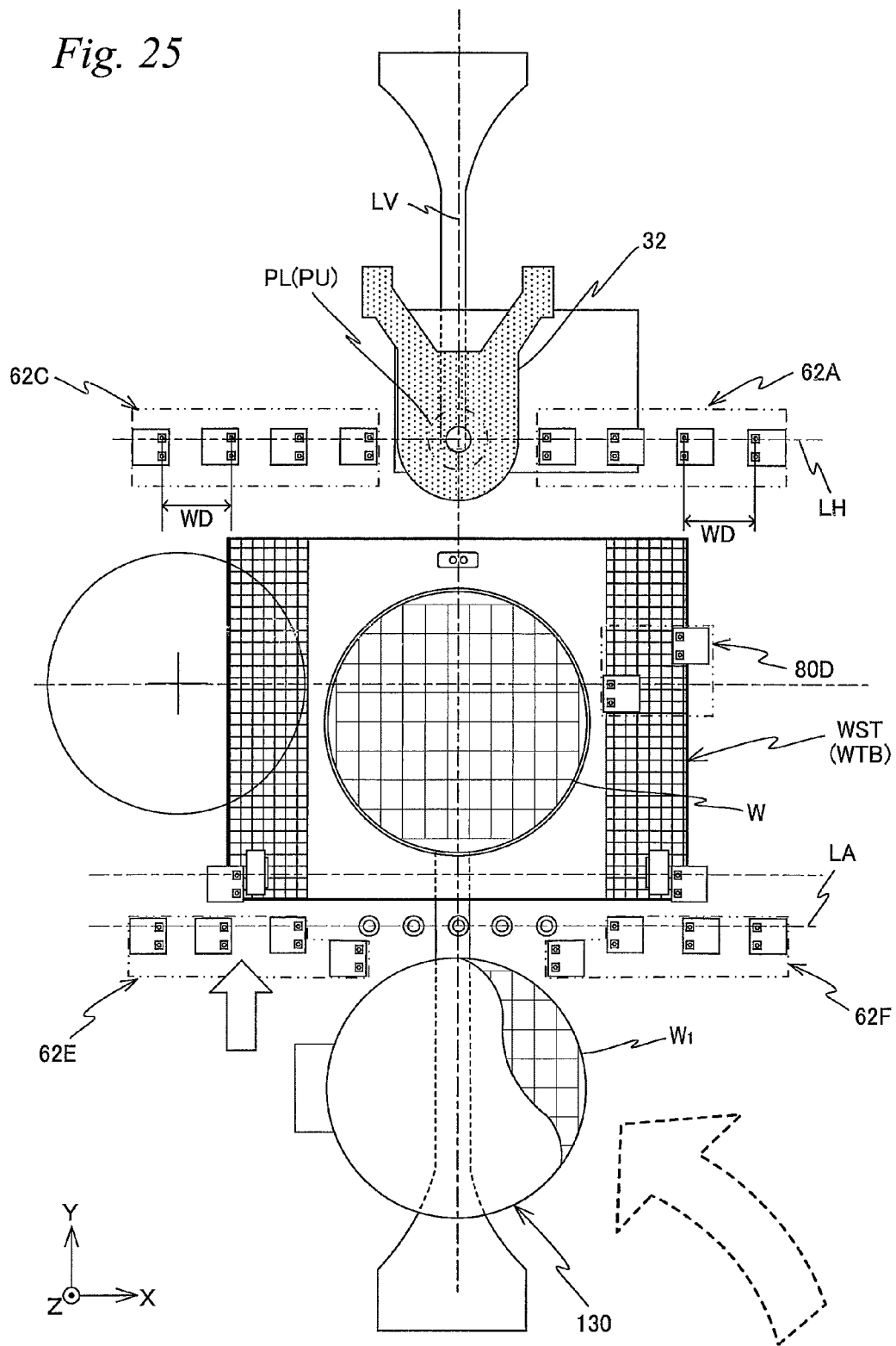
FIG. 25 is a view (No. 7) used to describe a concurrent processing operation using wafer stage WST and measurement stage MST.

Immediately after wafer stage WST begins to be moved at a high speed with long strokes in the +Y direction as described above, main controller 20 continues focus mapping. Then, when the detection beam from the multi-point AF system (90a, 90b) moves away from the wafer W surface, main controller 20 completes focus mapping, as shown in FIG. 25.

During the processing (hereinafter referred to as a stream processing) described above in which alignment measurement and focus mapping are performed while wafer stage WST is moved in a straight line in the +Y direction, in a manner similar to refreshing the coordinate system of the first back side encoder system 70A and refreshing the coordinate system of the first top side encoder system 80A previously described, main controller 20 performs refreshing the coordinate system of the second back side encoder system 70B and refreshing the coordinate system of the second top side encoder system 80B.

Now, at the time of alignment and the like, posture of wafer table WTB at measurement station 300 is controlled by the second back side encoder system 70B. However, for the same reasons as in the first back side encoder system 70A described earlier, long-term stability in directions of six degrees of freedom of the coordinate system of the second back side encoder system 70B cannot be expected. However, global variation of position in the θy direction (rolling amount) and position in the θz direction (yawing amount) affects results of the alignment measurement. Therefore, at the point when the stream processing has been completed during the movement of wafer stage WST at a high speed with long strokes in the +Y direction as described above, main controller 20 begins a post stream processing which will be described below, and performs alignment calculation using the results of this post stream processing (computing the array coordinates of all of the shot areas on the wafer using the EGA parameter), and correction of the rear surface measurement reference surface included in the focus mapping results.

Here, post stream processing refers to a calculation processing in which error factor parameters a. to c. described below included in the EGA results and the results of focus mapping are replaced with an offset in the θy, θz, and X-axis direction scaling which will be described below in d.

a. a global θy offset: position in the θy direction (θy rotation amount) of the wafer table obtained by rear surface measurement using the third back side encoder system 70C included in the focus mapping result b. a global θz offset: orthogonal degree/wafer rotation included in the EGA parameter c. a global X-axis direction scaling offset: X-axis direction scaling of the wafer included in the EGA parameter d. a θy, θz and X-axis direction scaling offset computed from an average of all data observed by the second top side encoder system 80B and the third top side encoder system 80C during a streaming processing Here, in X-axis direction scaling, the distance (axis interval) between XZ heads $67X_2$ and $68X_2$ or XZ heads $67X_3$ and $68X_3$ used for alignment measurement is considered invariable, and with this as a reference, the grating interval of scales $39_1$ and $39_2$ of the second top side encoder system 80B compared and adjusted to the coordinate system of the second back side encoder system 70B is measured by XZ heads $67X_2$ and $68X_2$ or $67X_3$ and $68X_3$, and the magnification of the grating interval with respect to the reference described above is to be the X-axis direction scaling.

By the post stream processing performed in the manner described above, as a consequence, the posture of wafer table WTB is not reset using the measurement results of a specific point on scales $39_1$ and $39_2$, and an averaged posture of wafer table WTB obtained from an average of the measurement results of the entire surface of scales $39_1$ and $39_2$ is to be used for alignment calculation (calculation of array coordinates of all shot areas on a wafer using an EGA calculation formula whose orthogonal degree/wafer rotation and X-axis direction scaling of the wafer of the EGA parameters have been replaced to the θz and the X-axis direction scaling described in d. above). Results of this alignment calculation are more reliable than in the case of resetting the posture using the measurement results at one specific point on scales $39_1$ and $39_2$, due to an averaging effect.

The reasons for not performing position measurement of the θz direction and θy direction using only the top side encoder system in the streaming processing are described in e. to h. below.

e. When only the top side encoder is used, alignment (and focus mapping) is performed only by the top side encoder system, while exposure is performed mainly by the back side encoder system, and the references for both systems (although being compared and adjusted) will be completely separated.

f. It is considered better to use the back side encoder system also for alignment even only in the narrow strip-shaped part (a strip-shaped part of the same width as the interval in the X-axis direction of the detection points of the three-dimensional heads 75a and 75b).

g. Accuracy can be expected in processing of refreshing the coordinate system of the back side encoder system. As a consequence, an accurate grid and a flat plane can be constantly maintained. In this case, even in the measurement of the narrow strip-shaped part, the back side encoder system should serve as a reference as long as the θy and θz offsets can be removed.

h. Although the top side encoder system reflects the information of the back side encoder system, the accuracy is not complete.

Next, traverse checking will be described. First of all, an error factor unique to the stream processing which is the main factor of requiring a traverse checking will be described.

In the stream processing, as is obvious from the description above, because wafer stage WST moves on a straight line parallel to the Y-axis, position information (X,Y,Z) of the wafer table (fine movement stage WFS) at different points in the X-axis direction cannot be obtained. Accordingly, also in refreshing the coordinate system of the second back side encoder system 70B, $\Delta X/\delta x$, $\Delta Y/\delta x$, and $\Delta Z/\delta x$ previously described cannot be obtained. That is, while at the time of exposure, the coordinate system is updated as a whole in real time by refreshing the coordinate system of the first back side encoder system 70A previously described, and the grid error is corrected in real time in the whole coordinate system, at the time of alignment, even if refreshing the coordinate system of the second back side encoder system 70B is performed, the coordinate system updated only on the straight line in the Y-axis direction passing through the center in the X-axis direction of the wafer, and as a consequence, the grid error is corrected in real time only on the straight line. As a consequence, an error occurs between the alignment-time coordinate system which controls the position of the wafer stage at the time of alignment and the exposure-time coordinate system which controls the position of the wafer stage at the time of exposure. That is, this is the error factor unique to the stream processing.

Therefore, main controller 20 performs the traverse checking described below, at a frequency determined in advance (at a necessary frequency), while 25 or 50 wafers in a lot is being processed.

Figure 28:
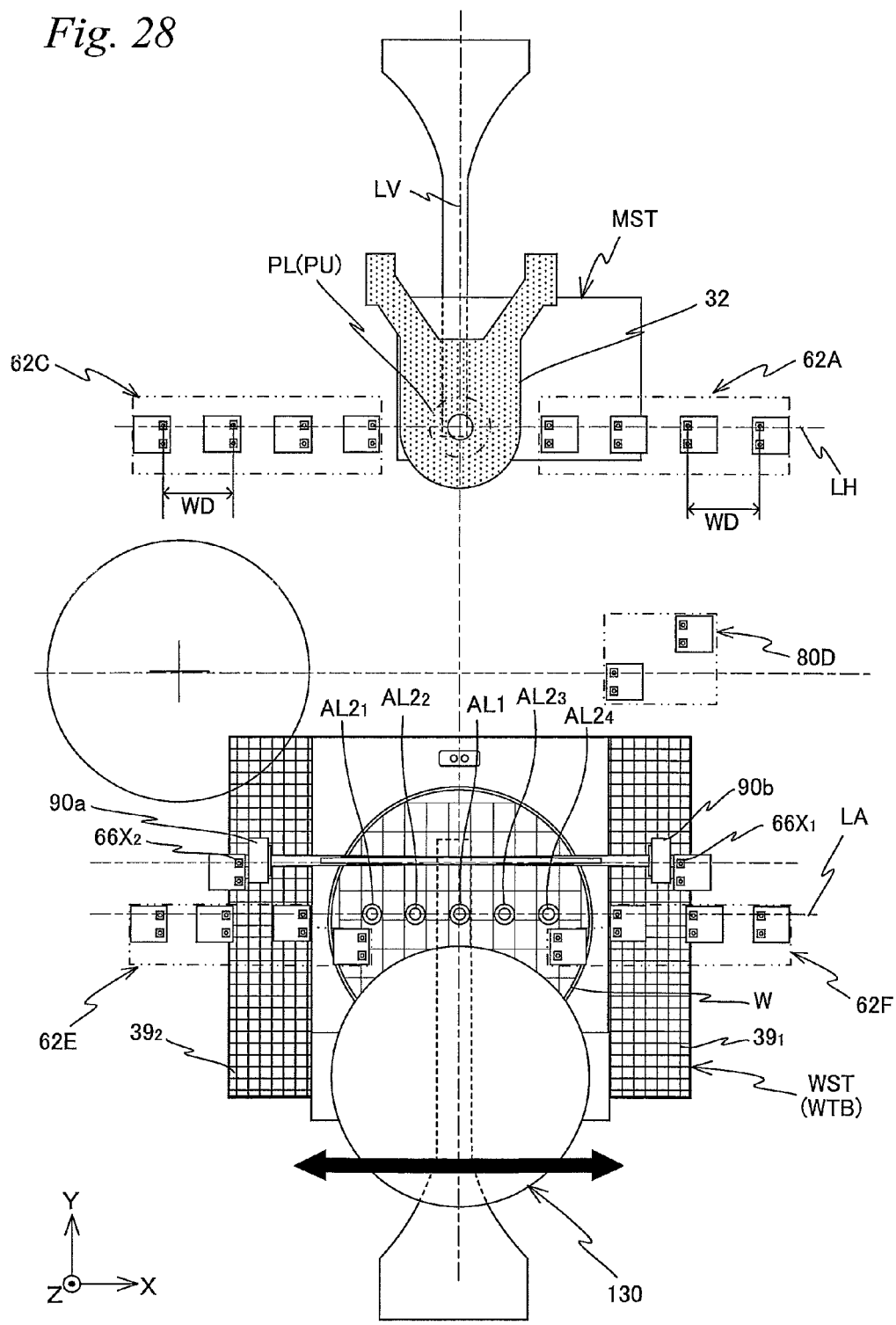
FIG. 28 is a view (No. 10) used to describe a concurrent processing operation using wafer stage WST and measurement stage MST, and to describe traverse checking.

On the traverse checking, during the stream processing described above, when wafer stage WST reaches a position in the Y-axis direction, for example, as shown in FIG. 28, main controller 20, while controlling the position of wafer table WTB in directions of six degrees of freedom and stepping and driving wafer stage WST in the X-axis direction within a predetermined range (within a range where the center line of wafer table WTB moves in the X-axis direction within a predetermined width (a width larger than the width of scales $39_1$ and $39_2$ and the distance between the mutual detection areas of alignment systems $AL2_1$ and $AL2_4$) whose center is at reference axis LV), based on the measurement values of the second fine movement stage position measurement system 110B, and measures the same alignment mark positioned near the center of wafer W sequentially, using the five alignment systems AL1, and $AL2_1$ to $AL2_4$. Further, during the movement of wafer stage WST in the X-axis direction described above, main controller 20 simultaneously takes in measurement values of the pair of XZ heads $66X_1$ and $66X_2$ which detect the surface position information of the surface area (the surface of scales $39_1$ and $39_2$) of the pair of the second water repellent plates 28b of wafer table WTB, and detection values of the surface position information of wafer W by the multi-point AF system (90a, 90b), at a predetermined sampling interval.

By such traverse checking, a relation between the coordinate system of the second fine movement stage position measurement system 110B (the coordinate system of the second top side encoder system 80A and the coordinate system of the second back side encoder system 70A), and the multi-point AF system (90a, 90b) and alignment systems AL1 and $AL2_1$ to $AL2_4$ can be calibrated. Specifically, the details are shown below.

A. By moving wafer stage WST in the X-axis direction within the predetermined range described above, position information (X,Y,Z) at different points in the X-axis direction of wafer table WTB (fine movement stage WFS) can be obtained, and also in refreshing the coordinate system of the second back side encoder system 70B, obtaining $\Delta X/\delta x$, $\Delta Y/\delta x$, and $\Delta Z/\delta x$ previously described becomes possible, and as a consequence, results of refreshing the coordinate system of the second back side encoder system 70B, and results of refreshing the coordinate system of the second top side encoder system 80B based on the refreshing will have better accuracy.

B. By measuring the same alignment mark positioned near the center of wafer W as described above, a positional relation between the detection center of primary alignment system AL1 and the detection center of the secondary alignment systems $AL2_1$ to $AL2_4$, or in other words, a base line of the secondary alignment systems $AL2_1$ to $AL2_4$ is obtained on the coordinate system of the second fine movement stage position measurement system 110B.

C. A relation between surface position information of each detection point of the multi-point AF system (90a, 90b) and measurement values (surface position information) of the pair of XZ heads $66X_1$ and $66X_2$ simultaneously taken in is obtained at a different sampling timing, and from a plurality of relations obtained, the unevenness in the X-axis direction of the surface of scales $39_1$ and $39_2$ is obtained on the coordinate system of the second fine movement stage position measurement system 110B. However, in order to accurately obtain the unevenness in the X-axis direction of the surface of scales $39_1$ and $39_2$, an offset between sensors has to be adjusted in advance in the multi-point AF system (90a, 90b).

Then, main controller 20, at the time of exposure to be described later on, performs positioning of wafer table WTB to the exposure position using the base line of the secondary alignment systems $AL2_1$ to $AL2_4$ described above, along with performing focus control of wafer W while adding the unevenness information and the like in the X-axis direction of the scale surface as a correction amount.

That is, in the present embodiment, main controller 20 corrects the position error of wafer table WTB described above caused by the unique error factor which occurs on the stream processing, by actually moving wafer stage WST in the X-axis direction, in the manner described above.

Concurrently with the post stream processing previously described, as shown in a broken line arrow in FIG. 25, an operation of carrying a next wafer (refer to as wafer $W_1$) to a position under chuck unit 120 previously described is performed in the order described below.

Figure 26A:
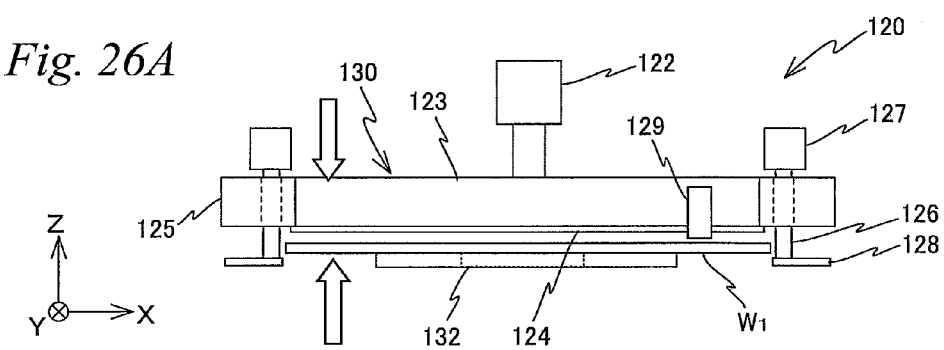
FIGS. 26A to 26D are views (No. 8) used to describe a concurrent processing operation using wafer stage WST and measurement stage MST, and to describe an operation of carrying in a next wafer to an area below a chuck unit.

As a premise of beginning to carry in the wafer, as shown in FIG. 25, wafer stage WST on which wafer W before exposure is mounted is to be at a position (a position on the +Y side of loading position LP) which is completely away from loading position LP. Further, at this point, the pair of support plates 128 is at the second rotating position previously described, as shown in FIG. 26A.

First of all, main controller 20 drives a wafer carrier arm 132, and carries the new (before exposure) wafer $W_1$ from an external device to a space between a pair of drive shafts 126 below Bernoulli chuck 124 located at loading position LP (refer to FIG. 26A).

Next, main controller 20 controls drive section 122 of chuck unit 120 and wafer carrier arm 132, and drives (refer to outlined arrows in FIG. 26A) at least one of chuck main section 130 and wafer carrier arm 132 in the Z-axis direction so that a distance between Bernoulli chuck 124 and the new wafer $W_1$ is set to a predetermined distance, such as, for example, to around several μm. At this point, the distance between Bernoulli chuck 124 and the new wafer $W_1$ is measured by a gap sensor which is not shown described above.

Figure 26B:
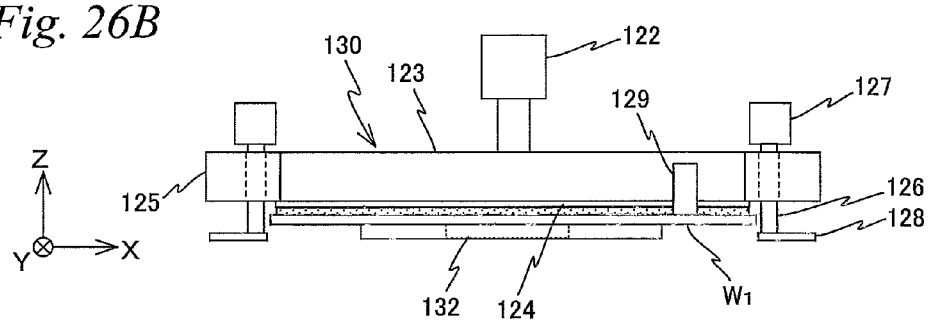

When Bernoulli chuck 124 and the new wafer $W_1$ are distanced by a predetermined distance, main controller 20 adjusts the flow velocity of air blown out from Bernoulli chuck 124 so as to maintain the predetermined distance (gap) between Bernoulli chuck 124 and the new wafer $W_1$, as shown in FIG. 26B. This allows Bernoulli chuck 124 to hold wafer $W_1$ by suction in a non-contact manner from above via a predetermined clearance gap (gap, clearance) of around several μm. When Bernoulli chuck 124 holds wafer $W_1$ by suction, the temperature of wafer $W_1$ is adjusted to a predetermined temperature via cool plate 123.

Figure 26C:
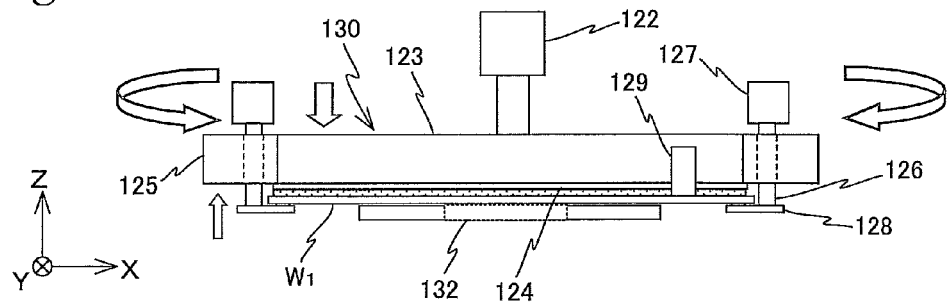

When wafer $W_1$ is held by suction by Bernoulli chuck 124, main controller 20, as shown in FIG. 26C, rotates the pair of support plates 128 integrally with shaft 126 to the first rotating position via the pair of vertical movement rotation driving sections 127, and also relatively drives chuck main section 130 and the pair of support plates 128 by a predetermined amount in the Z-axis direction so that chuck main section 130 and the pair of support plates 128 are driven in a direction approaching each other and the pair of support plates 128 come into contact and support the rear surface of wafer $W_1$.

Figure 26D:
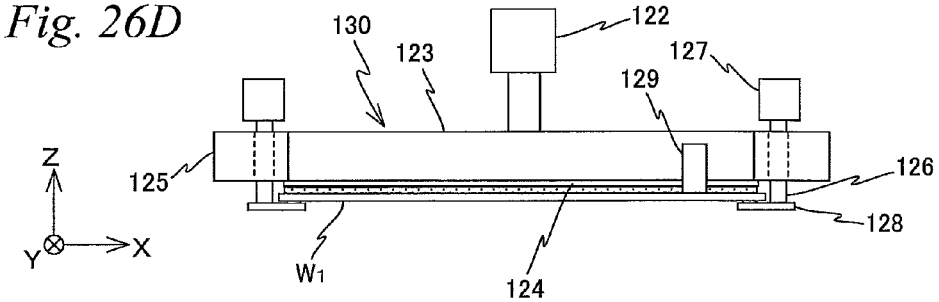

Then, main controller 20, as shown in FIG. 26D, separates wafer carrier arm 132 from wafer $W_1$, and withdraws wafer carrier arm 132 from loading position LP. At this point, the movement of the new wafer $W_1$ in directions of six degrees of freedom is limited by Bernoulli chuck 124 and the pair of support plates 128. Incidentally, the separation of wafer carrier arm 132 from wafer $W_1$ and the pair of support plates 128 coming into contact with wafer $W_1$ can be reversed in order. In any case, the support state of wafer $W_1$ is maintained until exposure of the preceding wafer W has been completed and wafer stage WST returns to loading position LP and the loading of wafer $W_1$ begins.

The description returns again to describing the concurrent processing operation. When wafer stage WST moves at a high speed with long strokes in the +Y direction as is previously described, and reaches the position shown in FIG. 27, measurement stage MST and wafer stage WST moves into a contact or a proximity state. In this contact or proximity state, the end on the −Y side of measurement table MTB and the end on the +Y side of wafer table WTB come into contact or approach each other. Main controller 20 drives both stages WST and MST in the +Y direction while maintaining the contact or proximity state. With this movement, the water of liquid immersion area 14 moves from an area on measurement table MTB to an area on wafer table WTB.

Figure 29:
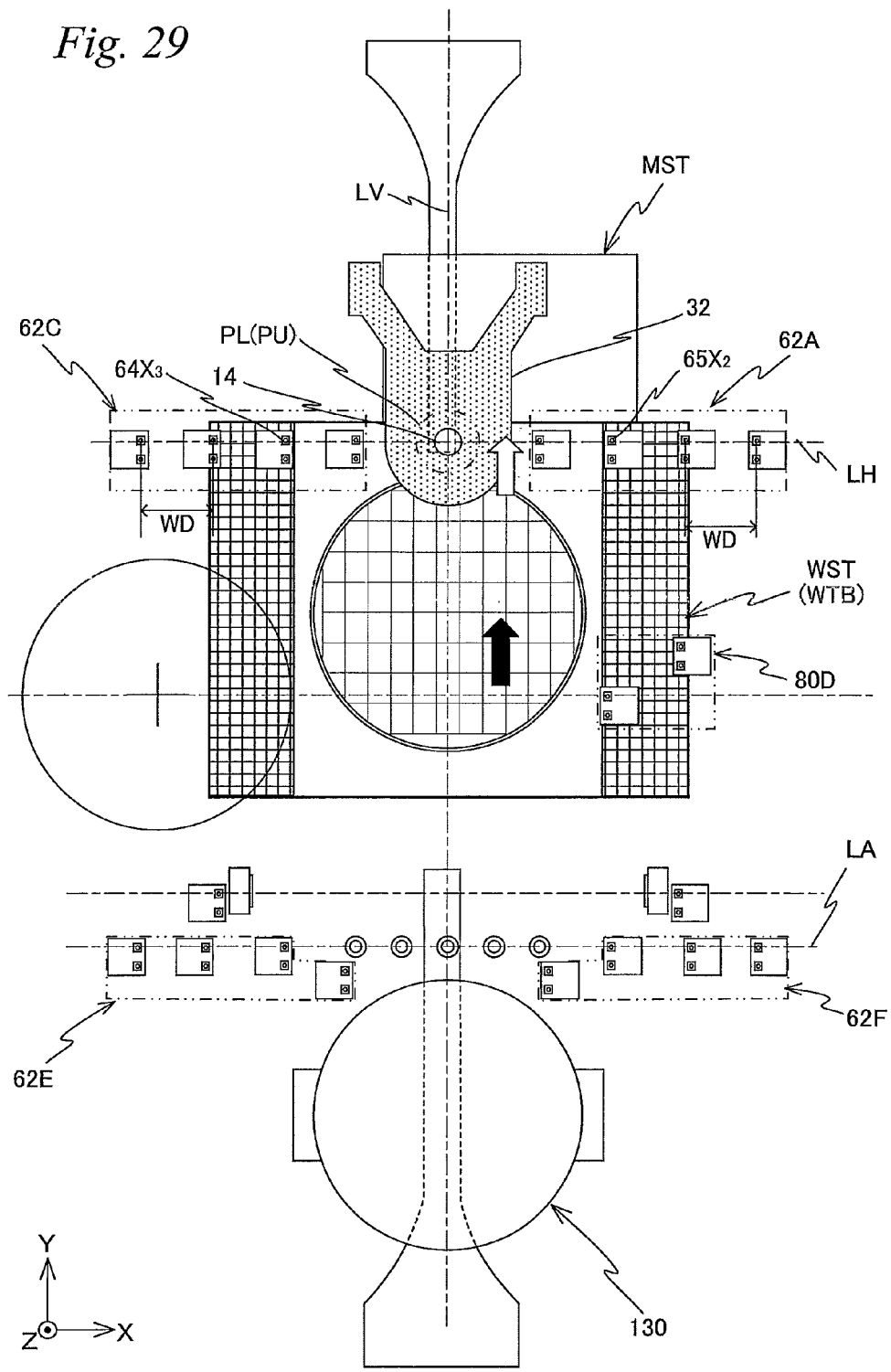
FIG. 29 is a view (No. 11) used to describe a concurrent processing operation using wafer stage WST and measurement stage MST.

Then when both stages WST and MST reach the position shown in FIG. 29 where measurement plate 30 is placed directly under projection optical system PL, main controller 20 stops both stages WST and MST, and performs the second half processing of Pri-BCHK and the second half processing of focus calibration.

Here, the second half processing of Pri-BCHK refers to a processing in which projection images (aerial images) of a pair of measurement marks on reticle R (or a mark plate which is not shown on reticle stage RST) projected by projection optical system PL are measured using aerial image measurement device 45 previously described that includes measurement plate 30. In this case, similar to the method disclosed in, for example, U.S. Patent Application Publication No. 2002/0041377, by an aerial image measurement operation of a slit scan method using the pair of aerial image measurement slit patterns SL, the aerial images of the pair of measurement marks are each measured, and the measurement results (the aerial image intensity corresponding to the XY position of wafer table WTB) are stored in memory. On this second half processing of Pri-BCHK, the position of wafer table WTB within the XY-plane is measured and controlled based on measurement values of the first fine movement stage position measurement system 110A.

Further, the second half processing of focus calibration refers to a processing of measuring the aerial images of the measurement marks on reticle R by a slit scan method using aerial image measurement device 45 while controlling the position (Z position) of measurement plate 30 (wafer table WTB) in the optical axis direction of projection optical system PL using surface position information measured by the pair of XZ heads $65X_2$ and $64X_3$ that measures the surface position information on the ends on one side and the other side in the X-axis direction of wafer table WTB, and measuring the best focus position of projection optical system PL based on the measurement results.

On this processing, because liquid immersion area 14 is formed in between projection optical system PL and measurement plate 30 (wafer table WTB), the measurement of the aerial images described above is performed via projection optical system PL and liquid Lq. Further, because measurement plate 30 and the like of aerial image measurement device 45 are mounted on wafer stage WST (wafer table WTB), and the photodetection element and the like are mounted on measurement stage MST, the measurement of the aerial images described above is performed in a state where wafer stage WST and measurement stage MST are in contact or are in proximity to each other.

According to the measurement described above, measurement values (that is, surface position information on the ends on one side and the other side in the X-axis direction of wafer table WTB) of the pair of XZ heads $65X_2$ and $64X_3$ in a state where the center line of wafer table WTB coincides with reference axis LV is obtained. Such measurement values correspond to the best focus position of projection optical system PL.

After the second half processing of Pri-BCHK and the second half processing of focus calibration described above have been performed, main controller 20 calculates the base line of primary alignment system AL1, based on results of the first half processing of Pri-BCHK and results of the second half processing of Pri-BCHK previously described. Further, along with this, main controller 20 adjusts the detection origin of the multi-point AF system by obtaining the offset at representative detection points of the multi-point AF system (90a, 90b) so that the offset becomes zero using the optical method previously described, based on a relation between measurement values (surface position information on the ends on one side and the other side in the X-axis direction of wafer table WTB) of a pair of XZ heads $66X_1$ and $66X_2$ in a state where the center line of wafer table WTB coincides with reference axis LV obtained in the first half processing of focus calibration previously described and detection results (surface position information) of a detection point (a detection point located at the center or near the center among a plurality of detection points) on the surface of measurement plate 30 of the multi-point AF system (90a, 90b), and measurement values (that is, surface position information on the ends on one side and the other side in the X-axis direction of wafer table WTB) of the pair of XZ heads $65X_2$ and $64X_3$ in a state where the center line of wafer table WTB coincides with reference axis LV, corresponding to the best focus position of projection optical system PL obtained in the second half processing of focus calibration described above.

In this case, from the viewpoint of improving throughput, only one of the second half processing of Pri-BCHK and the second half processing of focus calibration described above may be performed, or the operation can go on to the next processing without performing both of the processing. As a matter of course, in the case the second half processing of Pri-BCHK is not performed, the first half processing of Pri-BCHK previously described does not have to be performed.

Figure 30:
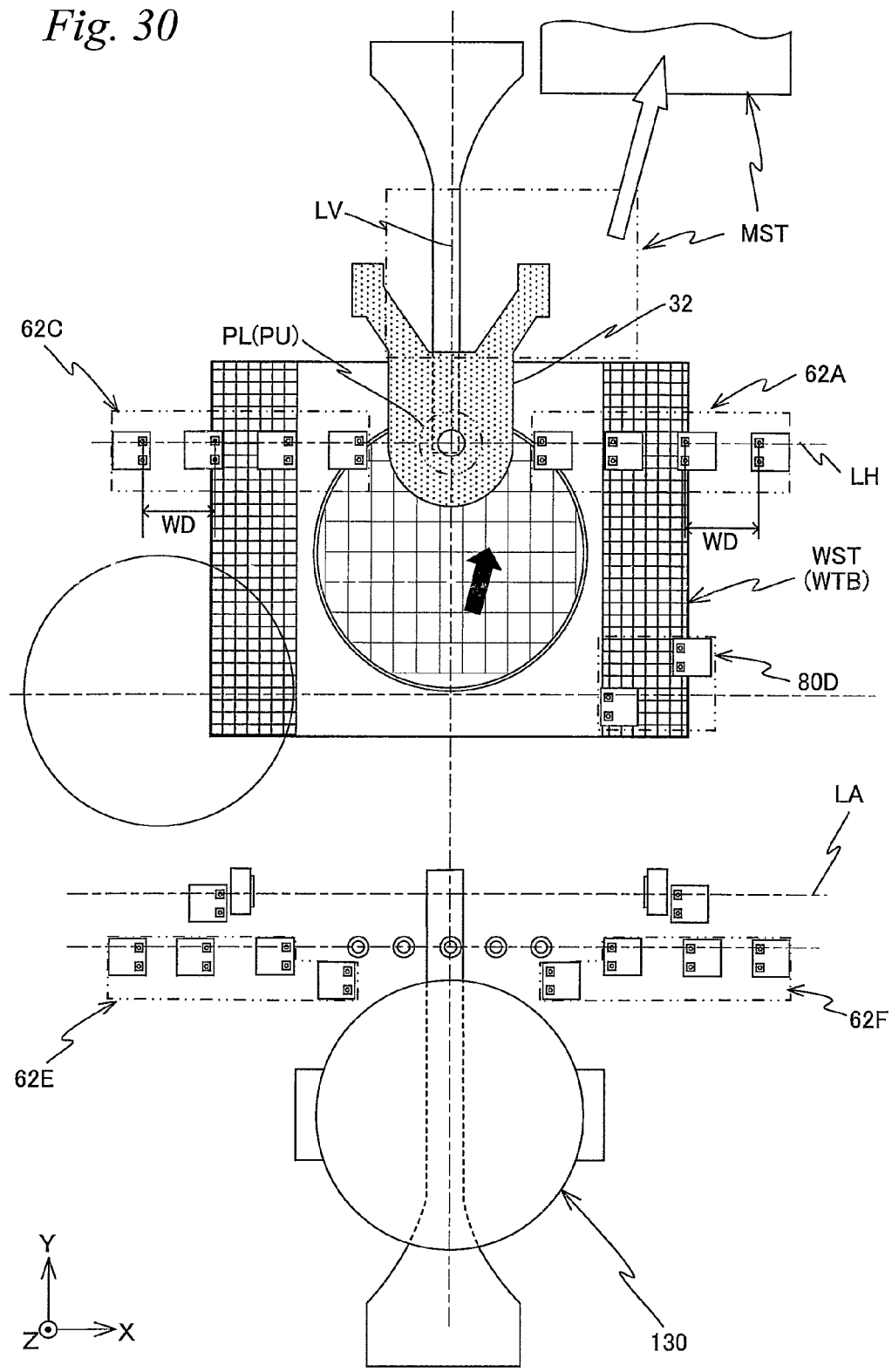
FIG. 30 is a view (No. 12) used to describe a concurrent processing operation using wafer stage WST and measurement stage MST.

When the operation so far has been completed, main controller 20, as shown in FIG. 30, drives measurement stage MST in the +X direction and also in the +Y direction, and releases the contact or proximity state of both stages WST and MST.

Then, main controller 20 performs exposure by a step-and-scan method, and transfers the reticle pattern onto the new wafer W. This exposure operation is performed by main controller 20 repeating a movement between shots in which wafer stage WST is moved to a scanning starting position (acceleration starting position) for exposure of each shot area on wafer W, and scanning exposure in which the pattern formed on reticle R is transferred by a scanning exposure method to each shot area, based on the results (array coordinates of all shot areas on the wafer which are calculated using an averaged posture obtained from averaging the measurement results of the entire surface of scales $39_1$ and $39_2$ previously described as an alignment calculation) of wafer alignment (EGA) which was performed in advance and the latest base line and the like of alignment system AL1 (and $AL2_1$ to $AL2_4$). Incidentally, the exposure operation described above is performed in a state where liquid (water) Lq is held between tip lens 191 and wafer W.

Further, in the present embodiment, as an example, because the first shot area which is to be exposed first is decided to the shot area positioned on the −X side half at the +Y edge of wafer W, first of all, wafer stage WST is moved in the +X direction and also the +Y direction as shown by a black arrow in FIG. 30, so as to move to the acceleration starting position.

Figure 31:
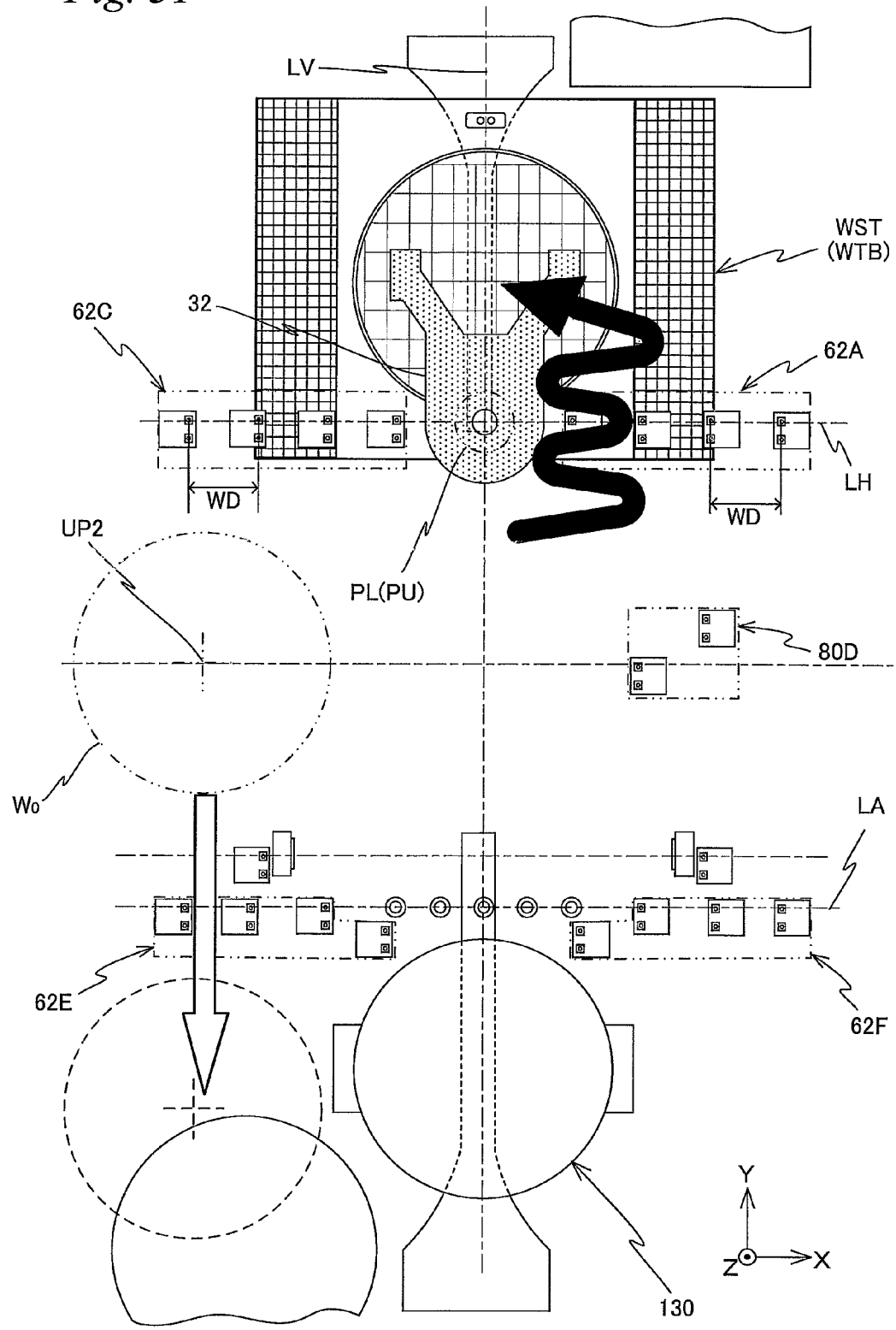
FIG. 31 is a view (No. 13) used to describe a concurrent processing operation using wafer stage WST and measurement stage MST.

And, along the path shown by a black arrow in FIG. 31, exposure is performed while moving wafer stage WST in the order from the shot area at the +Y side to the shot area at the −Y side wafer on the −X side half of the wafer.

When wafer stage WST moves in the +Y direction along a path shown by the black arrow in FIG. 31 for exposure of the −X side half of wafer W described above, the risk of interference with wafer stage WST when Y shape holding section 177 of the second unloading slider 170B which holds wafer $W_0$ that has been exposed at standby position UP2 is driven downward is removed. Therefore, main controller 20, at this point, carries wafer $W_0$ held by Y shape holding section 177 to a delivery position for delivery to the wafer carrier system in the procedure described below, as shown in FIG. 32A.

Figure 32B:
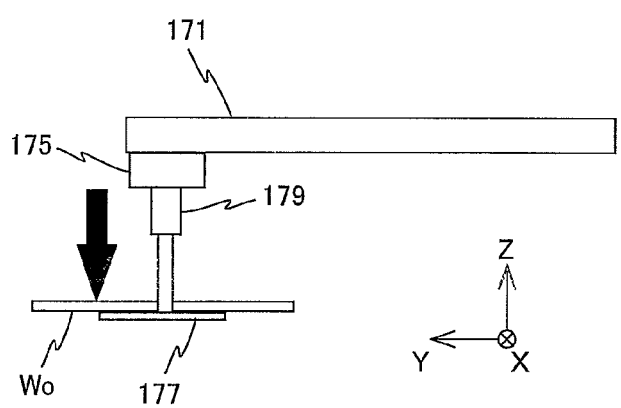
Figure 32C:
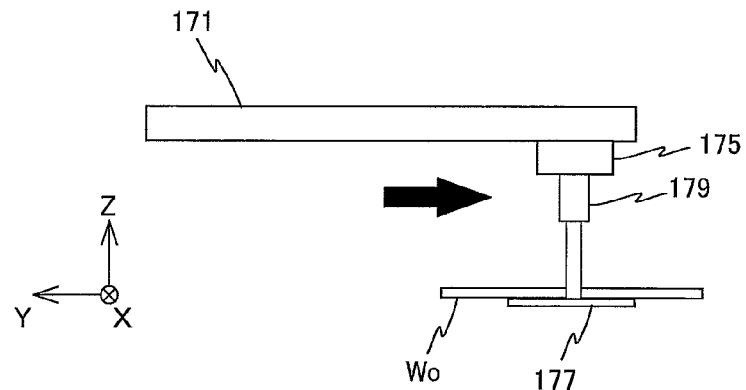
Figure 32D:
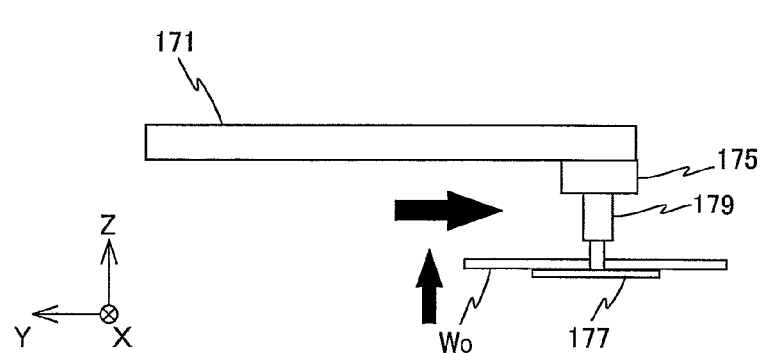

That is, after main controller 20 drives Y shape holding section 177 holding wafer $W_0$ downward by a predetermined amount via the second unloading slider driving system 180B as shown by a black arrow in FIG. 32B, main controller 20 drives (refer to an outlined arrow in FIG. 31) Y shape holding section 177 in the −Y direction along the first arm 171 as shown by a black arrow in FIG. 32C. When wafer $W_0$ reaches the position shown by the broken line in FIG. 31 during this drive, the risk of interference with head section 62E and the like when wafer $W_0$ is lifted upward is removed. Therefore, after the point, main controller 20 moves wafer $W_0$ to the delivery position for delivery to the wafer carrier system while driving Y shape holding section 177 holding wafer $W_0$ upward by a predetermined amount as shown by two black arrows in FIG. 32D, via the second unloading slider driving system 180B. In the manner described above, wafer $W_0$ is carried to the delivery position for delivery to the wafer carrier system.

Figure 33:
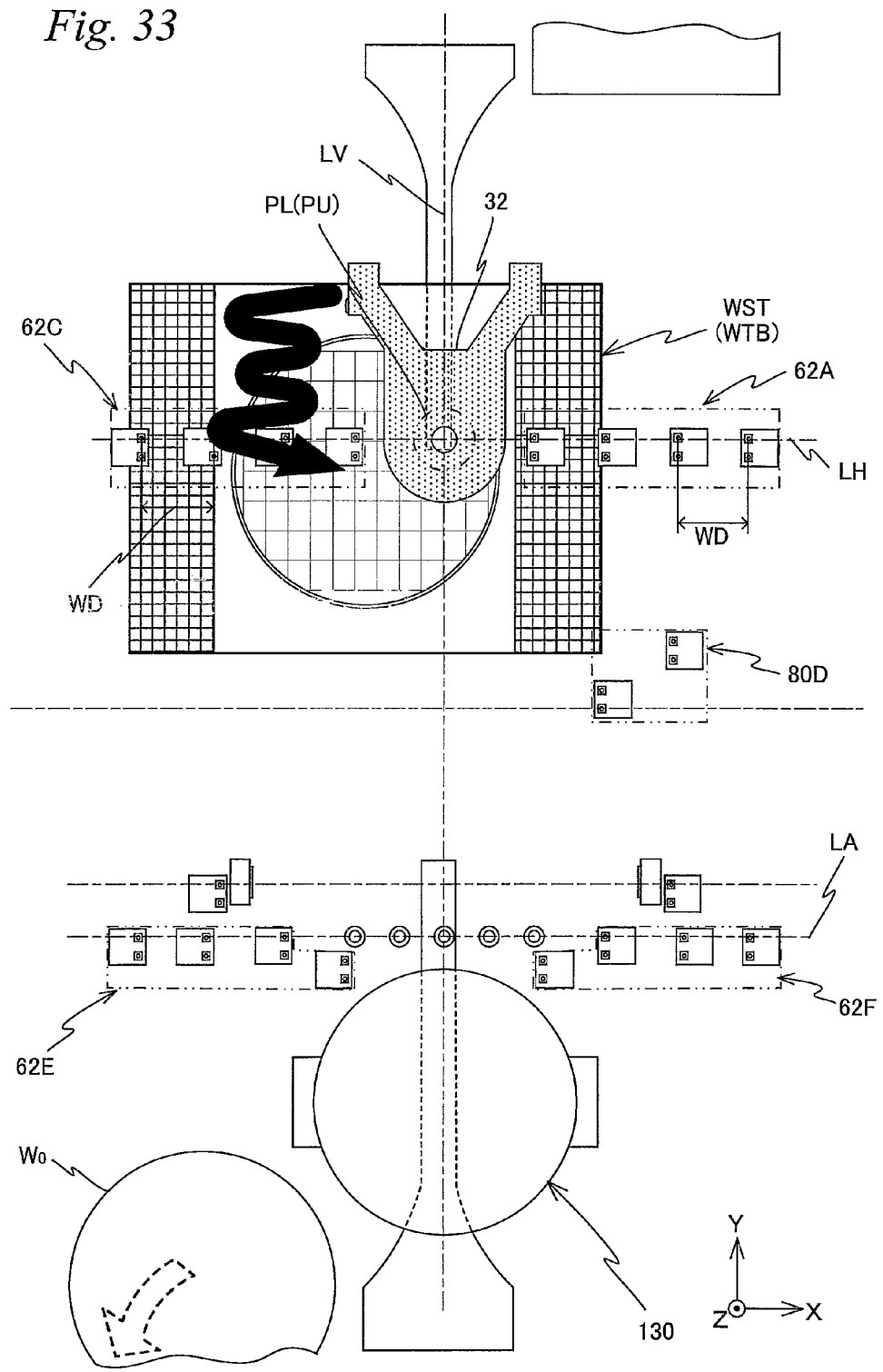
FIG. 33 is a view (No. 15) used to describe a concurrent processing operation using wafer stage WST and measurement stage MST.
Figure 34:
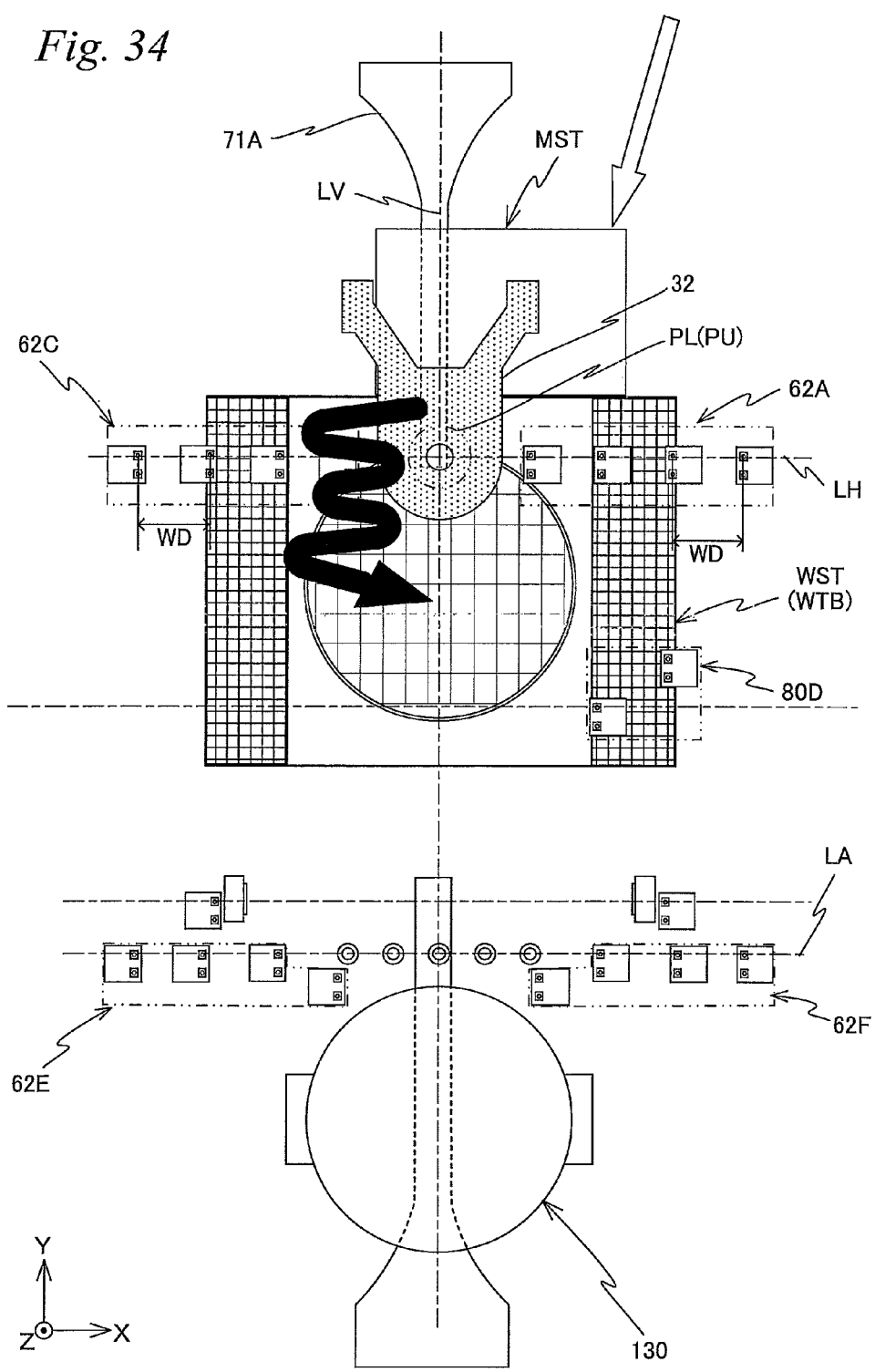
FIG. 34 is a view (No. 16) used to describe a concurrent processing operation using wafer stage WST and measurement stage MST.

Concurrently with the carriage of wafer $W_0$ to the delivery position described above, main controller 20 exposes the +X side half of wafer W in the order from the shot area at the −Y side to the shot area at the +Y side, while moving wafer stage WST along paths shown by black arrows in FIGS. 33 and 34. By this movement, at the point where exposure of all shot areas on wafer W has been completed, wafer stage WST returns substantially to the same position as the position where wafer stage WST was before the beginning of exposure.

In the present embodiment, while the exposure order described above of the shot areas is employed, the total length of the path in which wafer stage WST moves for exposure, in the case a wafer of the same size is exposed according to the same shot map, is not much different from a conventional liquid immersion scanner and the like disclosed in, for example, U.S. Patent Application Publication No. 2008/0088843 and the like.

During the exposure described above, of the measurement values of the first fine movement stage position measurement system 110A, namely, the measurement values of four-spindle heads 65 and 64 facing scales $39_1$ and $39_2$, respectively, or namely, measurement results (measurement values of the position) of position information in directions of six degrees of freedom measured by the first top side encoder system 80A previously described, and the measurement results of the position information (measurement values of the position) in directions of six degrees of freedom measured by the first back side encoder system 70A, the measurement value of higher reliability is supplied to main controller 20 as the hybrid position signal previously described, and servo control of the position of wafer table WTB is performed based on position information of wafer table WTB in directions of six degrees of freedom obtained from the hybrid position signal. Further, control of the position in the Z-axis direction, θy rotation, and θx rotation of wafer table WTB (focus-leveling control of wafer W) during this exposure is performed based on results of the focus mapping (surface position information using a scale reference surface as a reference or surface position information using the rear surface measurement reference surface which has been corrected according to post stream processing results as a reference) previously described performed in advance.

Further, during the exposure, main controller 20 performs refreshing the coordinate system of first back side encoder system 70A previously described according to difference measurement using measurement values of a redundant axis at a predetermined sampling interval, and performs refreshing the coordinate system at least once of the first top side encoder system 80A by comparing and adjusting the grids of scales $39_1$ and $39_2$ to the coordinate system of the first back side encoder system 70A having undergone refreshing.

When wafer stage WST moves in the X-axis direction during the exposure operation by the step-and-scan method described above, with the movement, switching of heads (succession of measurement values among a plurality of heads) previously described is performed in the first top side encoder system 80A. As described, main controller 20 executes stage control by appropriately switching the encoders used of the first top side encoder system 80A, according to the position coordinate of wafer stage WST.

Concurrently with the exposure of shot areas on the +X side half of the wafer described above, wafer $W_0$ having undergone exposure which has been carried to the delivery position, is delivered to a wafer carrier system (not shown) to be carried outside of the apparatus by a carrier robot not shown.

When exposure of wafer W is completed, main controller 20 makes wafer stage WST and measurement stage MST which are distanced apart during the exposure previously described, move into the contact or proximity state previously described, by driving measurement stage MST within the XY-plane as shown by an outlined arrow in FIG. 34, based on the measurement values of measurement stage position measuring system 16B. On this shift to the contact or proximity state, measurement stage MST engages with measurement arm 71A laterally (horizontally). In order to allow measurement arm 71A to engage with measurement stage MST laterally, measurement table MTB of measurement stage MST is supported on support section 62 on slider section 60 in a cantilevered state.

Figure 35:
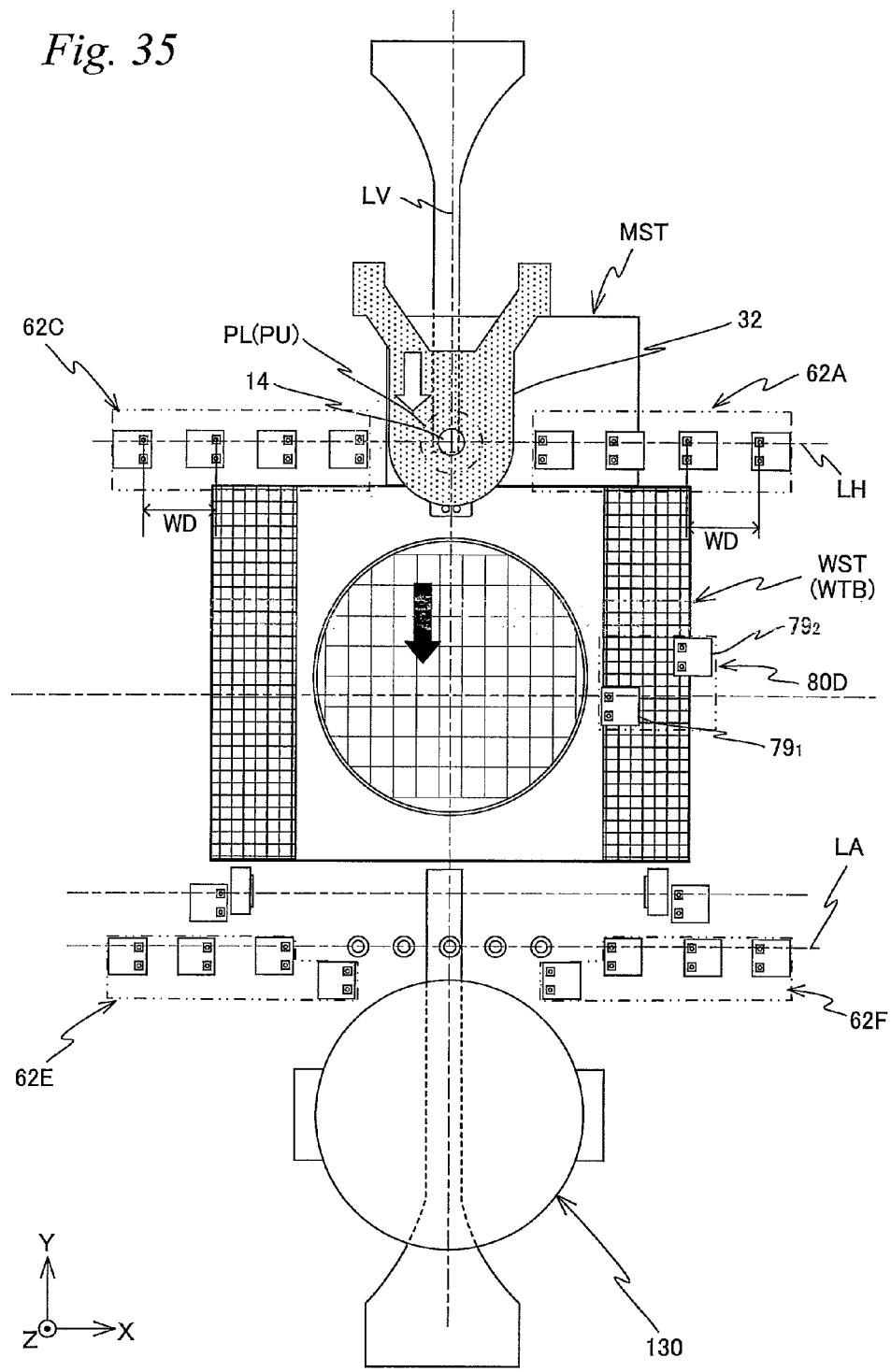
FIG. 35 is a view (No. 17) used to describe a concurrent processing operation using wafer stage WST and measurement stage MST.

And, main controller 20, as shown in FIG. 35, moves both stages WST and MST in the −Y direction while maintaining the contact or proximity state described above. This moves (delivers) liquid immersion area 14 (liquid Lq) formed under projection unit PU from an area on wafer table WTB to an area on measurement table MTB.

At the point when delivery of liquid immersion area 14 (liquid Lq) described above from the area on wafer table WTB to the area on measurement stage MST has been completed, main controller 20 can control the position of measurement stage MST based on measurement values of the first back side encoder system 70A which uses grating RGa provided on the rear surface of measurement table MTB, via measurement table driving system 52B (refer to FIG. 16). Accordingly, main controller 20 can perform necessary measurement operations, while controlling the position of measurement table MTB in directions of six degrees of freedom.

After moving into the contact or proximity state described above, wafer stage WST moves away from the measurement range of the first fine movement stage position measurement system 110A just before moving liquid immersion area 14 (liquid Lq) from an area on wafer table WTB to an area on measurement table MTB is completed, and position measurement of wafer table WTB by the first top side encoder system 80A and the first back side encoder system 70A cannot be performed. Just before this, main controller 20 switches the position measurement system used for servo control of the position of wafer table WTB from the first fine movement stage position measurement system 110A to the fourth top side encoder system 80D (three-dimensional heads $79_1$ and $79_2$).

Then, wafer stage WST is driven toward unloading position UP1 by main controller 20. Accordingly, after the contact or proximity state previously described is released, wafer stage WST moves to unloading position UP1. Because this movement is performed without liquid Lq being in contact with the area on wafer table WTB, the movement can be performed with high acceleration, such as for example, acceleration in two steps within a short time. When wafer stage WST reaches unloading position UP1, main controller 20 unloads wafer W which has been exposed from wafer stage WST in the following order.

Figure 36A:
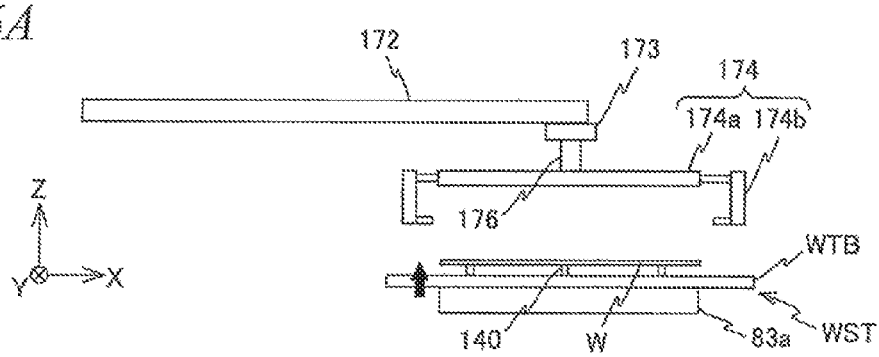
FIGS. 36A to 36D are views (No. 18) used to describe a concurrent processing operation using wafer stage WST and measurement stage MST, and to describe a procedure of unloading a wafer which has been exposed from above a wafer stage.

That is, after main controller 20 releases the suction by the wafer holder of wafer W which has been exposed, main controller 20 drives the three vertical movement pins 140 upward by a predetermined amount and lifts wafer W, as shown by a black arrow in FIG. 36A. The position of the three vertical movement pins at this point is maintained until wafer stage WST reaches loading position LP, and the loading of the next wafer begins.

Figure 36B:
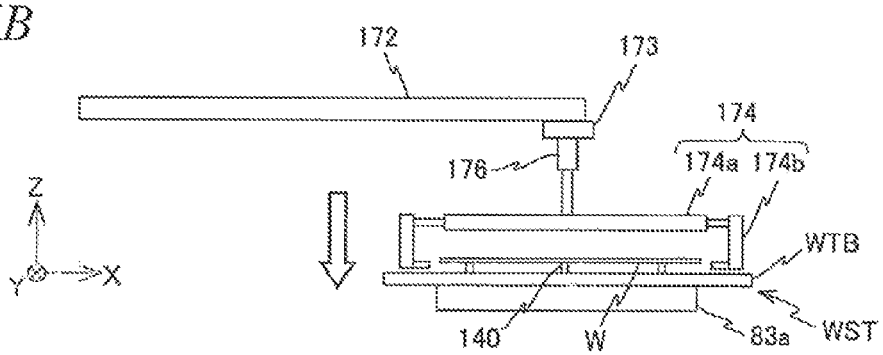
Figure 36C:
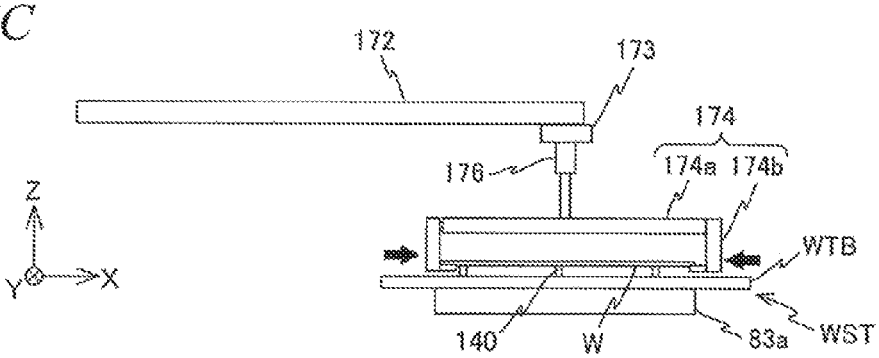
Figure 36D:
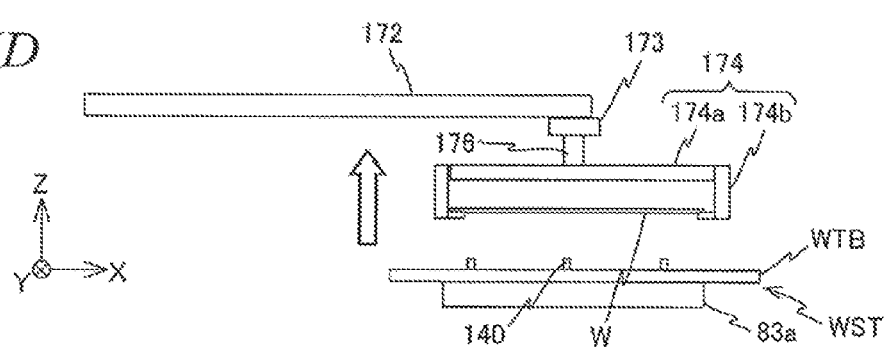

Next, main controller 20 drives wafer grasping member 174 of the first unloading slider 170A downward by a predetermined amount via the first unloading slider driving system 180A, as shown by an outlined arrow in FIG. 36B. This makes main section 174a of wafer grasping member 174 approach a position at a predetermined distance from wafer W. At this point, the four grasping members 174b of wafer grasping member 174 are open. Therefore, as shown by black arrows in FIG. 36C, main controller 20 closes the four grasping members 174b via the first unloading slider driving system 180A, and drives wafer grasping member 174 upward to a predetermined height position, as shown by an outlined arrow in FIG. 36D. By this operation, the four grasping members 174b of wafer grasping member 174 lift wafer W, in a state where four places on the outer circumference of the rear surface of wafer W are supported from below. This completes the unloading of wafer W.

Figure 37:
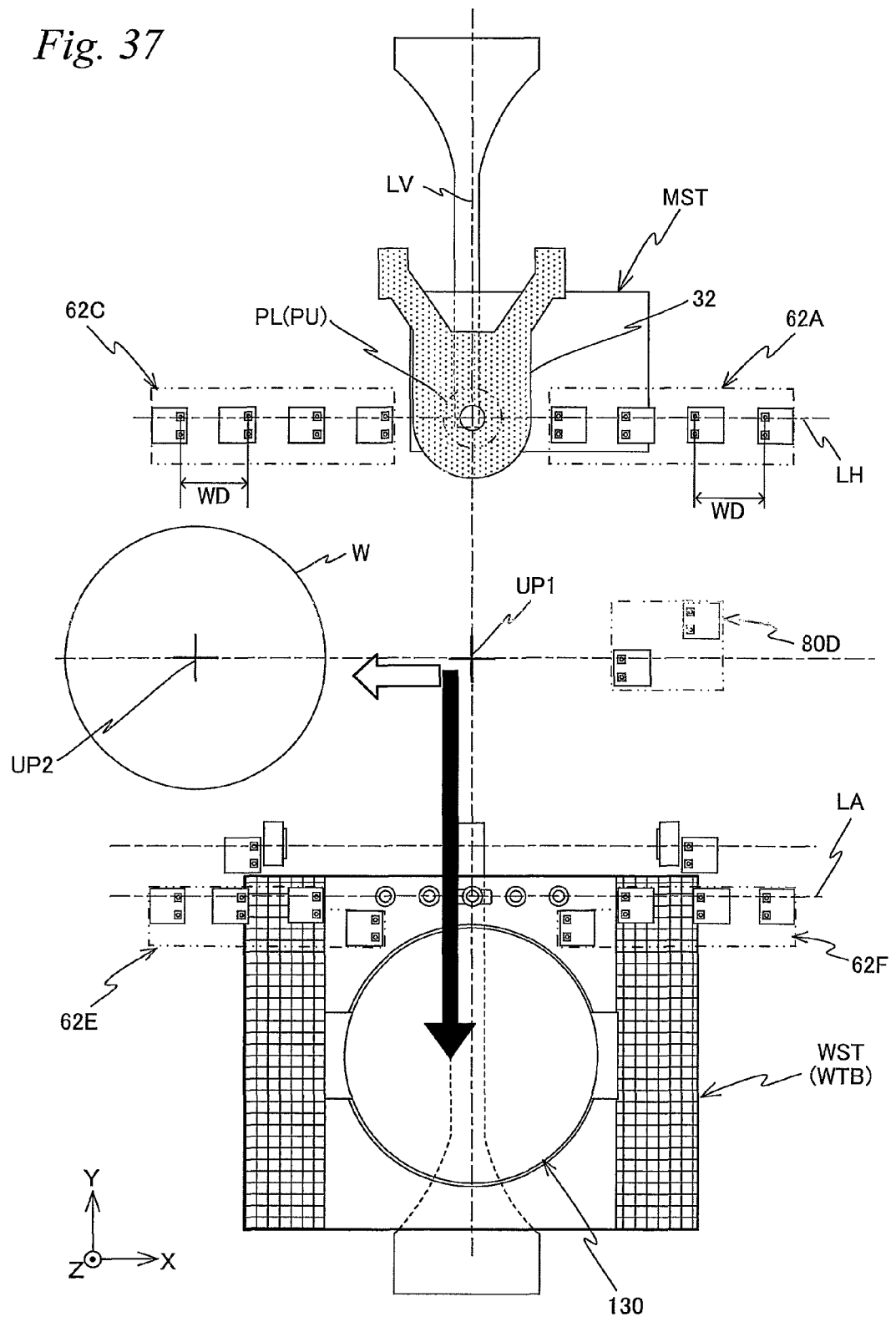
FIG. 37 is a view (No. 19) used to describe a concurrent processing operation using wafer stage WST and measurement stage MST.

Next, as shown in FIG. 37, main controller 20 drives wafer stage WST at a high speed in a straight line in long steps toward loading position LP. During this drive, because wafer stage WST moves away from the measurement range, position measurement of wafer table WTB by the fourth top side encoder system 80D can no longer be performed. Therefore, before wafer stage WST moves away from the measurement range of the fourth top side encoder system 80D, main controller 20 switches the position measurement system used for servo control of the position of wafer table WTB from the fourth top side encoder system 80D to the second fine movement stage position measurement system 110B.

Concurrently with moving wafer stage WST to loading position LP, main controller 20 moves wafer W held by wafer grasping member 174 of the first unloading slider 170A at the predetermined height position of unloading position UP1 to standby position UP2, as typically shown in FIG. 37 by an outlined arrow. This movement is performed by main controller 20 in the following procedure.

Figure 38A:
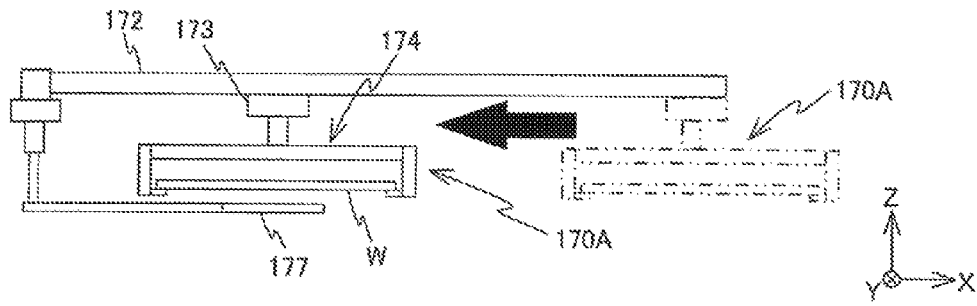
FIGS. 38A to 38E are views (No. 20) used to describe a concurrent processing operation using wafer stage WST and measurement stage MST, and to describe a carrying procedure of a wafer from an unloading position to a standby position 2.
Figure 38B:
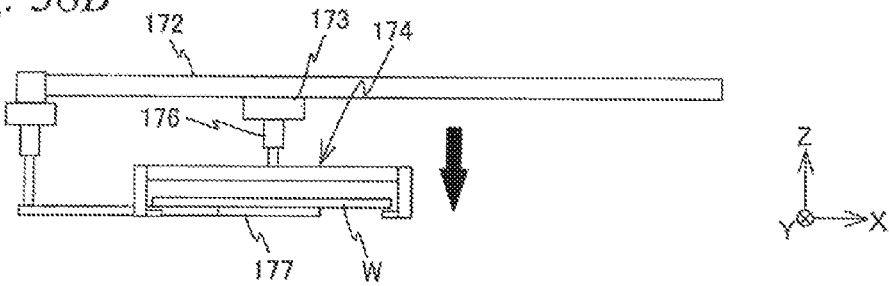

That is, as shown by a black arrow in FIG. 38A, main controller 20 moves the first unloading slider 170A holding wafer W by wafer grasping member 174 along the second arm 172, via the first unloading slider driving system 180A, to just above Y shape holding section 177 near a lower limit moving position in standby position UP2. And, as shown by a black arrow in FIG. 38B, main controller 20, for example, drives wafer grasping member 174 holding wafer W downward, via the first unloading slider driving system 180A, until the rear surface of wafer W comes into contact with the suction section of Y shape holding section 177. Or, main controller 20, for example, can drive Y shape holding section 177 upward via the second unloading slider driving system 180B, until the suction section of Y shape holding section 177 comes into contact with the wafer W rear surface held by wafer grasping member 174.

Figure 38C:
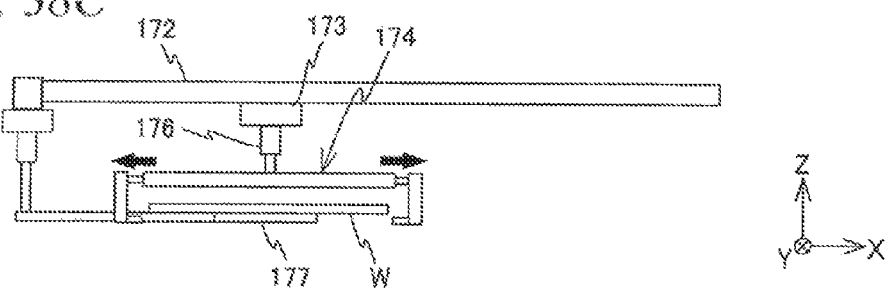
Figure 38D:
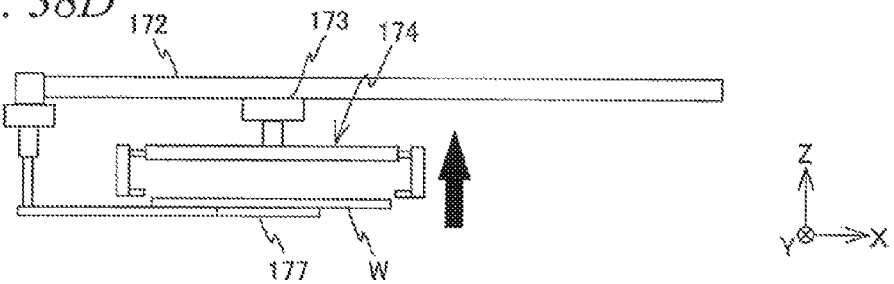

Then, when the rear surface of wafer W comes into contact with the suction section of Y shape holding section 177, main controller 20 opens the four grasping members 174b via the first unloading slider driving system 180A as shown by black arrows in FIG. 38C, and also drives wafer grasping member 174 upward by a predetermined amount, as shown by a black arrow in FIG. 38D. By this operation, wafer W is delivered from wafer grasping member 174 to Y shape holding section 177.

Figure 38E:
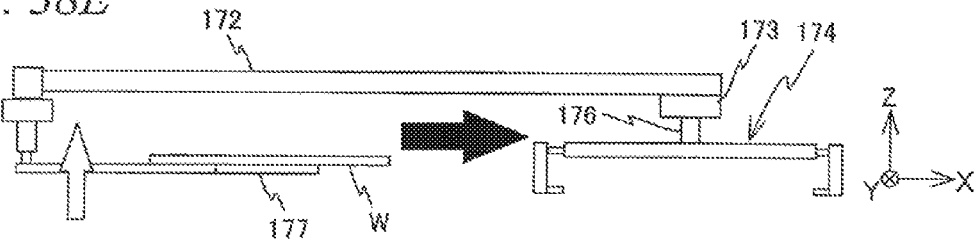

After this, main controller 20 returns the first unloading slider 170A (wafer grasping member 174) via the first unloading slider driving system 180A to unloading position UP1 as shown by a black arrow in FIG. 38E, and drives Y shape holding section 177 which holds wafer W by suction from below upward to a position of a predetermined height at standby position UP2, as shown by an outlined arrow in FIG. 38E. The state of this wafer W held by Y shape holding section 177 at the position of a predetermined height at standby position UP2 is maintained until exposure of the next wafer begins, and wafer stage WST moves to a state withdrawn from below standby position UP2.

This completes a series of (one cycle of) processing performed on a wafer, and hereinafter, a similar operation is repeatedly performed.

As described in detail so far, exposure apparatus 100 related to the present embodiment holds the wafer which is mounted, and is equipped with fine movement stage WFS that has the wafer holder which is not shown, moveable along the XY plane, chuck unit 120 which has chuck main section 130 which can move vertically holding the wafer from above in a non-contact manner above loading position LP, and three vertical movement pins 140 which are provided in fine movement stage WFS, and can move vertically while supporting the wafer from below. Further, prior to support the wafer from below with the three vertical movement pins 140, chuck unit 120 is equipped with a pair of support plates 128 which holds the wafer held in a non-contact manner from above by chuck main section 130 (Bernoulli chuck 124), by coming into contact with a part of the wafer except for the upper surface portion (for example, a part of the lower surface (rear surface)).

Prior to loading the wafer onto wafer table WTB, main controller 20 makes the pair of support plates 128 come into contact with a part of the lower surface (rear surface) of the wafer, while holding the wafer in a non-contact manner from above by chuck main section 130 (Bernoulli chuck 124) above loading position LP. This restricts the movement of the wafer in directions of six degrees of freedom. And, chuck unit 120 maintains this state until wafer stage WST returns to loading position LP.

Then, when wafer stage WST returns to loading position LP, main controller 20 supports the wafer held by chuck main section 130 (Bernoulli chuck 124) from below by the three vertical movement pins 140, and also releases the hold of the pair of support plates 128 in contact with the wafer. Then, while maintaining the holding state of the wafer by chuck main section 130 (Bernoulli chuck 124) and the supporting state of the wafer by the three vertical movement pins 140 main controller 20 immediately drives chuck main section 130 and the three vertical movement pins 140 downward until the lower surface of the wafer comes into contact with the wafer holder (vacuum chuck and the like) which is not shown on fine movement stage WFS (wafer table WTB), and at the point where the lower surface of the wafer comes into contact with the wafer holder (vacuum chuck and the like), releases the support of the wafer by the three vertical movement pins 140 and the holding of the wafer by chuck main section 130 (Bernoulli chuck 124).

Therefore, according to exposure apparatus 100, the wafer can be delivered onto wafer table WTB without positional deviation (with good reproducibility) in a state maintaining a high flatness degree. Further, main controller 20 drives fine movement stage WFS based on the position information measured by the first fine movement stage position measurement system 110A previously described on exposure of the wafer. Accordingly, exposure can be performed with high precision on the wafer delivered without any positional deviation to the area on fine movement stage WFS in a state maintaining a high flatness degree.

Further, according to exposure apparatus 100 related to the present embodiment, chuck main section 130 includes Bernoulli chuck 124 which holds the wafer in a non-contact manner and cool plate 123 which controls the temperature of the wafer, and the temperature of the wafer is controlled to a target temperature until chuck main section 130 releases the hold of the wafer. This allows the controlled state of the wafer to the target temperature to be continued until the carriage of wafer on wafer table WTB is completed.

Further, exposure apparatus 100 is equipped with a measurement system provided in chuck main section 130 including three imaging devices and signal processing system 116 that can measure the positional information (center position (deviation) and rotation position (deviation)) of the wafer, and the measurement system including the three imaging devices and signal processing system 116 measures the positional information of the wafer while chuck main section 130 is driven downward until the lower surface of the wafer comes into contact with the wafer holder (vacuum chuck and the like). This allows the positional deviation and the rotation error of the wafer to be measured even at the moment when the wafer is loaded onto wafer table WTB, and by adding this measurement information as correction information of the position of the wafer, main controller 20 can realize position control (including positioning) with a higher accuracy of wafer W at the time of alignment and/or at the time of exposure.

Further, according to exposure apparatus 100 related to the present embodiment, when wafer stage WST is moved in the +Y direction from loading position LP set on one side (−Y side) in the Y-axis direction of measurement station 300 toward exposure station 200, and detection of a plurality of (for example, 16) alignment marks on the wafer is performed during this movement path by the plurality of alignment systems ALG1, and $ALG2_1$ to $ALG2_4$, the positional relation in the Y-axis direction between projection optical system PL and the plurality of alignment systems ALG1 and $ALG2_1$ to $ALG2_4$ is set so that none of the parts of wafer stage WST approach liquid immersion area 14 until the detection of the plurality of marks is completed. Further, in addition to the alignment measurement described above, because the stream processing previously described which includes the focus mapping previously described is performed without wafer table WTB being in contact with the liquid, the stream processing can be performed by moving wafer table WTB (wafer stage WST) with high speed and high acceleration.

Further, because unloading position UP1 is set between the exposure position and the alignment position, the wafer which has been exposed can be unloaded immediately from wafer table WTB after exposure has been completed, and then wafer table WTB can return to loading position LP. Further, after exposure has been completed, wafer table WTB, after delivering liquid immersion area 14 (liquid Lq) to measurement table MTB, returns to unloading position UP1, and then to loading position LP, without coming into contact with the liquid. Accordingly, the movement of wafer table WTB at this point can be performed with high speed and high acceleration. Furthermore, because loading position LP is set on a straight line which connects the exposure position and the alignment position, and also the first half processing of Pri-BCHK is performed at this position, the stream processing can be started immediately after the wafer has been loaded on wafer table WTB.

Furthermore, because the order of exposure of the plurality of shot areas on wafer W is from the shot area at the −Y side to the +Y side on the +X side half (or the −X side half), after the shot area at the +Y side to the −Y side on the −X side half (or the +X side half) has been exposed, when exposure has been completed, wafer table WTB is located at a position closest to unloading position UP1. Accordingly, after exposure has been completed, wafer table WTB can be moved to unloading position UP1 in the shortest time.

Further, according to exposure apparatus 100 related to the present embodiment, the first fine movement stage position measurement system 110A, which measures the position of wafer table WTB (fine movement stage WFS) held movable in directions of six degrees of freedom by coarse movement stage WCS when wafer stage WST is at exposure station 200, is equipped with the first back side encoder system 70A which measures the position information of wafer table WTB in directions of six degrees of freedom by irradiating a measurement beam from below on grating RG provided on the rear surface (surface on the −Z side) of wafer table WTB and receiving the return light (reflected and diffracted light) of the measurement beam from grating RG, and is also equipped with the first top side encoder system 80A, which has head sections 62A and 62C provided in main frame BD, and measures the position information of wafer table WTB in directions of six degrees of freedom by irradiating a measurement beam on the pair of scales $39_1$ and $39_2$ (two-dimensional gratings) provided on wafer table WTB from head sections 62A and 62C. And, in the case switching section 150A previously described is set to the first mode, when wafer table WTB moves in an area besides the predetermined range within exposure station 200, such as, for example, at the time of exposure, main controller 20 drives wafer table WTB based on position information having a higher reliability, out of the position information according to the first back side encoder system 70A and the position information according to the first top side encoder system 80A. This drive is performed by main controller 20 driving coarse movement stage WCS via coarse movement stage driving system 51A, and also servo-driving wafer table WTB via fine movement stage driving system 52A.

Further, in the present embodiment, by setting switching section 150A to the first mode, main controller 20 drives wafer table WTB within the predetermined range described above based on the position information corresponding to hybrid position signal $F_H$ previously described, which, as a consequence, allows wafer table WTB to be driven within the predetermined range described above based on position information having a higher reliability of the position information according to the first back side encoder system 70A and the position information according to first top side encoder system 80A. Accordingly, it becomes possible to drive wafer table WTB with good precision within the predetermined range in exposure station 200 described above, constantly based on position information having a high reliability.

Further, according to exposure apparatus 100 related to the present embodiment, the second fine movement stage position measurement system 110B, which measures the position of wafer table WTB (fine movement stage WFS) held movable by coarse movement stage WCS in directions of six degrees of freedom when wafer stage WST is at measurement station 300, is equipped with the second back side encoder system 70B which measures the position information of wafer table WTB in directions of six degrees of freedom, by irradiating a measurement beam from below on grating RG provided on the rear surface (surface on the −Z side) of wafer table WTB when wafer table WTB moves in a predetermined range (a range within measurement station 300 including at least a range where wafer table WTB moves for stream processing and traverse checking previously described, such as, for example, a range in measurement station 300 corresponding to the predetermined range previously described in exposure station 200) within measurement station 300, and the apparatus is also equipped with the second top side encoder system 80B which has head sections 62F and 62E provided in main frame BD, and can measure the position information of wafer table WTB in directions of six degrees of freedom concurrently with the measurement of position information by the second back side encoder system 70B, by irradiating a measurement beam on the pair of scales $39_1$ and $39_2$ (two-dimensional grating) on wafer table WTB from head sections 62F and 62E. And, in the case switching section 150B previously described is set to the first mode, main controller 20, when wafer table WTB moves in the predetermined range described above within measurement station 300, such as, for example, at the time of alignment, main controller 20 servo-drives wafer table WTB based on position information having a higher reliability, out of the position information according to the second back side encoder system 70B and the position information according to the second top side encoder system 80B.

Further, in the present embodiment, by setting switching section 150B to the first mode, main controller 20 drives wafer table WTB within the predetermined range described above based on the position information corresponding to hybrid position signal $F_H$ previously described, which, as a consequence, allows wafer table WTB to be driven within the predetermined range described above based on position information having a higher reliability of the position information according to the second back side encoder system 70B and the position information according to the second top side encoder system 80B. Accordingly, it becomes possible to drive wafer table WTB with good precision within the predetermined range in measurement station 300 described above, constantly based on position information having a high reliability.

Further, according to exposure apparatus 100 related to the present embodiment, main controller 20 repeatedly performs the refreshing processing of the coordinate system of the first back side encoder system 70A when wafer table WTB moves within the predetermined range in exposure station 200 described above at the time of exposure and the like, at a predetermined interval, and the exposure of wafer W is performed while controlling the position of wafer table WTB on the coordinate system of the first back side encoder system 70A where the grid error is constantly corrected. Further, main controller 20 performs refreshing the coordinate system of the first top side encoder system 80A in which the grid distortion of the coordinate system of the first top side encoder system 80A is calculated backward and revised, based on the grid of the coordinate system of the first back side encoder system 70A which is revised from the relation between the partial coordinate systems mutually corresponding to the first back side encoder system 70A and the first top side encoder system 80A.

Further, at the time of stream processing, main controller 20 repeatedly performs the refreshing processing of the coordinate system of the second back side encoder system 70B at a predetermined interval, and alignment measurement and focus mapping are performed while the position of wafer table WTB is controlled on the coordinate system of the second back side encoder system 70B whose grid error is constantly corrected. Further, main controller 20 similarly performs refreshing the coordinate system of the second top side encoder system 80B in which the grid distortion of the coordinate system of the second top side encoder system 80B is calculated backward and revised, based on the grid of the coordinate system of the second back side encoder system 70B.

Incidentally, to perform the refreshing of the coordinate systems of the first and second back side encoder systems 70A and 70B described above with high precision including a higher order element, the marks can be placed in an accurate positional relation and a reference wafer whose surface flatness is extremely high can be prepared, and this reference wafer can be mounted on wafer table WTB, and wafer table WTB can be moved within the XY-plane so as to measure the marks of the reference wafer with primary alignment system AL1, as well as measure the unevenness of reference wafer using multi-point AF system (90a, 90b), while measuring the position of wafer table WTB using the second back side encoder system 70B, and the measurement (correction) of the coordinate system of the second back side encoder system 70B, that is, the measurement (correction) including the higher order element of the grid of grating RG can be performed. This measurement can be performed at least once when starting up a device, theoretically, not on the entire surface of the wafer, but on a part of an area on wafer. This is because the measurement is performed to obtain data of the higher order element of the grid of grating RG subject to refreshing, and it is considered that the remaining area can be corrected by performing the refreshing previously described.

Further, main controller 20 performs the traverse checking previously described in which errors between the coordinate system at the time of alignment and the coordinate system at the time of exposure based on the error factor unique to the stream processing are corrected by actually moving wafer stage WST in the X-axis direction, at a frequency (frequency as necessary) decided in advance.

Further, the calculation processing to replace the error factor parameter included in the wafer alignment result (EGA results) and focus mapping result to the corresponding parameter calculated from the average of all data observed by the second top side encoder system 80B and the third top side encoder system 80C during the streaming processing, that is, the post stream processing previously described is performed.

As is obvious from the description so far, according to exposure apparatus 100 related to the present embodiment, exposure is performed with high resolution and good overlay accuracy by liquid immersion exposure to wafer W in a step-and-scan method, based on the highly precise results of alignment and focus mapping. Further, even if wafer W subject to exposure, for example, is a 450 mm wafer, a high throughput can be maintained. To be specific, in exposure apparatus 100, it is possible to achieve exposure processing to a 450 mm wafer, with equal or higher throughput as the exposure processing to a 300 mm wafer using a liquid immersion scanner as disclosed in, U.S. Patent Application Publication No. 2008/0088843 and the like previously described.

Incidentally, in the embodiment described above, because chuck unit 120 was structured as previously described, for example, during the exposure of the preceding wafer, by making the next wafer wait above loading position LP concurrently with the exposure, and controlling the temperature of the wafer, the wafer whose temperature has been controlled can be immediately loaded onto wafer table WTB when wafer stage WST returns to loading position LP. However, the structure of chuck unit 120 is not limited to the structure previously described. That is, chuck unit 120 (Bernoulli chuck 124) can have, for example, only a carrier function, or in addition to the carrier function, can have at least one of the temperature control function, the pre-alignment function, and the bending correcting (flattening function), and its structure can be decided depending on the type or number of functions to be added to chuck unit 120 (Bernoulli chuck 124), and the structure to achieve the four functions including the carrier function is not limited to the ones previously described. For example, in the case such as when the next wafer is not waiting above loading position LP concurrently with the exposure of the preceding wafer, holding members such as the pair of support plates 128 and the like described above to prevent the positional deviation within the XY plane of the wafer in a state held in a non-contact manner by chuck main section 130 during the waiting do not necessarily have to be provided. Further, chuck main section 130 does not necessarily have to have a temperature controlling member such as cool plate 123 and the like. For example, in the case when the next wafer is not waiting above loading position LP concurrently with the exposure of the preceding wafer, a case may be considered where controlling the temperature of the wafer on a cool plate installed at a place other than the loading position until just before the loading begins is sufficient enough. Further, as long as alignment of the wafer can be performed after the loading, the measurement system for measuring the position information of the wafer while the wafer is being held by chuck main section 130 does not necessarily have to be provided.

Further, in the embodiment described above, while chuck main section 130 has Bernoulli chuck 124 consisting of a plate shaped member having substantially the same size as cool plate 123, the present invention is not limited to this, and instead of Bernoulli chuck 124, chuck main section 130 can have a plurality of Bernoulli cups attached directly or via a plate member to the lower surface of cool plate 123. In this case, the plurality of Bernoulli cups is preferably distributed on the entire surface, or at least in the center and in the periphery of cool plate 123, and it is also preferable that main controller 20 can adjust the blowing, the stopping, the flow volume and/or the flow speed and the like of a fluid (e.g., air) individually, or for each group (e.g., for each group in the center and in the periphery). In the case the exposure apparatus is equipped with chuck unit 120 that has chuck main section 130 having the structure described above, the flow volume and/or the flow speed of the fluid blowing from at least a part of the plurality of Bernoulli cups of chuck main section 130 can be made different from a normal support state of wafer W to displace at least a part of wafer W supported in a non-contact manner in a vertical direction when wafer W is waiting at the loading position, or at the time of carry-in of wafer W onto the wafer holder (wafer table WTB), so that deformation of wafer W supported in a non-contact manner from above by chuck main section 130 is suppressed. As a matter of course, also in the case when chuck main section 130 has a single Bernoulli chuck 124 as in the embodiment described above, in order to suppress the deformation of wafer W, the flow speed and the like of the fluid blowing out from Bernoulli chuck 124 can be made different from the normal support state of wafer W. In any event, in such cases, wafer W whose deformation is suppressed is to be held by the wafer holder (wafer table WTB).

Incidentally, in the embodiment described above, main controller 20 drives chuck main section 130 and the three vertical movement pins 140 downward when wafer W, which is supported in a non-contact or contact state from above and below by chuck main section 130 and the three vertical movement pins 140, is mounted onto the wafer holder (wafer table WTB). However, the present invention is not limited to this, and main controller 20 can drive the wafer holder (wafer table WTB) upward with respect to chuck main section 130 and the three vertical movement pins 140, or can drive chuck main section 130 and the three vertical movement pins 140 downward while driving the wafer holder (wafer table WTB) upward. The point is, main controller 20 should relatively move chuck main section 130 and the three vertical movement pins 140 in the Z-axis direction, until the lower surface of wafer W supported from above and below by chuck main section 130 and the three vertical movement pins 140 come into contact with the lower surface of the wafer holder (wafer table WTB). In this case, main controller 20 does not have to perform relative movement in the Z-axis direction of chuck main section 130 and the three vertical movement pins 140 and the wafer holder (wafer table WTB) until wafer W comes into contact with the wafer holder (wafer table WTB), and the relative movement can be stopped just before coming into contact, and then only by the control of chuck main section 130, wafer W can be delivered onto the wafer holder (wafer table WTB).

Further, main controller 20 can shift the positional relation between the wafer holder (wafer table WTB) and wafer W, by releasing support of wafer W by one of the support members of chuck main section 130 (the first support member) and the three vertical movement pins 140 (the second support member) and also supporting wafer W with the other of the support members, while relatively moving the wafer holder (wafer table WTB) with respect to one of the support members and the other of the support members, that is, wafer W can be switched. Especially in the case of switching wafer W with the three vertical movement pins 140, wafer W should be switched while the suction is released, and then the suction performed again. Further, relative positional relation between the wafer holder (wafer table WTB) and wafer W can be adjusted, by moving at least one of chuck main section 130, three vertical movement pins 140, and wafer holder (wafer table WTB).

Further, in the embodiment described above, main controller 20 can detect positional deviation in the X-axis direction and the Y-axis direction and rotation (θz rotation) error of wafer W supported in a non-contact manner by chuck main section 130 using the three imaging devices 129, before wafer W is supported by the three vertical movement pins 140. In this case, in the case of employing a structure where a position of chuck main section 130 within the XY plane (including rotation) is adjustable by driving section 122, the position (including rotation) of wafer W within the XY plane can be adjusted according to the positional deviation and the rotation errors which have been detected. Or, a structure can be employed where the three vertical movement pins 140 is movable within the XY plane with respect to wafer table WTB, and main controller 20 can adjusts the position (including rotation) of wafer W within the XY plane according to the positional deviation and the rotation errors which have been detected via the three vertical movement pins 140. In the manner described, main controller 20 finely adjusts the position of wafer W before wafer W is held by the wafer holder (wafer table WTB).

Further, in the embodiment described above, the case has been described where the three vertical movement pins 140 can vertically move integrally with driver 142. However, the present invention is not limited to this, and the three vertical movement pins 140 can move vertically independently. In such a case, when mounting wafer W supported in a non-contact or contact state from above and below by chuck main section 130 and the three vertical movement pins 140 onto the wafer holder (wafer table WTB) as is previously described, by making the timing of the vertical movement of the three vertical movement pins 140 differ, the suction hold of wafer W by the wafer holder chuck can be made to start from one side toward the other side with a time lag, even in the case when a uniform pressing force is applied to the whole surface of wafer W from chuck main section 130. Or, a structure can be employed where the pressing force pushing in the +Z direction (activating force) of the three vertical movement pins 140 can each be adjusted individually. Also in this case, the suction hold of wafer W by the wafer holder chuck can be made to start from one side toward the other side with a time lag, even in the case when a uniform pressing force is applied to the whole surface of wafer W from chuck main section 130. In any case, the wafer holder (wafer table WTB) does not have to be tilted in the θx and/or the θy directions.

Incidentally, in the embodiment described above, instead of the three vertical movement pins that can support wafer W in contact, for example, one or another plurality of support members that can support wafer W concurrently with chuck main section 130 and is vertically movable can be provided. This plurality of support members can have a structure where a part of a side surface of wafer W can be supported, or can have a structure where wafer W can be supported in an opening and closing manner in the outer circumference at a plurality of places from the sides (and/or from below). This support member can be provided in chuck unit 120 (Bernoulli chuck 124). Further, the member which supports wafer W that chuck main section 130 has in a non-contact manner is not limited to a Bernoulli chuck, and can be any member as long as wafer W can be supported in a non-contact manner. Accordingly, for example, instead of, or with the Bernoulli chuck (or the Bernoulli cup), a vacuum preloaded air bearing can also be used.

In the embodiment described above, main controller 20 can control at least one of repulsion and attraction of (a chuck member of) chuck main section 130 to wafer W, so that wafer W held by the wafer holder (wafer table WTB) is substantially flattened, or bending of wafer W is controller or prevented.

Further, in the embodiment described above, an example was given of a case where chuck main section 130 is vibrationally isolated with respect to main frame BD, by fixing driving section 122 to the lower surface of main frame BD via a vibration isolation member which is not shown. However, the present invention is not limited to this, and for example, by attaching driving section 122 to frame FL via a support member which is not shown, chuck main section 130 can be vibrationally isolated with respect to main frame BD.

Further, in the embodiment described above, the case has been described where the stream processing including alignment measurement and focus mapping is performed in a state where liquid Lq does not come into contact with any part of wafer table WTB. However, a sequence of wafer table WTB and measurement table MTB moving into the contact or the proximity state previously described at the point when alignment measurement has been completed can be considered, and in this case, for example, when focus mapping is not completed yet at the point when alignment measurement has been completed, the remaining operation of focus mapping can be performed while the contact or the proximity state of both tables WTB and MTB is being maintained. Even in such a case, because alignment measurement can be performed in a state where liquid Lq does not come into contact with any part of wafer table WTB, step movement of wafer table WTB (wafer stage WST) on the alignment measurement can be performed within a shorter time than the case of a liquid immersion scanner previously described whose details are disclosed in, U.S. Patent Application Publication No. 2008/0088843 and the like.

Further, in the embodiment described above, while the case has been described where unloading position UP1 is located on a straight line connecting projection optical system PL and measurement station 300 (primary alignment system AL1) in the Y axis direction and standby position UP2 is set to the −X side of unloading position UP1, standby position UP2 does not necessarily have to be set. However, in the case the alignment measurement is preformed in a state where liquid Lq does not come into contact with any part of wafer table WTB, the unloading position does not necessarily have to be set to a position which satisfies the positional relation described above.

Further, the structure of unloading device 170 described in the embodiment above is a mere example. For example, plate shaped support members can be installed on the lower surface on one side and the lower surface on the other side in the X axis direction of frame FL in a state where the members do not interfere with the head sections and the like, and a first unloading slider consisting of a member which has a structure similar to wafer grasping member 174 previously described that can move vertically can be provided at a position of unloading position UP1 in an area above the support members, and a second unloading slider can be structured by a robot arm and the like. In this case, after the first unloading slider receives the wafer from vertical movement pins 140 on wafer stage WST, the first unloading slider is driven upward. Then, the second unloading slider receives the wafer from the first unloading slider at unloading position UP1, and then is made to wait at standby position UP2 previously described, or is carried to the delivery position to the carrier system. In the latter case, standby position UP2 does not have to be set.

Further, in the embodiment described above, while the case has been described where a plurality of alignment systems AL1, and $AL2_1$ to $AL2_4$ whose detection areas are placed along the X-axis direction in measurement station 300 is provided, the present invention is not limited to this, and the position of detection areas of the plurality of alignment systems AL1, and $AL2_1$ to $AL2_4$ can be different not only in the X-axis direction, but also in the Y-axis direction. Or, measurement station 300 may have only one mark detection system provided. Even in such a case, if the loading position, the measurement station, the unloading position, and the exposure station have a positional relation similar to the embodiment described above, for example, wafer stage WST holding wafer W is moved along is the Y-axis direction from the loading position toward the exposure station, and during the movement, a plurality of marks on wafer W are detected by the mark detection system at measurement station 300 located on the movement path. Then, after exposing the wafer held by wafer stage WST at exposure station 200, the wafer which has been exposed can be carried out from the area above wafer stage WST at the unloading position set on way of the movement path of wafer stage WST from exposure station 200 to measurement station 300, before the wafer stage returns to the loading position from exposure station 200 along the Y-axis direction. In this case, a series of processing of carry-in of the wafer to the area on wafer stage WST (loading), detection of the marks on the wafer, exposure of the wafer, carry-out of the wafer which has been exposed from the area on wafer stage WST (unloading) can be performed effectively within a short time, while wafer stage WST is moving back and forth between the loading position located away in the Y-axis direction and the exposure station.

Incidentally, in the embodiment described above, while the example was given of the case when exposure is performed in the order of the shot areas from the −Y side to the +Y side on the +X side half (or the −X side half) on wafer W, after exposure is performed in the order of the shot areas from the +Y side to the −Y side on the −X side half (or the +X side half), the exposure order of the plurality of shot areas on wafer W is not limited to this. In the case wafer table WTB does not have to be moved in the shortest time to the unloading position after exposure has been completed, then the plurality of shot areas on wafer W can be exposed in an order similar to the conventional liquid immersion scanner, as is disclosed in, for example, U.S. Patent Application Publication No. 2008/0088843 and the like. Or, even in the case of moving in the shortest time to unloading position UP1 after exposure has been completed, the order of exposure is not limited to the embodiment described above. The point is, among the plurality of shot areas on the wafer, any order of exposure can be employed as long as exposure begins at a predetermined first shot area which is far away from the unloading position, and the last shot to be exposed is a shot area near the first shot area.

Further, in the embodiment described above, even in the case of switching the measurement information (position information) between the first back side encoder system 70A and the first top side encoder system 80A depending on the situation, the switching method, as a matter of course, is not limited to the method described in the embodiment above. It is preferable for main controller 20 to use position information measured at least by the first top side encoder system 80A for drive control of wafer table WTB, for example, in a frequency band where reliability of the first back side encoder system 70A becomes lower than that of the first top side encoder system 80A by the vibration of heads 73a to 73d (arm member $71_1$) of measurement arm 71A, such as, for example, in the frequency band of 50 Hz to 500 Hz, especially in at least a part of 100 Hz to 400 Hz. The reference of the switching of measurement information (position information) by the first back side encoder system 70A and the first top side encoder system 80A is not limited to the frequency band of the output signal. Further, according to the embodiment described above, because position measurement of wafer table WTB is possible concurrently by the first back side encoder system 70A and first top side encoder system 80A, various usage becomes possible depending on the good and bad points such as when using only one encoder system, or using both of the systems and the like. The point is, main controller 20 should control the drive of wafer table WTB by coarse movement stage driving system 51A and/or fine movement stage driving system 52A, based on the position information measured by at least one of the first back side encoder system 70A and the first top side encoder system 80A. Incidentally, the same can be said as described above for the second back side encoder system 70B and the second top side encoder system 80B structuring the second fine movement stage position measurement system 110B.

In hybrid control (the first mode of switching sections 150A, 150B, and 150C), while the top side encoder system and the back side encoder system are switched according to vibration, or to be more specific, switched using the low pass filter and the high pass filter having the same cut off frequency, the present invention is not limited to this, and for example, a hybrid position signal which is a weighted and added signal of the output signal of the top side encoder system and the output signal of the back side encoder system can also be used. Further, the top side encoder system and the back side encoder system can be used separately depending on the cause other than vibration, or can be used together. For example, in the first fine movement stage position measurement system 110A, for example, during the scanning exposure, only the back side encoder system 70A can be used.

Further, in the embodiment described above, while the second fine movement stage position measurement system 110B was equipped with the second back side encoder system 70B and the second top side encoder system 80B, the present invention is not limited to this, and the measurement system to measure the position of wafer table WTB in measurement station 300 can have either one of the second back side encoder system 70B or the second top side encoder system 80B, or an encoder system having a completely different structure, or an interferometer system and the like. As a matter of course, in the case of only the second top side encoder system 80B, the refreshing of coordinate system of the second top side encoder system 80B by comparing and adjusting previously described is not performed. Similarly, the measurement system measuring the position of wafer table WTB in exposure station 200 can have either one of the first back side encoder system 70A or the first top side encoder system 80A, or an encoder system having a completely different structure, or an interferometer system and the like.

Incidentally, in the embodiment described above, while the case was described where the first and second back side encoder systems 70A and 70B were equipped with measurement arm 71A and 71B having arm members $71_1$ and $71_2$, respectively, in which only at least a part of the optical system of an encoder head is incorporated, the present invention is not limited to this, and for example, as the measurement arm, as long as a measurement beam can be irradiated from a section facing grating RG, for example, a light source or a photodetector and the like can be incorporated at the tip of the arm member. In this case, the optical fiber previously described does not have to be arranged inside of the arm member. Furthermore, the arm member can have any outer and sectional shape, and also does not necessarily have to have a damping member. Further, the first and the second back side encoder systems 70A and 70B do not have to use the inside of arm members $71_1$ and $71_2$, even in the case the light source and/or the detector are/is provided in arm members $71_1$ and $71_2$.

Further, the first and second back side encoder systems 70A and 70B do not necessarily have to have a measurement arm, as long as the systems have a head which is placed facing grating RG within the space of coarse movement stage WCS that irradiates at least one measurement beam on grating RG and receives light (reflected and diffracted light) from grating RG of the measurement beam, and can measure the position information at least within the XY-plane of fine movement stage WFS, based on the output of the head.

Further, in the embodiment described above, while an example was shown of the case where the first and second back side encoder systems 70A and 70B each have two three-dimensional heads, an XZ head and a YZ head, it is a matter of course that the combination and placement of the heads are not limited to this. For example, even in the case of performing the refreshing of the coordinate system using the measurement values of the redundant axis, the degrees of freedom which can be measured by the first and the second back side encoder systems 70A and 70B does not have to be set to ten degrees of freedom, and can be degrees of freedom of seven or more, such as, for example, eight degrees of freedom. For example, the systems can have two three-dimensional heads, and only one of the XZ head and the YZ head. In this case, the placement, the structure and the like of the heads are not limited to the embodiment described above. For example, the first back side encoder system 70A and the second back side encoder system 70B can irradiate a plurality of measurement beams on grating RG to measure the position information of wafer table WTB in directions of six degrees of freedom, and also at least another measurement beam which is different from theses plurality of measurement beams, or in other words, the plurality of measurement beams used for measuring the position information of wafer table WTB in directions of six degrees of freedom is irradiated on grating RG. In such a case, main controller 20 can perform a refreshing of the coordinate system as is previously described using the position information of wafer table WTB measured by the first back side encoder system 70A and the second back side encoder system 70B according to the different measurement beam, or in other words, can update information compensating for the measurement errors of the first back side encoder system 70A and the second back side encoder system 70B caused by grating RG.

Further, for example, if the refreshing of the coordinate system using the measurement values of the redundant axis previously described is not performed, the first and the second back side encoder systems 70A and 70B can employ a combination and placement of the heads which can measure the position information of wafer table WTB only in directions of six degrees of freedom. For example, the first and the second back side encoder systems 70A and 70B can each have only two three-dimensional heads. In this case, if the two three-dimensional heads are placed similarly as in the embodiment above, position information in directions of five degrees of freedom, excluding the θx direction of wafer table WTB, can be measured. Further, if the two three-dimensional heads are placed shifted to each other in the X-axis direction and the Y-axis direction, position information in directions of six degrees of freedom of wafer table WTB can be measured. Besides this, the first and the second back side encoder systems 70A and 70B can each have a pair of XY heads only, placed in the X-axis direction. In this case, measurement of position information in directions of three degrees of freedom of wafer table WTB within the XY-plane becomes possible. Further, the first and the second back side encoder systems 70A and 70B can employ a head section (optical system) which is equipped with a Z head, other than the X head and/or the Y head.

In the embodiment described above, because grating RG is placed on the lower surface (rear surface) of fine movement stage WFS, fine movement stage WFS can be structured hollow to reduce its weight, and piping, wiring and the like can also be placed inside. The reason for this is because, the measurement beam irradiated from the encoder head does not proceed inside fine movement stage WFS, fine movement stage WFS does not have to be a solid member through which light can be transmitted. However, the present invention is not limited to this, and in the case fine movement stage WFS is a solid member through which light can be transmitted, the grating can be placed on the upper surface of the fine movement stage, that is, the surface facing the wafer, or the grating can be formed on the wafer holder which holds the wafer. In the latter case, even if the wafer holder expands during the exposure, or the loading position with respect to the fine movement stage deviates, such movement can be followed, and the position of the wafer holder (wafer) can be measured.

Further, the structure of the first to fourth top side encoder systems 80A to 80D in the embodiment described above is not limited to the ones described in the embodiment above.

For example, at least a part of the first to fourth top side encoder systems 80A to 80D can employ an encoder system which has a structure, as disclosed in, for example, U.S. Patent Application Publication No. 2006/0227309 and the like, in which a plurality of encoder head sections (each encoder head section can be structured, for example, similar to the four-spindle heads previously described) are provided on wafer table WTB, and facing these heads a grating section (for example, a two-dimensional grating or a one-dimensional grating section placed two-dimensionally) can be provided external to wafer table WTB. In this case, the plurality of encoder head sections can each be placed in the four tips (corners) of wafer table WTB, or a pair of the encoder head sections can each be placed outside of wafer table WTB on two diagonal lines intersecting at the center (the center of the wafer holder), with wafer table WTB in between. Further, with the grating section, for example, four grating plates that each have two-dimensional gratings formed can be attached to a fixed member (such as a plate), and the fixed member can be supported in a suspended manner by main frame BD by a support member including flexure so that the four grating plates are placed in the periphery of projection optical system PL (or nozzle unit 32).

Incidentally, in the embodiment described above, while fine movement stage WFS is drivable in all of the directions of six degrees of freedom, the present invention is not limited to this, and fine movement stage WFS only has to be driven in at least directions of three degrees of freedom within a two dimensional plane parallel to the XY-plane. In this case, when fine movement stage WFS moves in the predetermined range within exposure station 200 (a range within exposure station 200 including at least a range in which fine movement stage WFS moves for exposure of wafer W held on wafer table WTB), main controller 20 can drive fine movement stage WFS while controlling the position in directions of n degrees of freedom (n≥3) including the three degrees of freedom within the two-dimensional plane of fine movement stage WFS, for example, based on measurement information according to the plurality of heads of the first back side encoder system 70A, and can update the grid error related to a predetermined measurement direction of the coordinate system of the first back side encoder system 70A, based on the difference between position information related to the predetermined measurement direction which is a part of the position information used when driving fine movement stage WFS in n degrees of freedom, and positional information different from this which is a redundant position information that is not used when driving fine movement stage WFS in n degrees of freedom in the predetermined measurement direction. In this case, not all of the heads 73a to 73d previously described have to be provided, as long as the position of fine movement stage WFS can be measured in each of the X-axis, the Y-axis, and the θz directions of fine movement stage WFS, and the grid error in at least one direction of the X-axis, the Y-axis, and the Z-axis of the coordinate system of the first backside encoder system 70A can be revised, using the measurement values of the redundant axis.

Further, fine movement stage driving system 52A is not limited to the moving magnet type system described above, and can also be a moving coil type system. Furthermore, fine movement stage WFS can be supported in contact by coarse movement stage WCS. Accordingly, the fine movement stage driving system which drives fine movement stage WFS with respect to coarse movement stage WCS, for example, can be a combination of a rotary motor and a ball spring (or a feed screw).

Incidentally, in the embodiment described above, as wafer stage position measurement system 16A, a Hall element sensor similar to middle position measurement system 121, or an encoder system and the like can be used, instead of the interferometer system. That is, in the first embodiment described above, no interferometer systems need to be provided. In this case, it is preferable to provide a measurement system which measures relative position information of coarse movement stage WCS and fine movement stage WFS.

Incidentally, in the first embodiment described above, instead of unloading position UP1 and standby position UP2 set in between exposure station 200 and measurement station 300, only the unloading position can be set in the vicinity of loading position LP, such as for example, a position having the same Y position as loading position LP and is set apart by a predetermined distance to the −X side. In this case, the unloading position can be set at the same position as loading position LP. Further, loading position LP is not limited to the position within the field (detection area) of primary alignment system AL1 where fiducial mark FM of measurement plate 30 described above is positioned, and can be a position in the vicinity, such as for example, a position in symmetry to the unloading position with respect to reference axis LV. Further, as the alignment system, a single alignment system can be used, and in this case, the unloading position can be placed on the −Y side with respect to the single alignment system.

Figure 39:
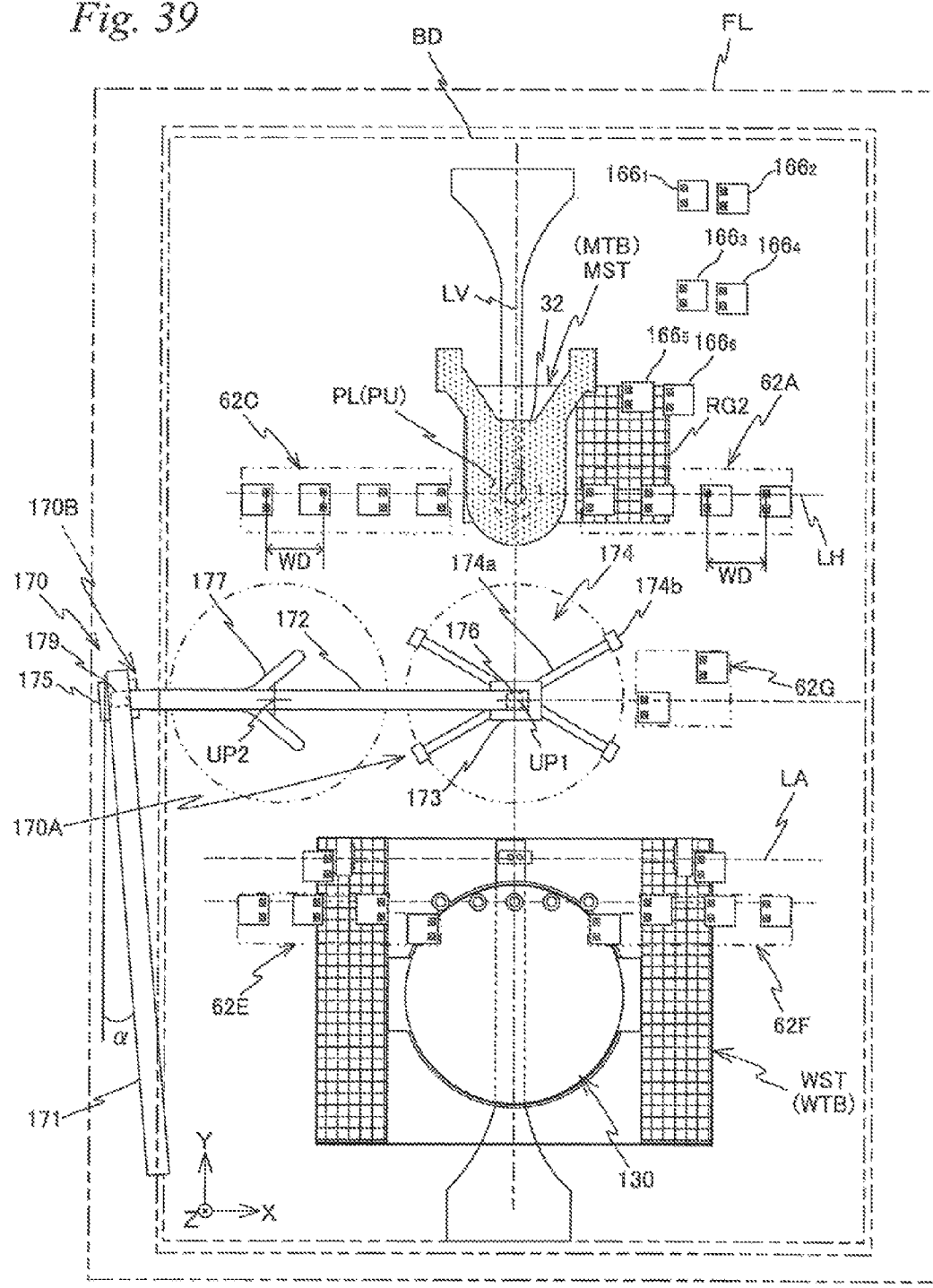
FIG. 39 is a view used to describe a modified example when a measurement system measuring a position of a measurement table consisting of an encoder system is used, instead of a measurement stage position measurement system consisting of an interferometer system.

Further, in the embodiment above, as measurement stage position measurement system 16B which measures the position of measurement stage MST, a Hall element sensor or an encoder system can be used, instead of the interferometer system. In the latter case, for example, as shown in FIG. 39, a two-dimensional grating RG2 can be provided on the upper surface of measurement table MTB, and facing two-dimensional grating RG2, a plurality of encoder heads, such as for example, a four-spindle head consisting of a combination of an XZ head and a YZ head, can be placed in a plurality of pairs in main frame BD via a support member, along the movement path of measurement stage MST. In FIG. 39, a pair of four-spindle heads $166_1$ and $166_2$, a pair of four-spindle heads $166_3$ and $166_4$, and a pair of four-spindle heads $166_5$ and $166_6$ are placed along the movement path of measurement stage MST. These heads and two-dimensional grating RG2 can be referred to together as a fifth top side encoder system, and by changing the placement (position) of the heads shown in FIG. 39, or by adding at least one head, position information of measurement stage MST can be measured by the fifth top side encoder system during the scrum operation previously described. In this case, measurement stage position measurement system 16B which directly measures the position of measurement stage MST does not have to be provided. In this case, it is preferable to provide a measurement system which measures relative position information between slider section 60 and support section 62 of measurement stage MST and measurement table MTB.

Incidentally, in the first and the second embodiments described above, the structure of the head section and the like of each back side encoder system is not limited to the ones previously described, and can employ any structure. Further, the placement and the number of the heads in each top side encoder system can be arbitrary.

Incidentally, in the embodiment described above, while the liquid immersion type exposure apparatus was described, the present invention is not limited to this, and the exposure apparatus can be a dry type exposure apparatus which performs exposure without the measurement beam passing through the liquid (water).

Further, in the embodiment described above, while the case has been described where the exposure apparatus has a structure of having one fine movement stage supported by coarse movement stage WCS that moves back and forth between measurement station 300 and exposure station 200, the exposure apparatus may have two fine movement stages. In this case, a structure may be added where two fine movement stages can be switched between two coarse movement stages, and the two fine movement stages can alternately be moved back and forth between measurement station 300 and exposure station 200. Or, three or more fine movement stages can be used. Such structures allow concurrent processing of the exposure processing to the wafer on one of fine movement stage WFS and the stream processing described above using the other fine movement stage WFS. In this case, one of the two coarse movement stages can be made to be movable only in exposure station 200, and the other of the two coarse movement stages can be made to be movable only in measurement station 300.

Besides this, instead of measurement stage MST, as disclosed in, for example, U.S. Pat. Nos. 6,341,007, and 6,262,796 and the like, another wafer stage WST can be provided. In this case, it is preferable to structure coarse movement stage WCS so that it is shaped engageable with measurement arm 71A laterally. This allows concurrent processing of the exposure processing to the wafer on one of the wafer stages and the stream processing described above using the other wafer stage.

Or, another wafer stage WST can be provided. That is measurement stage MST and two wafer stages can be provided. In this case as well, concurrent processing of the exposure processing to the wafer on one of the fine movement stages WFS and the stream processing described above using the other fine movement stage WFS becomes possible. In addition, after the exposure operation to the wafer on one of the fine movement stages WFS has been completed until the exposure of the wafer on the other fine movement stage WFS begins, it becomes possible to perform various measurements using the measurement members on measurement table MTB while holding liquid Lq between measurement table MTB and projection optical system PL. In this case, all measurement operations using the plurality of measurement members (sensors) of measurement stage MST does not have to be performed during the switching from one of wafer stage WST1 and wafer stage WST2 to the other of wafer stage WST1 and wafer stage WST2, and for example, a part of the plurality of measurements can be performed during the switching from wafer stage WST1 to wafer stage WST2, and the remaining measurements can be performed during the switching from wafer stage WST2 to wafer stage WST1.

Further, in the embodiment described above, measurement stage MST does not necessarily have to have the various measurement members (sensors) previously described, and may simply be used instead of the wafer stage to maintain the liquid immersion area below projection optical system PL. In this case, at least a part of the various measurement members (sensors) previously described should be provided on the wafer stage.

Other than this, instead of measurement stage MST, a plate member which can deliver the liquid immersion area to/from wafer table WTB and can hold the liquid of the liquid immersion area with projection optical system PL, or a stage similar to the auxiliary stage disclosed in, for example, U.S. Patent Application Publication No. 2010/0159403, can be provided.

Incidentally, in the embodiment described above, while the case has been described where the exposure apparatus is a scanning stepper, the present invention is not limited to this, and the embodiment described above can also be applied to a static type exposure apparatus such as a stepper. Further, the embodiment described above can also be applied to a reduction projection exposure apparatus which employs a step-and-stitch method where a shot area and a shot area are synthesized.

Further, the projection optical system in the exposure apparatus of the embodiment described above is not limited to a reduction system and can also be an equal magnifying or a magnifying system, and projection optical system PL is not limited to the refractive system, and can also be a reflection system or a catadioptric system, and the projection image can be either an inverted image or an upright image.

Further, illumination light IL is not limited to the ArF excimer laser beam (wavelength 193 nm), and can also be an ultraviolet light such as a KrF excimer laser beam (wavelength 248 nm), or a vacuum-ultraviolet light such as an $F_2$ laser beam (wavelength 157 nm). For example, as disclosed in U.S. Pat. No. 7,023,610, as the vacuum-ultraviolet light, a harmonic wave can also be used which is a single-wavelength laser beam in the infrared or visible range emitted by a DFB semiconductor laser or a fiber laser that is amplified by a fiber amplifier doped with, for example, erbium (or both erbium and ytterbium), and whose wavelength is converted into a vacuum-ultraviolet light using a nonlinear optical crystal.

Further, in the embodiment described above, it is a matter of course that illumination light IL of the exposure apparatus is not limited to light having a wavelength of 100 nm or over, and light having a wavelength less than 100 nm can also be used. For example, the embodiment above can be suitably applied to an EUV (Extreme Ultraviolet) exposure apparatus that uses an EUV light in a soft X-ray range (for example, a wavelength range of 5 to 15 nm). In addition, the embodiment above can also be applied to an exposure apparatus that uses charged particle beams such as an electron beam or an ion beam.

Further, in the embodiment above, while a light transmissive type mask (reticle) in which a predetermined light-shielding pattern (or a phase pattern or a light-attenuation pattern) is formed on a light-transmitting substrate is used, instead of this reticle, as disclosed in, for example, U.S. Pat. No. 6,778,257, an electron mask (which is also called a variable shaped mask, an active mask or an image generator, and includes, for example, a DMD (Digital Micro-mirror Device) that is a type of a non-emission type image display element (spatial light modulator) or the like) on which a light-transmitting pattern, a reflection pattern, or an emission pattern is formed according to electronic data of the pattern that is to be exposed can also be used. In the case of using such a variable shaped mask, because the stage on which the wafer or the glass plate and the like is mounted is scanned with respect to the variable shaped mask, by measuring the position of this stage using the first and the second fine movement stage position measurement systems 110A and 110B previously described, an effect equal to the embodiment described above can be obtained.

Further, as disclosed in, for example, PCT International Publication No. 2001/035168, the embodiment described above can also be applied to an exposure apparatus (lithography system) which forms a line-and-space pattern on wafer W by forming an interference fringe on wafer W.

Furthermore, as disclosed in, for example, U.S. Pat. No. 6,611,316, the embodiment described above can also be applied to an exposure apparatus that synthesizes two reticle patterns on a wafer via a projection optical system, and by performing scanning exposure once, performs double exposure of one shot area on the wafer almost simultaneously.

Incidentally, in the embodiment described above, the object (the object subject to exposure on which an energy beam is irradiated) on which the pattern is to be formed is not limited to a wafer, and may be another object such as a glass plate, a ceramic substrate, a film member, or a mask blank and the like.

Furthermore, the usage of the exposure apparatus is not limited to the exposure apparatus used for producing semi-conductor devices, and for example, the exposure apparatus can also be widely applied to an exposure apparatus for liquid crystal displays used to transfer a liquid crystal display device pattern on a square shaped glass plate, or an exposure apparatus used to manufacture an organic EL, a thin film magnetic head, an imaging device (such as a CCD), a micromachine, a DNA chip and the like. Further, the embodiment described above can also be applied not only to an exposure apparatus for producing microdevices such as semiconductor devices, but also to an exposure apparatus which transfers a circuit pattern on a glass substrate or a silicon wafer, in order to manufacture a reticle or a mask used in a light exposure apparatus, an EUV exposure apparatus, an X-ray exposure apparatus, and an electron beam exposure apparatus and the like.

Electronic devices such as semiconductor devices are manufactured through the following steps; a step where the function/performance design of the device is performed, a step where a reticle based on the design step is manufactured, a step where a wafer is manufactured from silicon materials, a lithography step where the pattern of a mask (reticle) is transferred onto the wafer by the exposure apparatus (pattern formation apparatus) related to the embodiment previously described and an exposure method corresponding thereto, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, and a package process), an inspection step and the like. In this case, in the lithography step, because the device pattern is formed on the wafer by executing the exposure method previously described using the exposure apparatus in the embodiment described above, a highly integrated device can be produced with good productivity. Further, the exposure apparatus (pattern formation apparatus) of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of the PCT International Publications, the U.S. patent application Publications and the U.S. patents that are cited in the description so far related to exposure apparatuses and the like are each incorporated herein by reference.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes a substrate with illumination light via an optical system, the apparatus comprising:
    a stage that is disposed below the optical system and has a holder to hold the substrate;
    a carrier system that is disposed above the stage and has a first support member, the first support member supporting the substrate in a noncontact manner from a surface side of the substrate, and the surface side being irradiated with the illumination light;
    a second support member different from the first support member, the second support member supporting the substrate in a contact manner from a rear surface side of the substrate;
    a drive system that is coupled to the first and the second support members, and moves at least the second support member so that relative movement between the first and the second support members and relative movement between the second support member and the holder are performed at least in a vertical direction; and
    a controller that controls the carrier system and the drive system so that the substrate is carried from the first support member to the holder via the second support member, wherein
    concurrently with the first support member moving toward the holder to transfer the substrate to the holder, the second support member moves toward the holder.

2. The exposure apparatus according to claim 1, wherein the second support member is provided at the stage, and is moved relative to the holder.

3. The exposure apparatus according to claim 2, wherein the drive system has a first drive section and a second drive section, the first drive section being provided at the carrier system and moving the first support member, and the second drive section being provided at the stage and moving the second support member.

4. The exposure apparatus according to claim 3, wherein the carrier system carries a substrate supported by the first support member, to above the stage placed at a loading position that is away from the optical system.

5. The exposure apparatus according to claim 4, further comprising:
    a frame that supports the optical system; and
    a detection system that is provided at the frame, away from the optical system, and detects positional information of the substrate, wherein
    the stage is moved to an unloading position between the optical system and the detection system so that unloading of the substrate is performed, the unloading position being different from the loading position.

6. The exposure apparatus according to claim 5, further comprising:
    another frame different from the frame, at least a part of the carrier system being provided at the another frame.

7. The exposure apparatus according to claim 4, wherein the carrier system has at least one of a pre-alignment device and a temperature control device for the substrate, the pre-alignment device and the temperature control device each having at least a part provided at the first support member, and
    at least one of deformation control, pre-alignment and temperature control of the substrate is performed by the first support member.

8. The exposure apparatus according to claim 4, wherein the first and the second support members are moved downward by the drive system and support of the substrate by the first and the second support members is released so that the substrate is mounted on the holder.

9. The exposure apparatus according to claim 4, further comprising:
    a detection system that is disposed in a measurement station and detects positional information of the substrate, the measurement station being different from an exposure station in which the optical system is disposed, wherein
    the loading position is set on one side in a first direction within a predetermined plane with respect to the optical system, the predetermined plane being orthogonal to an optical axis of the optical system, and
    in an exposure operation of the substrate, the controller controls movement of the stage so that the stage is moved from one side to an other side in the first direction in order to expose a first area of the substrate on one side in a second direction and also the stage is moved from the other side to the one side in the first direction to expose a second area of the substrate on an other side in the second direction, the second direction being orthogonal to the first direction within the predetermined plane.

10. The exposure apparatus according to claim 3, wherein the controller controls at least one of the carrier system and the drive system so that deformation of the substrate is controlled.

11. The exposure apparatus according to claim 10, wherein
    the controller controls at least one of repulsion and attraction of the first support member so that at least a part of the substrate is displaced in the vertical direction.

12. The exposure apparatus according to claim 11, wherein
    the controller adjusts a positional relationship between a substrate supported by the first support member and the second support member so that at least a part of the substrate is displaced in the vertical direction.

13. The exposure apparatus according to claim 11, wherein a force in the vertical direction is applied to the substrate while the substrate is mounted on the holder or supported by the first support member.

14. The exposure apparatus according to claim 13, wherein
prior to holding of the substrate by the holder, displacement of the substrate is performed.

15. A device manufacturing method, comprising:
exposing a substrate using the exposure apparatus according to claim 1; and
developing the substrate that has been exposed.

16. An exposure method of exposing a substrate with illumination light via an optical system, the method comprising:
carrying the substrate to above a stage that has a holder to hold the substrate, with a carrier system that has a first support member, the first support member supporting the substrate in a noncontact manner from a surface side of the substrate, and the surface side being irradiated with the illumination light;
performing relative movement between the first support member and a second support member and relative movement between the second support member and the holder at least in a vertical direction so that the substrate is carried from the first support member to the holder via the second support member, the second support member being different from the first support member and supporting the substrate in a contact manner from a rear surface side of the substrate, wherein
concurrently with the first support member moving toward the holder to transfer the substrate to the holder, the second support member moves toward the holder.

17. The exposure method according to claim 16, wherein the substrate is carried to above the stage placed at a loading position, while being supported by the first support member, the loading position being away from the optical system.

18. The exposure method according to claim 17, wherein positional information of the substrate is detected by a detection system disposed away from the optical system, and the substrate is unloaded from the stage at an unloading position between the optical system and the detection system, the unloading position being different from the loading position.

19. The exposure method according to claim 17, wherein at least one of deformation control, pre-alignment and temperature control of the substrate is performed by the first support member.

20. A device manufacturing method, comprising:
exposing a substrate using the exposure method according to claim 16; and
developing the substrate that has been exposed.

21. A method of making an exposure apparatus that exposes a substrate with illumination light via an optical system, the method comprising:
providing a stage that is disposed below the optical system and has a holder to hold the substrate;
providing a carrier system that is disposed above the stage and has a first support member, the first support member supporting the substrate in a noncontact manner from a surface side of the substrate, and the surface side being irradiated with the illumination light;
providing a second support member different from the first support member, the second support member supporting the substrate in a contact manner from a rear surface side of the substrate;
providing a drive system that is coupled to the first and the second support members, and moves at least the second support member so that relative movement between the first and the second support members and relative movement between the second support member and the holder are performed at least in a vertical direction; and
providing a controller that controls the carrier system and the drive system so that the substrate is carried from the first support member to the holder via the second support member, wherein
concurrently with the first support member moving toward the holder to transfer the substrate to the holder, the second support member moves toward the holder.

* * * * *